United States Patent
Isoda et al.

(10) Patent No.: US 12,253,580 B2
(45) Date of Patent: Mar. 18, 2025

(54) MAGNETIC SENSOR

(71) Applicant: TDK CORPORATION, Tokyo (JP)

(72) Inventors: Takehiro Isoda, Tokyo (JP); Norikazu Ota, Tokyo (JP); Daichi Takano, Tokyo (JP); Kenji Inage, Tokyo (JP)

(73) Assignee: TDK CORPORATION, Tokyo (JP)

( * ) Notice: Subject to any disclaimer, the term of this patent is extended or adjusted under 35 U.S.C. 154(b) by 154 days.

(21) Appl. No.: 17/949,557

(22) Filed: Sep. 21, 2022

(65) Prior Publication Data

US 2023/0087727 A1     Mar. 23, 2023

Related U.S. Application Data

(60) Provisional application No. 63/246,438, filed on Sep. 21, 2021.

(30) Foreign Application Priority Data

Sep. 2, 2022   (JP) ................. 2022-140059

(51) Int. Cl.
*G01R 33/09*     (2006.01)
*G01R 33/02*     (2006.01)

(52) U.S. Cl.
CPC ......... *G01R 33/09* (2013.01); *G01R 33/0206* (2013.01)

(58) Field of Classification Search
CPC ............... G01R 33/09; G01R 33/0206; G01R 33/0011; G01R 33/0017; G01R 33/005
See application file for complete search history.

(56) References Cited

U.S. PATENT DOCUMENTS

| | | |
|---|---|---|
| 2003/0094944 A1 | 5/2003 | Suzuki et al. |
| 2004/0104724 A1 | 6/2004 | Sato |
| 2009/0015251 A1* | 1/2009 | Azumi ............. B82Y 25/00 |
| | | 29/592.1 |
| 2009/0027048 A1* | 1/2009 | Sato ............. H10N 59/00 |
| | | 29/602.1 |
| 2009/0237074 A1* | 9/2009 | Kou ............. H10N 50/10 |
| | | 324/247 |
| 2012/0200292 A1 | 8/2012 | Sugihara et al. |
| 2019/0301894 A1* | 10/2019 | Uchida ............. G01D 5/145 |
| 2020/0209327 A1* | 7/2020 | Takahashi ........... G01R 33/091 |
| 2020/0386831 A1 | 12/2020 | Saruki et al. |
| 2021/0181240 A1 | 6/2021 | Ota et al. |
| 2021/0181241 A1* | 6/2021 | Ota ............. G01R 15/205 |

FOREIGN PATENT DOCUMENTS

| | | |
|---|---|---|
| JP | 2013-157393 A | 8/2013 |
| JP | 2016-001118 A | 1/2016 |
| JP | 2017-076749 A | 4/2017 |

* cited by examiner

*Primary Examiner* — Dominic E Hawkins
(74) *Attorney, Agent, or Firm* — Oliff PLC

(57) ABSTRACT

A magnetic sensor includes a plurality of resistor sections each including a plurality of MR elements, and a plurality of protruding surfaces each structured to cause the plurality of MR elements to detect a specific component of a target magnetic field. The plurality of MR elements are disposed dividedly in first to fourth areas corresponding respectively to the plurality of resistor sections. The plurality of protruding surfaces include a structural body extending across at least two of the first to fourth areas.

14 Claims, 29 Drawing Sheets

MAGNETIC SENSOR

CROSS REFERENCE TO RELATED APPLICATIONS

This application claims the benefit of U.S. Provisional Patent Application No. 63/246,438 filed on Sep. 21, 2021 and Japanese Priority Patent Application No. 2022-140059 filed on Sep. 2, 2022, the entire contents of each of which are incorporated herein by their reference.

BACKGROUND

The technology relates to a magnetic sensor with a structure in which magnetoresistive elements are caused to detect a specific component of a target magnetic field.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

Herein, two directions parallel to the surface of the substrate of the magnetic sensor and orthogonal to each other are defined as an X direction and a Y direction. Typically, in a magnetic sensor including a plurality of magnetoresistive elements, the plurality of magnetoresistive elements are arranged in a lattice pattern along each of the X direction and the Y direction. The longitudinal direction of each magnetoresistive element coincides with the X direction or the Y direction. In a magnetic sensor including a plurality of soft magnetic bodies, a plurality of magnetoresistive elements are disposed such that two or more magnetoresistive elements are arranged along each of the plurality of soft magnetic bodies. Usually, the longitudinal direction of each magnetoresistive element coincides with the longitudinal direction of each soft magnetic body.

U.S. Patent Application Publication No. 2012/0200292 A1 discloses a geomagnetic sensor in which an X-axis magnetic sensor, a Y-axis magnetic sensor, and a Z-axis magnetic sensor are provided on a support. In the geomagnetic sensor, the Z-axis magnetic sensor includes magnetoresistive elements and soft magnetic bodies. Each soft magnetic body converts a vertical magnetic field component in a direction parallel to the Z-axis into a horizontal magnetic field component in a direction perpendicular to the Z-axis to provide the magnetoresistive elements having the horizontal magnetic field component. Each of the magnetoresistive elements and the soft magnetic bodies is long in the Y-axis direction.

Japanese Patent Application Laid-Open Publication No. 2016-1118 discloses a current detection device including a plurality of magnetoresistive elements. In the current detection device, each of the plurality of magnetoresistive elements is disposed such that the longitudinal direction of the magnetoresistive element is inclined relative to each of the longitudinal direction and the width direction of a conductor. The plurality of magnetoresistive elements are disposed so as to be arranged along each of the longitudinal direction and the width direction of the conductor.

Herein, regarding a magnetic sensor including a plurality of magnetoresistive elements arranged in a lattice pattern in a specific area, a case is considered where soft magnetic bodies are provided as in the Z-axis sensor of U.S. Patent Application Publication No. 2012/0200292 A1 while the longitudinal direction of each magnetoresistive element is inclined relative to each of the X direction and the Y direction as with the plurality of magnetoresistive elements of Japanese Patent Application Laid-Open Publication No. 2016-1118. In such a case, the longitudinal direction of each soft magnetic body also needs to be inclined relative to each of the X direction and the Y direction. If the soft magnetic bodies are inclined in such a manner, a problem would arise that a wasteful space is produced, resulting in an increased size of the magnetic sensor.

The foregoing problem is true of not only a magnetic sensor including a plurality of soft magnetic bodies but also a magnetic sensor in which a plurality of inclined surfaces are formed.

SUMMARY

A magnetic sensor according to one embodiment of the technology includes a plurality of resistor sections each including a plurality of magnetoresistive elements, and a plurality of structural bodies each structured to cause the plurality of magnetoresistive elements to detect a specific component of a target magnetic field. The plurality of magnetoresistive elements are disposed dividedly in a plurality of areas corresponding respectively to the plurality of resistor sections. The plurality of structural bodies include a structural body extending across at least two of the plurality of areas.

In the magnetic sensor according to one embodiment of the technology, more than one structural body extends across at least two areas. Thereby according to one embodiment of the technology, a magnetic sensor with a reduced size can be achieved.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
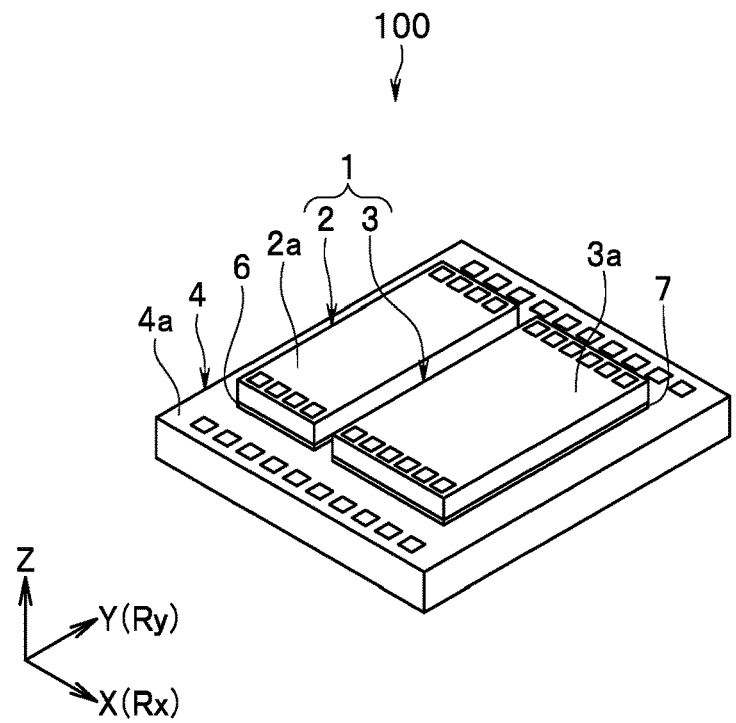
FIG. 1 is a perspective view showing a magnetic sensor device including a magnetic sensor according to a first example embodiment of the technology.

An object of the technology is to provide a magnetic sensor with a reduced size that includes structural bodies each structured to cause magnetoresistive elements to detect a specific component of a target magnetic field.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
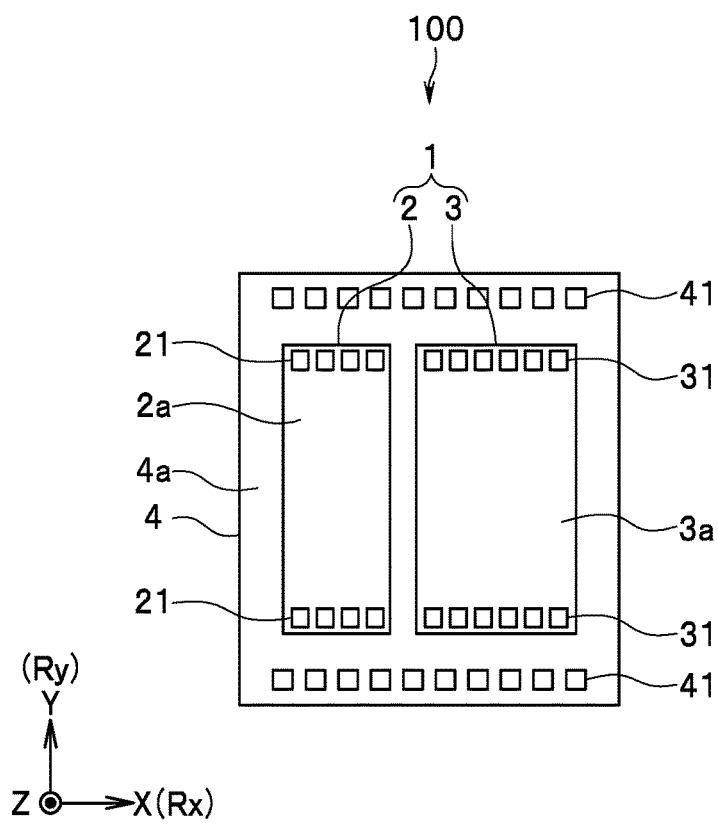
FIG. 2 is a plan view showing the magnetic sensor device shown in FIG. 1.
Figure 3:
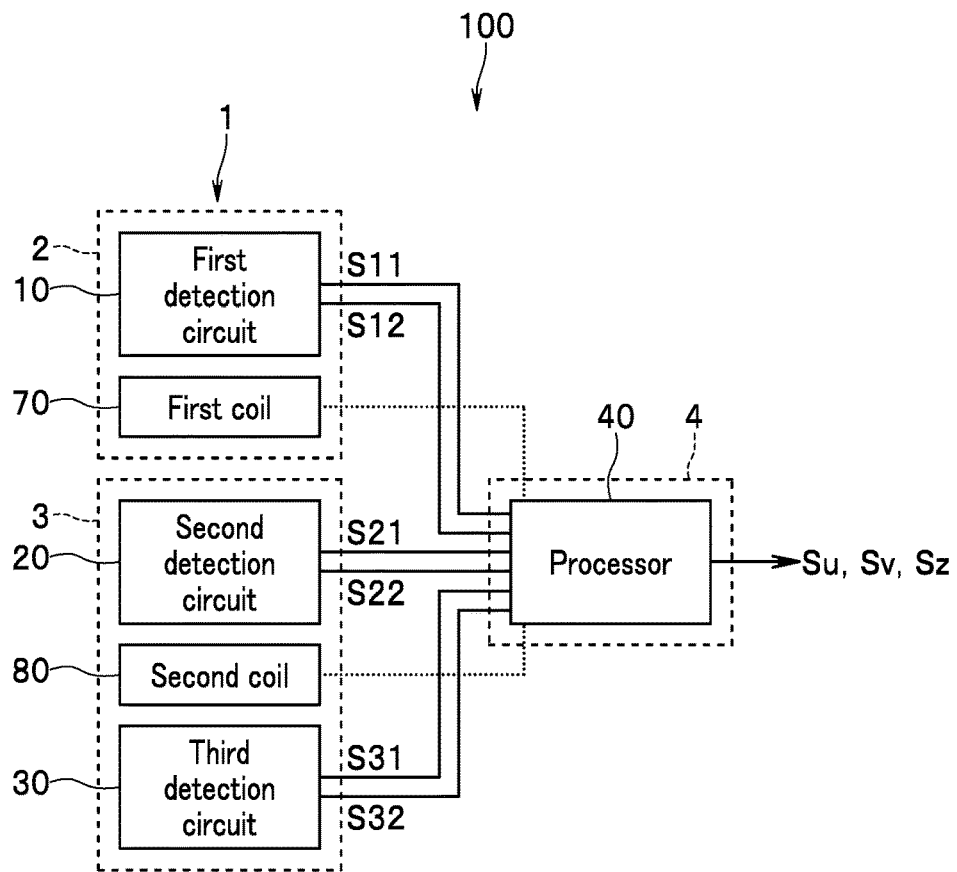
FIG. 3 is a functional block diagram showing a configuration of the magnetic sensor device shown in FIG. 1.

A configuration of a magnetic sensor device including a magnetic sensor according to a first example embodiment of the technology will initially be described with reference to FIGS. 1 to 3. FIG. 1 is a perspective view showing a magnetic sensor device 100. FIG. 2 is a plan view showing the magnetic sensor device 100. FIG. 3 is a functional block diagram showing a configuration of the magnetic sensor device 100.

The magnetic sensor device 100 includes a magnetic sensor 1 according to the present example embodiment. The magnetic sensor 1 includes a first chip 2 and a second chip 3. The magnetic sensor device 100 further includes a support 4 that supports the first and second chips 2 and 3. The first chip 2, the second chip 3, and the support 4 each have a rectangular solid shape. The support 4 has a reference plane 4a that is a top surface, a bottom surface located opposite to the reference plane 4a, and four side surfaces connecting the reference plane 4a and the bottom surface.

Now, a description will be given of a reference coordinate system in the present example embodiment with reference to FIGS. 1 and 2. The reference coordinate system is an orthogonal coordinate system that is set with reference to a magnetic sensor device 100 and defined by three axes. An X direction, a Y direction, and a Z direction are defined in the reference coordinate system. The X, Y, and Z directions are orthogonal to each other. In particular, in the example embodiment, a direction that is perpendicular to the reference plane 4a of the support 4 and directed from the bottom surface of the support 4 to the reference plane 4a is referred to as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

A direction parallel to the X direction is referred to as a first reference direction Rx, and a direction parallel to the Y direction is referred to as a second reference direction Ry. The reference plane 4a is a plane parallel to the first reference direction Rx and the second reference direction Ry. Note that in the present example embodiment, the top surface of the support 4 is defined as the reference plane for convenience sake. However, the reference plane of the technology is not limited to the top surface of the support 4 as long as the reference plane is a plane parallel to the first reference direction Rx and the second reference direction Ry.

Hereinafter, the term "above" refers to positions located forward of a reference position in the Z direction, and "below" refers to positions opposite from the "above" positions with respect to the reference position. For each component of the magnetic sensor device 100, the term "top surface" refers to a surface of the component lying at the end thereof in the Z direction, and "bottom surface" refers to a surface of the component lying at the end thereof in the −Z direction. The expression "when seen in the Z direction" means that the intended object is seen from a position at a distance in the Z direction.

The first chip 2 has a top surface 2a and a bottom surface that are positioned opposite to each other, and four side surfaces connecting the top surface 2a and the bottom surface. The second chip 3 has a top surface 3a and a bottom surface that are positioned opposite to each other, and four side surfaces connecting the top surface 3a and the bottom surface.

The first chip 2 is mounted on the reference plane 4a in a posture such that the bottom surface of the first chip 2 faces the reference plane 4a of the support 4. The second chip 3 is mounted on the reference plane 4a in a posture such that the bottom surface of the second chip 3 faces the reference plane 4a of the support 4. The first chip 2 and the second chip 3 are bonded to the support 4 with, for example, adhesives 6 and 7, respectively.

The first chip 2 has a plurality of first electrode pads 21 disposed on the top surface 2a. The second chip 3 has a plurality of second electrode pads 31 disposed on the top surface 3a. The support 4 has a plurality of third electrode pads 41 disposed on the reference plane 4a. Although not shown, in the magnetic sensor device 100, among the plurality of first electrode pads 21, the plurality of second electrode pads 31, and the plurality of third electrode pads 41, corresponding two electrode pads are connected with bonding wires.

The magnetic sensor 1 includes a first detection circuit 10, a second detection circuit 20, and a third detection circuit 30. The first chip 2 includes the first detection circuit 10. The second chip 3 includes the second and third detection circuits 20 and 30.

The magnetic sensor device 100 further includes a processor 40. The support 4 includes the processor 40. The first to third detection circuits 10, 20, and 30 and the processor 40 are connected via a plurality of first electrode pads 21, a plurality of second electrode pads 31, a plurality of third electrode pads 41, and a plurality of bonding wires.

The first to third detection circuits 10, 20, and 30 each include a plurality of magnetic detection elements, and are configured to detect a target magnetic field and generate at least one detection signal. In particular, in the example embodiment, the plurality of magnetic detection elements are a plurality of magnetoresistive elements. The magnetoresistive elements will hereinafter be referred to as MR elements.

The processor 40 is configured to generate a first detection value, a second detection value, and a third detection value by processing the plurality of detection signals generated by the first to third detection circuits 10, 20, and 30. The first, second, and third detection values have a correspondence with components of the magnetic field in three respective different directions at a predetermined reference position. In particular, in the present example embodiment, the foregoing three different directions are two directions parallel to an XY plane and a direction parallel to the Z direction. For example, the processor 40 is constructed of an application-specific integrated circuit (ASIC).

Figure 4:
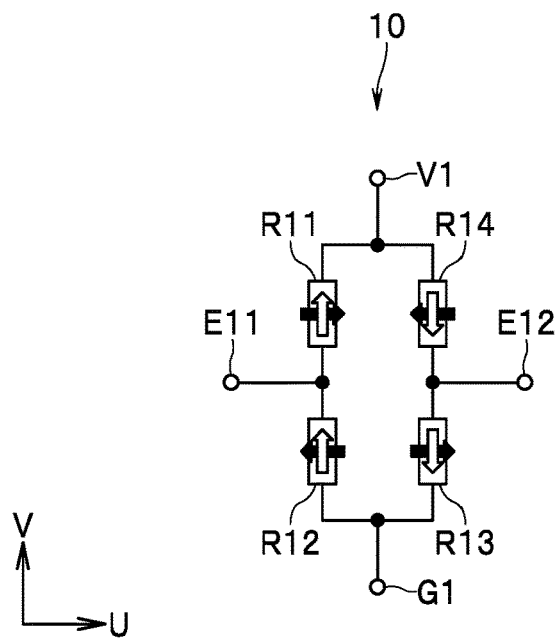
FIG. 4 is a circuit diagram showing a circuit configuration of a first detection circuit of the first example embodiment of the technology.
Figure 5:
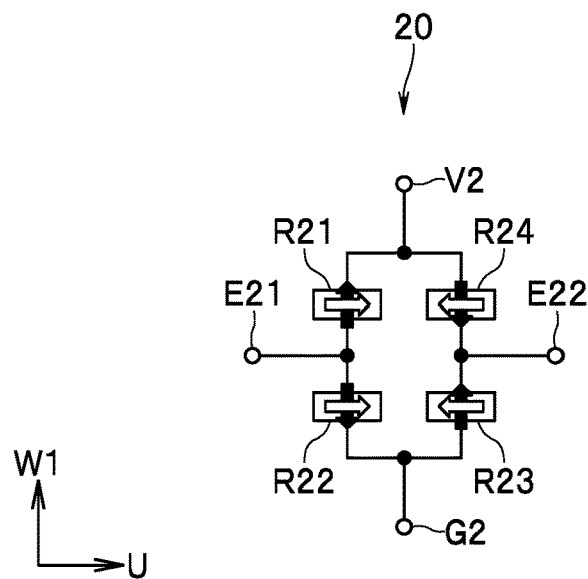
FIG. 5 is a circuit diagram showing a circuit configuration of a second detection circuit of the first example embodiment of the technology.
Figure 6:
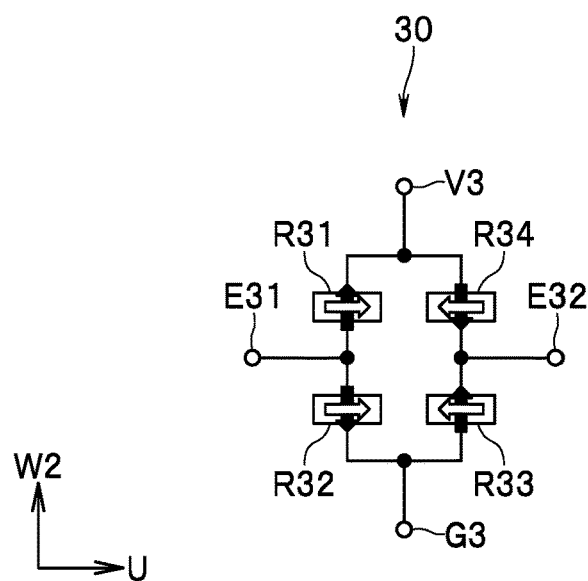
FIG. 6 is a circuit diagram showing a circuit configuration of a third detection circuit of the first example embodiment of the technology.
Figure 7:
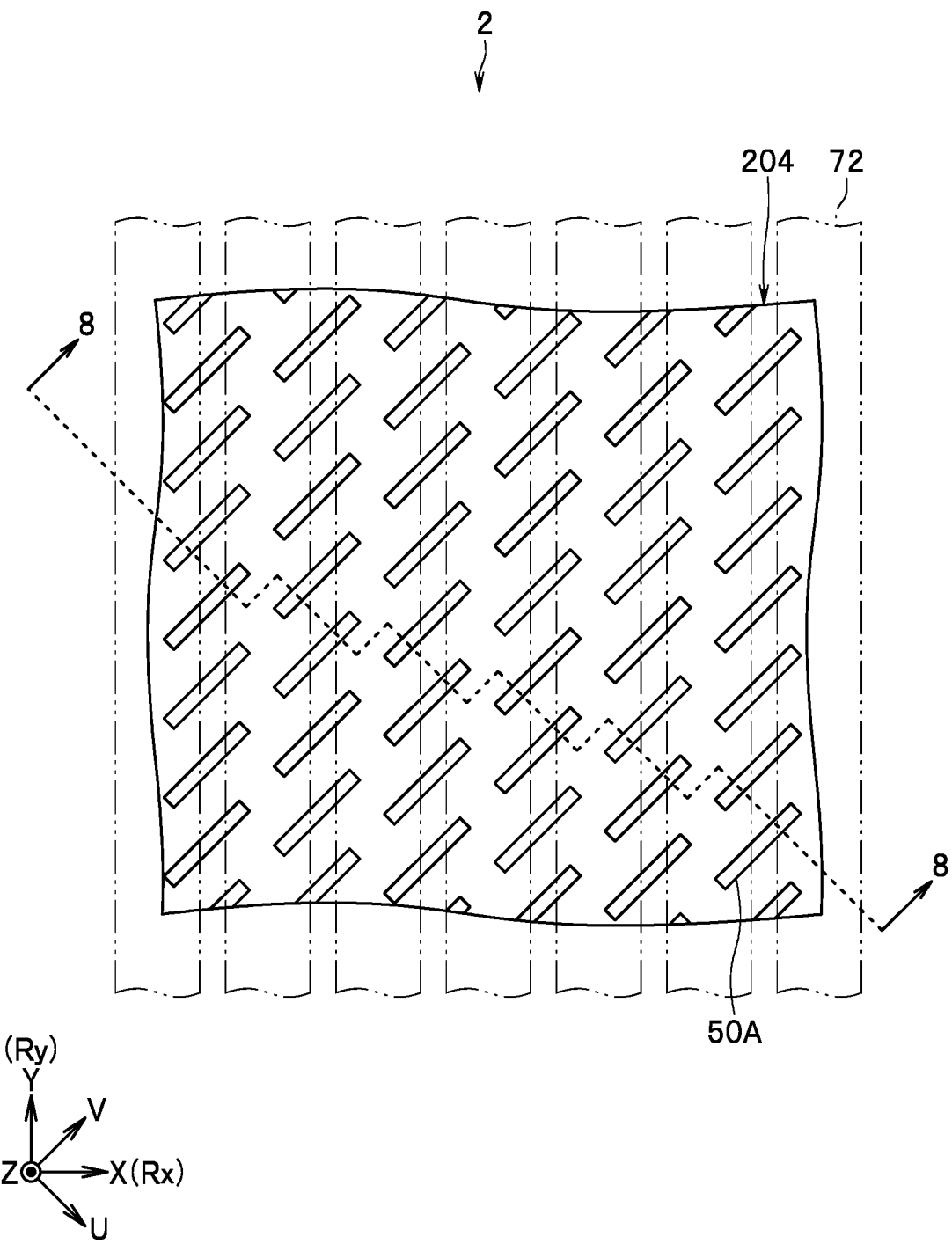
FIG. 7 is a plan view showing a part of a first chip of the first example embodiment of the technology.
Figure 8:
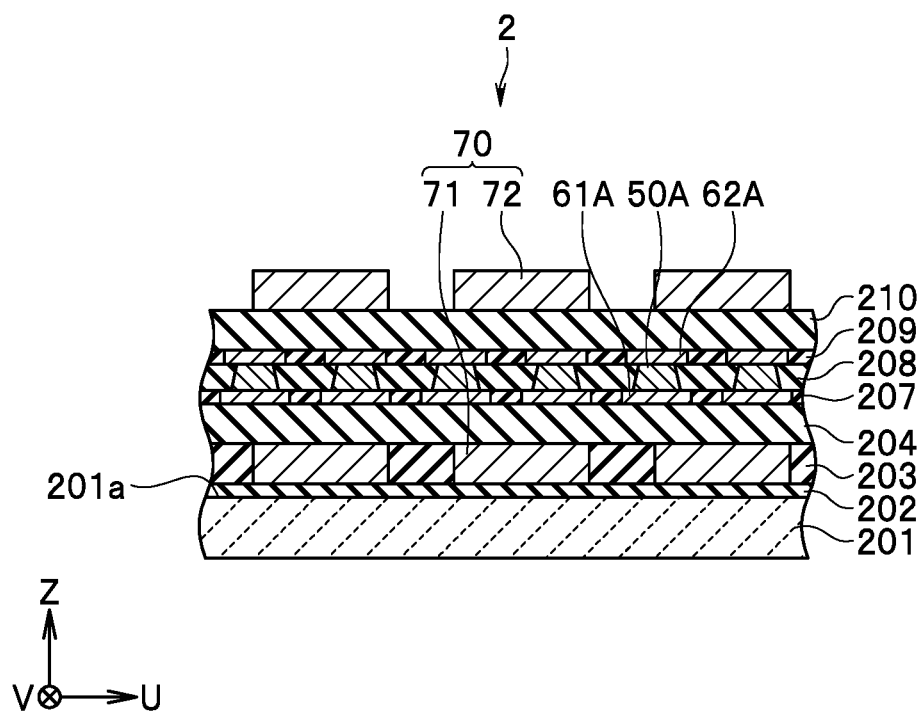
FIG. 8 is a sectional view showing a part of the first chip of the first example embodiment of the technology.
Figure 9:
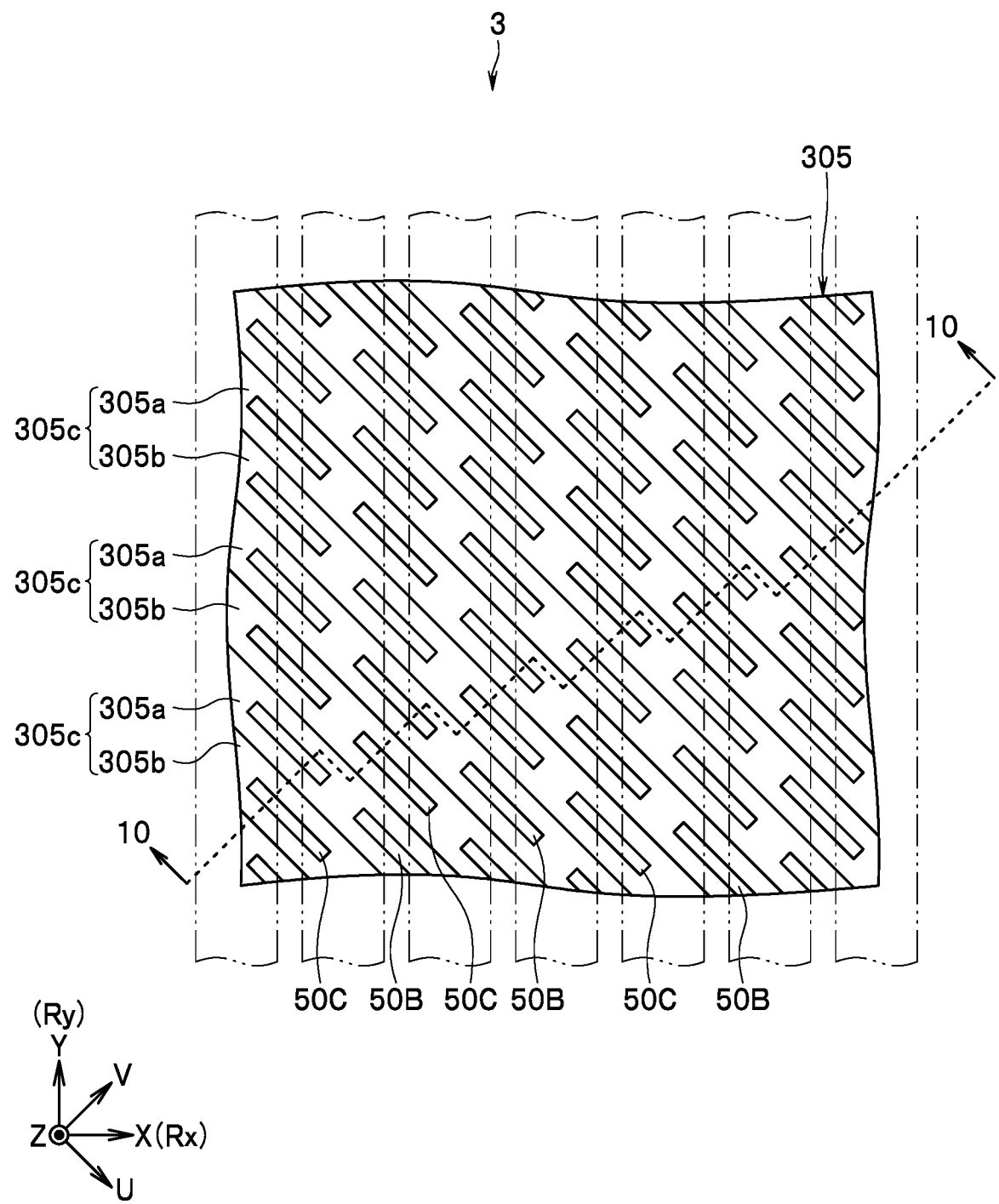
FIG. 9 is a plan view showing a part of a second chip of the first example embodiment of the technology.
Figure 10:
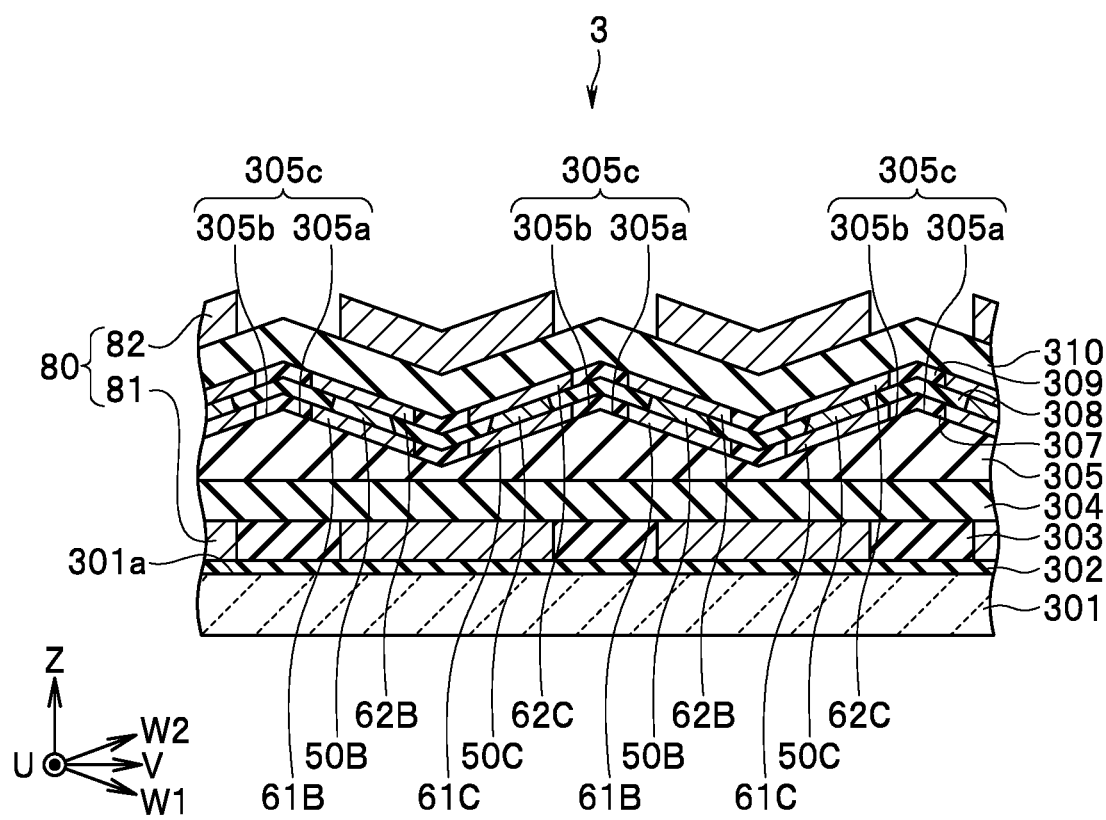
FIG. 10 is a sectional view showing a part of the second chip of the first example embodiment of the technology.

Next, the first to third detection circuits 10, 20, and 30 will be described with reference to FIGS. 3 to 10. FIG. 4 is a circuit diagram showing a circuit configuration of a first detection circuit 10. FIG. 5 is a circuit diagram showing a circuit configuration of a second detection circuit 20. FIG. 6 is a circuit diagram showing a circuit configuration of a third detection circuit 30. FIG. 7 is a plan view showing a part of the first chip 2. FIG. 8 is a sectional view showing a part of the first chip 2. FIG. 9 is a plan view showing a part of the second chip 3. FIG. 10 is a sectional view showing a part of the second chip 3.

Here, as shown in FIGS. 7 and 9, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. In one example, α is 45°. −U direction refers to a direction opposite to the U direction, and −V direction refers to a direction opposite to the V direction.

As shown in FIG. 10, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 10 is configured to detect a component of the target magnetic field in a direction parallel to the U direction and generate at least one first detection signal which has a correspondence with the component. The second detection circuit 20 is configured to detect a component of the target magnetic field in a direction parallel to the W1 direction and generate at least one second detection signal which has a correspondence with the component. The third detection circuit 30 is configured to detect a component of the target magnetic field in a direction parallel to the W2 direction and generate at least one third detection signal which has a correspondence with the component.

As shown in FIG. 4, the first detection circuit 10 includes a power supply port V1, a ground port G1, signal output ports E11 and E12, a first resistor section R11, a second resistor section R12, a third resistor section R13, and a fourth resistor section R14. The plurality of MR elements of the first detection circuit 10 constitute the first to fourth resistor sections R11, R12, R13, and R14.

The first resistor section R11 is provided between the power supply port V1 and the signal output port E11. The second resistor section R12 is provided between the signal output port E11 and the ground port G1. The third resistor section R13 is provided between the signal output port E12 and the ground port G1. The fourth resistor section R14 is provided between the power supply port V1 and the signal output port E12.

As shown in FIG. 5, the second detection circuit 20 includes a power supply port V2, a ground port G2, signal output ports E21 and E22, a first resistor section R21, a second resistor section R22, a third resistor section R23, and a fourth resistor section R24. The plurality of MR elements of the second detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 6, the third detection circuit 30 includes a power supply port V3, a ground port G3, signal output ports E31 and E32, a first resistor section R31, a second resistor section R32, a third resistor section R33, and a fourth resistor section R34. The plurality of MR elements of the third detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of predetermined magnitude is applied to each of the power supply ports V1 to V3. Each of the ground ports G1 to G3 is connected to the ground.

The plurality of MR elements of the first detection circuit 10 will hereinafter be referred to as a plurality of first MR elements 50A. The plurality of MR elements of the second detection circuit 20 will be referred to as a plurality of second MR elements 50B. The plurality of MR elements of the third detection circuit 30 will be referred to as a plurality of third MR elements 50C. Since the first to third detection circuits 10, 20, and 30 are components of the magnetic sensor 1, it can be said that the magnetic sensor 1 includes the plurality of first MR elements 50A, the plurality of second MR elements 50B, and the plurality of third MR elements 50C. Any given MR element will be denoted by the reference numeral 50.

Figure 11:
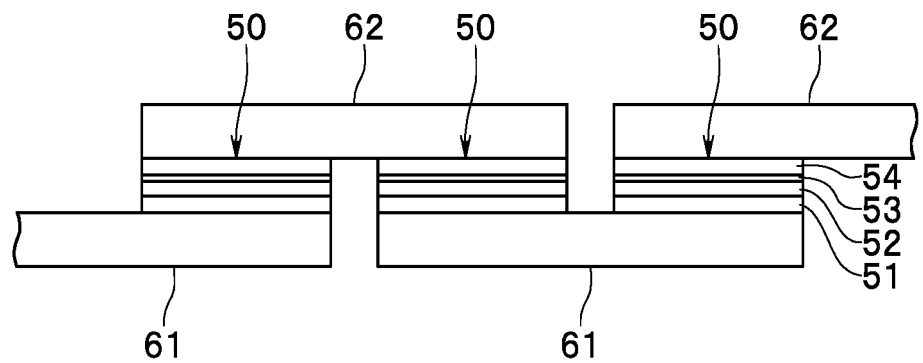
FIG. 11 is a side view showing a magnetoresistive element of the first example embodiment of the technology.

FIG. 11 is a side view showing the MR elements 50. Each MR element 50 may be a spin-valve MR element or an anisotropic magnetoresistive (AMR) element. In particular, in the present example embodiment, each MR element 50 is a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 11.

In FIGS. 4 to 6, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 4, the magnetization directions of the magnetization pinned layers 52 in each of the first and third resistor sections R11 and R13 are the U direction. The magnetization directions of the magnetization pinned layers 52 in each of the second and fourth resistor sections R12 and R14 are the −U direction. The free layer 54 in each of the plurality of first MR elements 50A has a shape anisotropy that sets the direction of the magnetization easy axis to a direction parallel to the V direction. The magnetization directions of the free layers 54 in each of the first and second resistor sections R11 and R12 in a case where no target magnetic field is applied to the first MR elements 50A are the V direction. The magnetization directions of the free layers 54 in each of the third and fourth resistor sections R13 and R14 in the foregoing case are the −V direction.

In the example shown in FIG. 5, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of second MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the second MR elements 50B are the U direction. The magnetization directions of the free layers 54 in each of the third and fourth resistor sections R23 and R24 in the foregoing case are the −U direction.

In the example shown in FIG. 6, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of third MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the third MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50A, the plurality of second MR elements 50B, and the plurality of third MR elements 50C. In the example embodiment, the magnetic field generator includes a first coil 70 that applies a magnetic field in the predetermined direction to the free layer 54 in each of the first MR elements 50A, and a second coil 80 that applies a magnetic field in the predetermined direction to the free layer 54 in each of the plurality of second MR elements 50B and the plurality of third MR elements 50C. The first chip 2 includes the first coil 70. The second chip 3 includes the second coil 80.

In view of manufacturing and other precisions of the MR elements 50, the magnetization directions of the magnetization pinned layers 52 and the directions of the magnetization easy axes of the free layers 54 may be slightly different from the foregoing directions. The magnetization pinned layers 52 may be magnetized to include magnetization components having the foregoing directions as their main components. In such a case, the magnetization directions of the magnetization pinned layers 52 are the same or substantially the same as the foregoing directions.

A specific structure of the first and second chips 2 and 3 will be described in detail below. First, a structure of the first chip 2 will be described with reference to FIGS. 7 and 8. FIG. 8 shows a part of a cross section at the position indicated by the line 8-8 in FIG. 7.

The first chip 2 includes a substrate 201 having a top surface 201a, insulating layers 202, 203, 204, 207, 208, 209, and 210, a plurality of lower electrodes 61A, a plurality of upper electrodes 62A, a plurality of lower coil elements 71, and a plurality of upper coil elements 72. The top surface 201a of the substrate 201 is parallel to the XY plane. The Z direction is also a direction perpendicular to the top surface 201a of the substrate 201. The coil elements are a part of the coil winding.

The insulating layer 202 is disposed on the substrate 201. The plurality of lower coil elements 71 are disposed on the insulating layer 202. The insulating layer 203 is disposed around the plurality of lower coil elements 71 on the insulating layer 202. The insulating layer 204 is disposed on the plurality of lower coil elements 71 and the insulating layer 203.

The plurality of lower electrodes 61A are disposed on the insulating layer 204. The insulating layer 207 is disposed around the plurality of lower electrodes 61A on the insulating layer 204. The plurality of first MR elements 50A are disposed on the plurality of lower electrodes 61A. The insulating layer 208 is disposed around the plurality of first MR elements 50A on the plurality of lower electrodes 61A and the insulating layer 207. The plurality of upper electrodes 62A are disposed on the plurality of first MR elements 50A and the insulating layer 208. The insulating layer 209 is disposed around the plurality of upper electrodes 62A on the insulating layer 208.

The insulating layer 210 is disposed on the plurality of upper electrodes 62A and the insulating layer 209. The plurality of upper coil elements 72 are disposed on the insulating layer 210. The first chip 2 may further include a not-shown insulating layer that covers the plurality of upper coil elements 72 and the insulating layer 210. FIG. 7 shows the insulating layer 204, the plurality of first MR elements 50A, and the plurality of upper coil elements 72 among the components of the first chip 2.

The top surface 201a of the substrate 201 is parallel to the XY plane. The top surface of each of the plurality of lower electrodes 61A is also parallel to the XY plane. The reference plane 4a is parallel to the XY plane. Thus, in the foregoing state, it can be said that the plurality of first MR elements 50A are disposed on a plane parallel to the reference plane 4a.

As shown in FIG. 7, the plurality of first MR elements 50A are disposed so that two or more MR elements 50A are arranged both in the U direction and in the V direction. The plurality of first MR elements 50A are connected in series by the plurality of lower electrodes 61A and the plurality of upper electrodes 62A.

A method for connecting the plurality of first MR elements 50A will now be described in detail with reference to FIG. 11. In FIG. 11, the reference numerals 61 denote lower electrodes corresponding to given MR elements 50, and the reference numerals 62 denote upper electrodes corresponding to the MR elements 50. As shown in FIG. 11, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown in the drawings, an MR element 50 located at the end of a row of MR elements 50 is connected to another MR element 50 located at the end of another row of MR elements 50 adjoining in a direction intersecting with the longitudinal direction of the lower electrodes 61. The two MR elements 50 are connected to each other by a not-shown electrode. The not-shown electrode may be an electrode connecting the bottom surfaces of the two MR elements 50 or the upper surfaces of the same.

If the MR elements 50 shown in FIG. 11 are first MR elements 50A, the lower electrodes 61 shown in FIG. 11 correspond to lower electrodes 61A, and the upper electrodes 62 shown in FIG. 11 correspond to upper electrodes 62A. In such a case, the longitudinal direction of the lower electrodes 61 is parallel to the V direction.

Each of the plurality of upper coil elements 72 extends in a direction parallel to the Y direction. The plurality of upper coil elements 72 are arranged in the X direction. In particular, in the present example embodiment, when seen in the Z direction, each of the plurality of first MR elements 50A overlaps two upper coil elements 72.

Each of the plurality of lower coil elements 71 extends in a direction parallel to the Y direction. The plurality of lower coil elements 71 are arranged in the X direction. The shape and arrangement of the plurality of lower coil elements 71 may be the same as or different from those of the plurality of upper coil elements 72.

In the example shown in FIGS. 7 and 8, the plurality of lower coil elements 71 and the plurality of upper coil elements 72 are electrically connected to constitute the first coil 70 that applies a magnetic field in a direction parallel to the X direction to the free layers 54 of the respective first MR elements 50A. The first coil 70 may be configured so that a magnetic field in the X direction can be applied to the free layers 54 in the first and second resistor sections R11 and R12 and a magnetic field in the −X direction can be applied to the free layers 54 in the third and fourth resistor sections R13 and R14. The first coil 70 may be controlled by the processor 40.

Next, a structure of the second chip 3 will be described with reference to FIGS. 9 and 10. FIG. 10 shows a part of a cross section at the position indicated by the line 10-10 in FIG. 9.

The second chip 3 includes a substrate 301 having a top surface 301a, insulating layers 302, 303, 304, 305, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. The top surface 301a of the substrate 301 is parallel to the XY plane. The Z direction is a direction perpendicular to the top surface 301a of the substrate 301.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304 and 305 are stacked in this order on the plurality of lower coil elements 81 and the insulating layer 303.

The plurality of lower electrodes 61B and the plurality of lower electrodes 61C are disposed on the insulating layer 305. The insulating layer 307 is disposed around the plurality of lower electrodes 61B and around the plurality of lower electrodes 61C on the insulating layer 305. The plurality of second MR elements 50B are disposed on the plurality of lower electrodes 61B. The plurality of third MR elements 50C are disposed on the plurality of lower electrodes 61C. The insulating layer 308 is disposed around the plurality of second MR elements 50B and around the plurality of third MR elements 50C on the plurality of lower electrodes 61B, the plurality of lower electrodes 61C, and the insulating layer 307. The plurality of upper electrodes 62B are disposed on the plurality of second MR elements 50B and the insulating layer 308. The plurality of upper electrodes 62C are disposed on the plurality of third MR elements 50C and the insulating layer 308. The insulating layer 309 is disposed around the plurality of upper electrodes 62B and around the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The second chip 3 may further include a not-shown insulating layer that covers the plurality of upper coil elements 82 and the insulating layer 310.

The second chip 3 includes a support member that supports the plurality of second MR elements 50B and the plurality of third MR elements 50C. The support member has at least one inclined surface inclined relative to the top surface 301a of the substrate 301. In particular, in the present example embodiment, the support member includes the insulating layer 305. FIG. 9 shows the insulating layer 305, the plurality of second MR elements 50B, the plurality of third MR elements 50C, and the plurality of upper coil elements 82 among the components of the second chip 3.

The insulating layer 305 includes a plurality of protruding surfaces 305c each protruding in a direction away from the top surface 301a of the substrate 301 (Z direction). The plurality of protruding surfaces 305c each extend in the direction parallel to the U direction. The overall shape of each protruding surface 305c is a triangular roof shape obtained by moving the triangular shape of the protruding surface 305c shown in FIG. 10 along the direction parallel to the U direction. The plurality of protruding surfaces 305c are arranged in the direction parallel to the V direction.

Now, focus is placed on one of the protruding surfaces 305c. The protruding surface 305c includes a first inclined surface 305a and a second inclined surface 305b. The first inclined surface 305a is a surface forming a part of the protruding surface 305c on the side of the V direction. The second inclined surface 305b is a surface forming a part of the protruding surface 305c on the side of the −V direction.

The top surface 301a of the substrate 301 is parallel to the XY plane. The reference plane 4a is parallel to the XY plane. The first inclined surface 305a and the second inclined surface 305b are each inclined relative to each of the top surface 301a of the substrate 301 and the reference plane 4a. The second inclined surface 305b faces a direction different from the first inclined surface 305a. A gap between the first inclined surface 305a and the second inclined surface 305b in a VZ cross section perpendicular to the top surface 301a of the substrate 301 becomes smaller in the direction away from the top surface 301a of the substrate 301.

In the example embodiment, there are plurality of protruding surfaces 305c, and thus there are a plurality of first inclined surfaces 305a and a plurality of second inclined surfaces 305b. The insulating layer 305 includes the plurality of first inclined surfaces 305a and the plurality of second inclined surfaces 305b.

The plurality of lower electrodes 61B are disposed on the plurality of first inclined surfaces 305a. The plurality of lower electrodes 61C are disposed on the plurality of second inclined surfaces 305b. As describe above, the first and second inclined surfaces 305a and 305b are each inclined relative to the top surface 301a of the substrate 301, i.e., the XY plane. The top surface of each of the plurality of lower electrodes 61B and the top surface of each of the plurality of lower electrode 61C are thus also inclined relative to the XY plane. The reference plane 4a is parallel to the XY plane. Thus, it can be said that the plurality of second MR elements 50B and the plurality of third MR elements 50C are disposed on the inclined surfaces inclined relative to the reference plane 4a. The insulating layer 305 is a member for supporting each of the plurality of second MR elements 50B and the plurality of third MR elements 50C so as to allow each of the MR elements to be inclined relative to the reference plane 4a.

Each of the plurality of first inclined surfaces 305a may be a plane that is at least partially parallel to the U direction and the W1 direction. Each of the plurality of second inclined surfaces 305b may be a plane that is at least partially parallel to the U direction and the W2 direction.

The protruding surface 305c may be a semi-cylindrical curved surface formed by moving the curved shape (arch shape) along the direction parallel to the U direction. In such a case, the first inclined surface 305a is a curved surface. The second MR elements 50B are curved along the curved surface (the first inclined surface 305a). Even in such a case, the magnetization direction of the magnetization pinned layer 52 of each second MR element 50B is defined as a straight direction as described above for convenience sake. Similarly, the second inclined surface 305b is a curved surface. The third MR elements 50C are curved along the curved surface (the second inclined surface 305b). Even in such a case, the magnetization direction of the magnetization pinned layer 52 of each third MR element 50C is defined as a straight direction as described above for convenience sake.

Although not shown, the insulating layer 305 further includes a flat surface present around the plurality of protruding surfaces 305c. The plurality of protruding surfaces 305c may protrude from the flat surface in the Z direction. The plurality of protruding surfaces 305c may be disposed with predetermined gaps therebetween so that a flat surface is formed between two adjoining protruding surfaces 305c. Alternatively, the insulating layer 305 may have groove portions recessed from the flat surface in the −Z direction. In such a case, the plurality of protruding surfaces 305c may be present in the groove portions.

As shown in FIG. 9, the plurality of second MR elements 50B are disposed so that two or more MR elements 50B are arranged both in the U direction and in the V direction. A plurality of second MR elements 50B are arranged in a row on one first inclined surface 305a. Similarly, the plurality of third MR elements 50C are disposed so that two or more MR elements 50C are arranged both in the U direction and in the V direction. A plurality of third MR elements 50C are arranged in a row on one second inclined surface 305b. In the example embodiment, a plurality of rows of second MR elements 50B and a plurality of rows of third MR elements 50C are alternately arranged in the direction parallel to the V direction.

The plurality of second MR elements 50B are connected in series by the plurality of lower electrodes 61B and the plurality of upper electrodes 62B. The foregoing description of the method for connecting the plurality of first MR elements 50A also applies to a method for connecting the plurality of second MR elements 50B. If the MR elements 50 shown in FIG. 11 are second MR elements 50B, the lower electrodes 61 shown in FIG. 11 correspond to lower electrodes 61B, and the upper electrodes 62 shown in FIG. 11 correspond to upper electrodes 62B. In such a case, the longitudinal direction of the lower electrodes 61 is parallel to the U direction.

Similarly, the plurality of third MR elements 50C are connected in series by the plurality of lower electrodes 61C and the plurality of upper electrodes 62C. The foregoing description of the method for connecting the plurality of first MR elements 50A also applies to a method for connecting the plurality of third MR elements 50C. If the MR elements 50 shown in FIG. 11 are third MR elements 50C, the lower electrodes 61 shown in FIG. 11 correspond to lower electrodes 61C, and the upper electrodes 62 shown in FIG. 11 correspond to upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of second MR elements 50B and the plurality of third MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82.

In the example shown in FIGS. 9 and 10, the plurality of lower coil elements 81 and the plurality of upper coil elements 82 are electrically connected to constitute the second coil 80 that applies a magnetic field in the direction parallel to the X direction to the free layer 54 in each of the plurality of second MR elements 50B and the plurality of third MR elements 50C. The second coil 80 may be configured, for example, so that a magnetic field in the X direction can be applied to the free layers 54 in the first and second resistor sections R21 and R22 of the second detection circuit 20 and the first and second resistor sections R31 and R32 of the third detection circuit 30, and a magnetic field in the −X direction can be applied to the free layers 54 in the third and fourth resistor sections R23 and R24 of the second detection circuit 20 and the third and fourth resistor sections R33 and R34 of the third detection circuit 30. The second coil 80 may be controlled by the processor 40.

Figure 12:
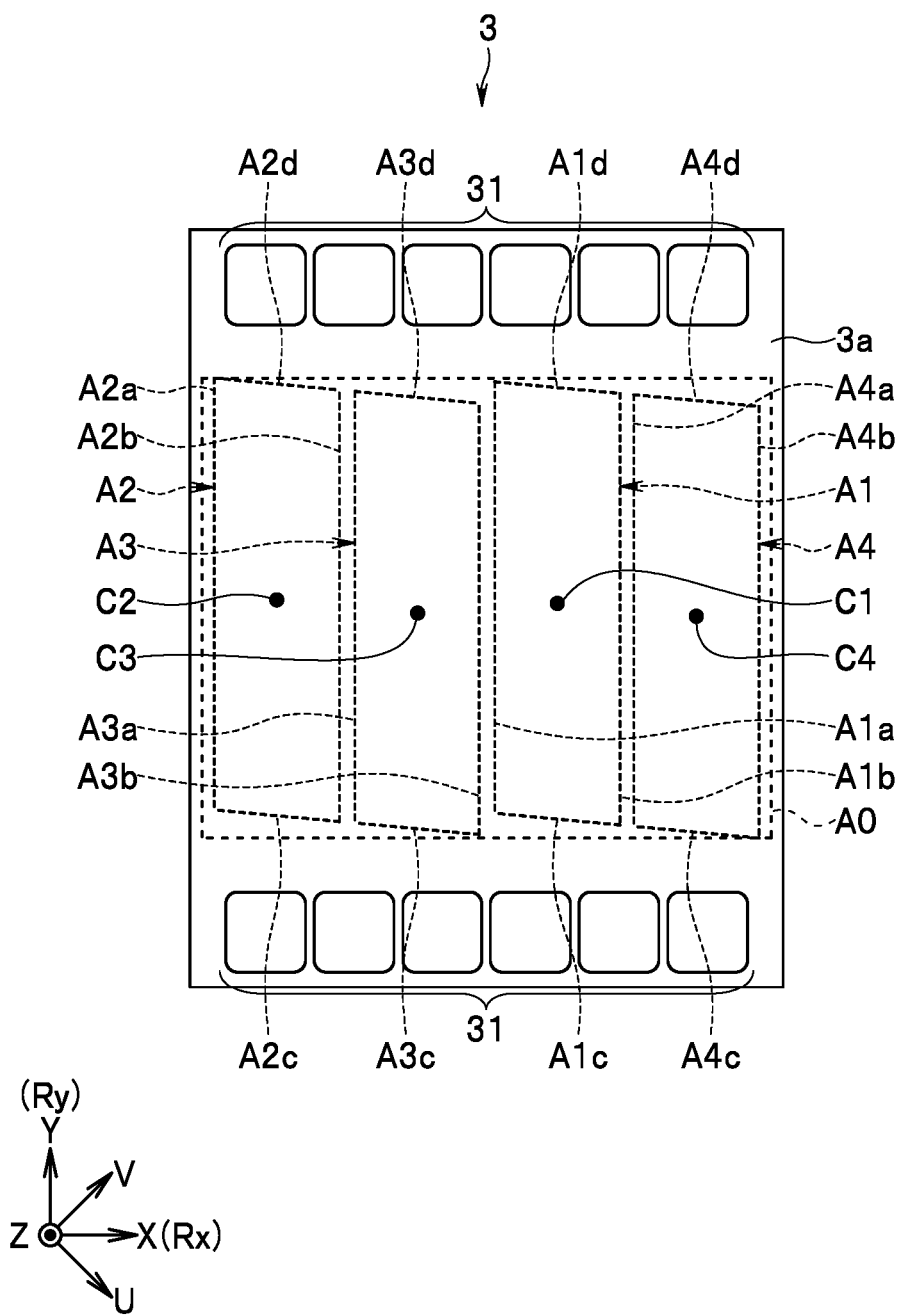
FIG. 12 is a plan view showing an element layout area of the first example embodiment of the technology.

Next, the arrangement of the plurality of second MR elements 50B and the plurality of third MR elements 50C will be described with reference to FIG. 12. FIG. 12 is a plan view showing an element layout area. The second chip 3 includes an element layout area A0 for disposing the plurality of second MR elements 50B and the plurality of third MR elements 50C. Since the second chip 3 is a component of the magnetic sensor 1, it can be said that the magnetic sensor 1 includes the element layout area A0. In the present example embodiment, the element layout area A0 as well as a plurality of areas described below are defined as a plane area parallel to the XY plane. The plurality of second MR elements 50B and the plurality of third MR elements 50C overlap the element layout area A0 when seen in the Z direction. In the present example embodiment, it is assumed for convenience sake that the element layout area A0 is present on the top surface of the insulating layer 305.

The proportion of the area of the element layout area A0 to the area of the top surface 3a of the second chip 3 is greater than or equal to 2%. The proportion may be in the range of 10 to 90% or in the range of 45 to 75%. The dimension of the element layout area A0 in the first reference direction Rx may be greater than the dimension of the element layout area A0 in the second reference direction Ry.

The element layout area A0 includes a first area A1, a second area A2, a third area A3, and a fourth area A4. The first area A1 is an area corresponding to the first resistor sections R21 and R31. The second area A2 is an area corresponding to the second resistor sections R22 and R32. The third area A3 is an area corresponding to the third resistor sections R23 and R33. The fourth area A4 is an area corresponding to the fourth resistor sections R24 and R34. The dimension of each of the first to fourth areas A1 to A4 in the first reference direction Rx may be greater than the dimension of each of the first to fourth areas A1 to A4 in the second reference direction Ry.

The plurality of second MR elements 50B are disposed dividedly in the first to fourth areas A1 to A4. The second MR elements 50B constituting the first resistor section R21 are disposed in the first area A1. The second MR elements 50B constituting the second resistor section R22 are disposed in the second area A2. The second MR elements 50B constituting the third resistor section R23 are disposed in the third area A3. The second MR elements 50B constituting the fourth resistor section R24 are disposed in the fourth area A4.

The plurality of third MR elements 50C are disposed dividedly in the first to fourth areas A1 to A4. The third MR elements 50C constituting the first resistor section R31 are disposed in the first area A1. The third MR elements 50C constituting the second resistor section R32 are disposed in the second area A2. The third MR elements 50C constituting the third resistor section R33 are disposed in the third area A3. The third MR elements 50C constituting the fourth resistor section R34 are disposed in the fourth area A4.

Next, the arrangement of the first to fourth areas A1 to A4 will be described with reference to FIG. 12. The first to fourth areas A1 to A4 are disposed so as to be arranged along the first reference direction Rx. In the example shown in FIG. 12, the first to fourth areas A1 to A4 are disposed such that the areas A2, A3, A1, and A4 are arranged in this order in a direction from an end edge of the element layout area A0 on the side of the −X direction to an end edge of the element layout area A0 on the side of the X direction. However, in the technology, the arrangement order of the first to fourth areas A1 to A4 is not limited to this example.

In FIG. 12, the point denoted by the reference numeral C1 indicates the center of gravity of the first area A1 when seen in the Z direction. The point denoted by the reference numeral C2 indicates the center of gravity of the second area A2 when seen in the Z direction. The point denoted by the reference numeral C3 indicates the center of gravity of the third area A3 when seen in the Z direction. The point denoted by the reference numeral C4 indicates the center of gravity of the fourth area A4 when seen in the Z direction.

The center of gravity C1 of the first area A1 and the center of gravity C4 of the fourth area A4 are displaced from each other in the second reference direction Ry. In the example shown in FIG. 12, the position of the center of gravity C4 of the fourth area A4 in the second reference direction Ry is located forward in the −Y direction with respect to the position of the center of gravity C1 of the first area A1 in the second reference direction Ry. The center of gravity C1 of the first area A1 and the center of gravity C4 of the fourth area A4 may be displaced from each other by a gap between two adjoining protruding surfaces 305c of the plurality of protruding surfaces 305c in the second reference direction Ry.

The center of gravity C2 of the second area A2 and the center of gravity C3 of the third area A3 are displaced from each other in the second reference direction Ry. In the example shown in FIG. 12, the position of the center of gravity C3 of the third area A3 in the second reference direction Ry is located forward in the −Y direction with respect to the position of the center of gravity C2 of the second area A2 in the second reference direction Ry. The center of gravity C2 of the second area A2 and the center of gravity C3 of the third area A3 may be displaced from each other by a gap between two adjoining protruding surfaces 305c of the plurality of protruding surfaces 305c in the second reference direction Ry.

The direction in which the third area A3 is displaced from the second area A2 may be the same as the direction in which the fourth area A4 is displaced from the first area A1. The amount of displacement of the third area A3 from the second area A2 may be, but need not be, the same as the amount of displacement of the fourth area A4 from the first area A1. The position of the center of gravity C2 of the second area A2 in the second reference direction Ry may be, but need not be, the same as the position of the center of gravity C1 of the first area A1 in the second reference direction Ry. The position of the center of gravity C4 of the fourth area A4 in the second reference direction Ry may be, but need not be, the same as the position of the center of gravity C3 of the third area A3 in the second reference direction Ry.

Next, the shape of each of the first to fourth areas A1 to A4 will be described with reference to FIG. 12. Herein, description will be made by taking the first area A1 as an example. The first area A1 includes a first end edge A1a and a second end edge A1b located at both ends in the first reference direction Rx, and a third end edge A1c and a fourth end edge A1d located at both ends in the second reference direction Ry. The first end edge A1a is located at an end of the first area A1 on the side of the −X direction. The second end edge A1b is located at an end of the first area A1 on the side of the X direction. The third end edge A1c is located at an end of the first area A1 on the side of the −Y direction. The fourth end edge A1d is located at an end of the first area A1 on the side of the Y direction.

Each of the first end edge A1a and the second end edge A1b extends along the second reference direction Ry. Each of the third end edge A1c and the fourth end edge A1d extends along a third reference direction intersecting with each of the first reference direction Rx and the second reference direction Ry and parallel to the reference plane 4a. In particular, in the present example embodiment, the third reference direction is a direction parallel to one direction between the X direction and the U direction. Each of the angle formed by the first end edge A1a and the third end edge A1c and the angle formed by the second end edge A1b and the fourth end edge A1d is an obtuse angle. Each of the angle formed by the first end edge A1a and the fourth end edge A1d and the angle formed by the second end edge A1b and the third end edge A1c is an acute angle.

Hereinafter, the definitions of the first to fourth end edges A1a to A1d will be described. As shown in FIG. 9, in the first area A1, a plurality of rows of elements, which include a plurality of MR elements 50 (a plurality of second MR elements 50B and a plurality of third MR elements 50C) each arranged in a row along the second reference direction Ry, are arranged along the first reference direction Rx. At least a part of the first end edge A1a may coincide with a first line defined by a plurality of MR elements 50 included in a row of elements located on the most −X direction side in the first area A1. The first line is obtained by moving a line, which connects the foregoing plurality of MR elements 50 in the shortest distance, in the −X direction of the plurality of MR elements 50 so that the line does not overlap the plurality of MR elements 50 when seen in the Z direction. The first line is parallel to the second reference direction Ry. The first end edge A1a substantially indicates the positions of the foregoing plurality of MR elements 50.

At least a part of the second end edge A1b may coincide with a second line defined by a plurality of MR elements 50 included in a row of elements located on the most X direction side in the first area A1. The second line is obtained by moving a line, which connects the foregoing plurality of MR elements 50 in the shortest distance, in the X direction of the plurality of MR elements 50 so that the line does not overlap the plurality of MR elements 50 when seen in the Z direction. The second line is parallel to the second reference direction Ry. The second end edge A1b substantially indicates the positions of the foregoing plurality of MR elements 50.

At least a part of the third end edge A1c may coincide with a third line defined by each of a plurality of MR elements 50 located on the most −Y direction side in each of the plurality of rows of elements. The third line is obtained by moving a line, which connects the foregoing plurality of MR elements 50 in the shortest distance, in the −Y direction of the plurality of MR elements 50 so that the line does not overlap the plurality of MR elements 50 when seen in the Z direction. The third line is parallel to the third reference direction. The third end edge A1c substantially indicates the positions of the foregoing plurality of MR elements 50.

At least a part of the fourth end edge A1d may coincide with a fourth line defined by each of a plurality of MR elements 50 located on the most Y direction side in each of the plurality of rows of elements. The fourth line is obtained by moving a line, which connects the foregoing plurality of MR elements 50 in the shortest distance, in the Y direction of the plurality of MR elements 50 so that the line does not overlap the plurality of MR elements 50 when seen in the Z direction. The fourth line is parallel to the third reference direction. The fourth end edge A1d substantially indicates the positions of the foregoing plurality of MR elements 50.

One end portion of the third end edge A1c may be connected to one end portion of the first end edge A1a directly or via a fifth end edge connecting one end portion of the third end edge A1c and one end portion of the first end edge A1a. The other end portion of the third end edge A1c may be connected to one end portion of the second end edge A1b directly or via a sixth end edge connecting the other end portion of the third end edge A1c and one end portion of the second end edge A1b. One end portion of the fourth end edge A1d may be connected to the other end portion of the first end edge A1a directly or via a seventh end edge connecting one end portion of the fourth end edge A1d and the other end portion of the first end edge A1a. The other end portion of the fourth end edge A1d may be connected to the other end portion of the second end edge A1b directly or via an eighth end edge connecting the other end portion of the fourth end edge A1d and the other end portion of the second end edge A1b. Each of the fifth to eighth end edges may extend in a direction intersecting with each of the first reference direction Rx, the second reference direction Ry, and the third reference direction.

The first area A1 may be an area surrounded by only the first to fourth end edges A1a to A1d or an area surrounded by at least one of the fifth to eighth end edges in addition to the first to fourth end edges A1a to A1d.

The second area A2 includes a first end edge A2a, a second end edge A2b, a third end edge A2c, and a fourth end edge A2d. The description of the first to fourth end edges A1a to A1d of the first area A1 also applies to the first to fourth end edges A2a to A2d of the second area A2. Replacing the first area A1 as well as the first to fourth end edges A1a to A1d in the description of the first to fourth end edges A1a to A1d of the first area A1 with the second area A2 as well as the first to fourth end edges A2a to A2d, respectively, can provide a description of the first to fourth end edges A2a to A2d of the second area A2. Note that the third reference direction of the second area A2 may be, but need not be, the same direction as the third reference direction of the first area A1.

The third area A3 includes a first end edge A3a, a second end edge A3b, a third end edge A3c, and a fourth end edge A3d. The description of the first to fourth end edges A1a to A1d of the first area A1 also applies to the first to fourth end edges A3a to A3d of the third area A3. Replacing the first area A1 as well as the first to fourth end edges A1a to A1d in the description of the first to fourth end edges A1a to A1d of the first area A1 with the third area A3 as well as the first to fourth end edges A3a to A3d, respectively, can provide a description of the first to fourth end edges A3a to A3d of the third area A3. Note that the third reference direction of the third area A3 may be, but need not be, the same direction as the third reference direction of the first area A1.

The fourth area A4 includes a first end edge A4a, a second end edge A4b, a third end edge A4c, and a fourth end edge A4d. The description of the first to fourth end edges A1a to A1d of the first area A1 also applies to the first to fourth end edges A4a to A4d of the fourth area A4. Replacing the first area A1 as well as the first to fourth end edges A1a to A1d in the description of the first to fourth end edges A1a to A1d of the first area A1 with the fourth area A4 as well as the first to fourth end edges A4a to A4d, respectively, can provide a description of the first to fourth end edges A4a to A4d of the fourth area A4. Note that the third reference direction of the fourth area A4 may be, but need not be, the same direction as the third reference direction of the first area A1.

Next, the element layout area of the first chip 2 will be described. Although not shown, the first chip 2 includes an element layout area for disposing the plurality of first MR elements 50A. In the present example embodiment, the element layout area as well as a plurality of areas described below of the first chip 2 are defined as a plane area parallel to the XY plane. The plurality of first MR elements 50A overlap the element layout area of the first chip 2 when seen in the Z direction. In the present example embodiment, it is assumed for convenience sake that the element layout area of the first chip 2 is present on the top surface of the insulating layer 204.

The proportion of the area of the element layout area to the area of the top surface 2a of the first chip 2 is greater than or equal to 2%. The proportion may be in the range of 10 to 90% or in the range of 45 to 75%.

The element layout area of the first chip 2 includes a first area corresponding to the first resistor section R11, a second area corresponding to the second resistor section R12, a third area corresponding to the third resistor section R13, and a fourth area corresponding to the fourth resistor section R14. The plurality of first MR elements 50A are disposed dividedly in the first to fourth areas. The first MR elements 50A constituting the first resistor section R11 are disposed in the first area. The first MR elements 50A constituting the second resistor section R12 are disposed in the second area. The first MR elements 50A constituting the third resistor section R13 are disposed in the third area. The first MR elements 50A constituting the fourth resistor section R14 are disposed in the fourth area.

Next, the plurality of protruding surfaces 305c will be described in detail. The magnetic sensor 1 includes a plurality of structural bodies each structured to cause the plurality of MR elements 50 to detect a specific component of a target magnetic field. In the present example embodiment, the plurality of second MR elements 50B are disposed such that two or more second MR elements 50B are arranged on each of the plurality of first inclined surfaces 305a. Each of the plurality of first inclined surfaces 305a is structured to be inclined relative to the top surface 301a and the reference plane 4a so as to allow the plurality of second MR elements 50B to detect a component of the target magnetic field in the direction parallel to the W1 direction. Thus, the plurality of first inclined surfaces 305a correspond to the "plurality of structural bodies" of the technology.

In the present example embodiment, the plurality of third MR elements 50C are disposed such that two or more third MR elements 50C are arranged on each of the plurality of second inclined surfaces 305b. Each of the plurality of second inclined surfaces 305b is structured to be inclined relative to the top surface 301a, that is, the reference plane 4a so as to allow the plurality of third MR elements 50C to detect a component of the target magnetic field in the direction parallel to the W2 direction. Thus, the plurality of second inclined surfaces 305b correspond to the "plurality of structural bodies" of the technology.

Each of the plurality of protruding surfaces 305c includes the first inclined surface 305a and the second inclined surface 305b. Thus, the plurality of protruding surfaces 305c also correspond to the "plurality of structural bodies" of the technology. Hereinafter, the features of the "plurality of structural bodies" of the technology will be described with reference to the plurality of protruding surfaces 305c as an example.

Figure 13:
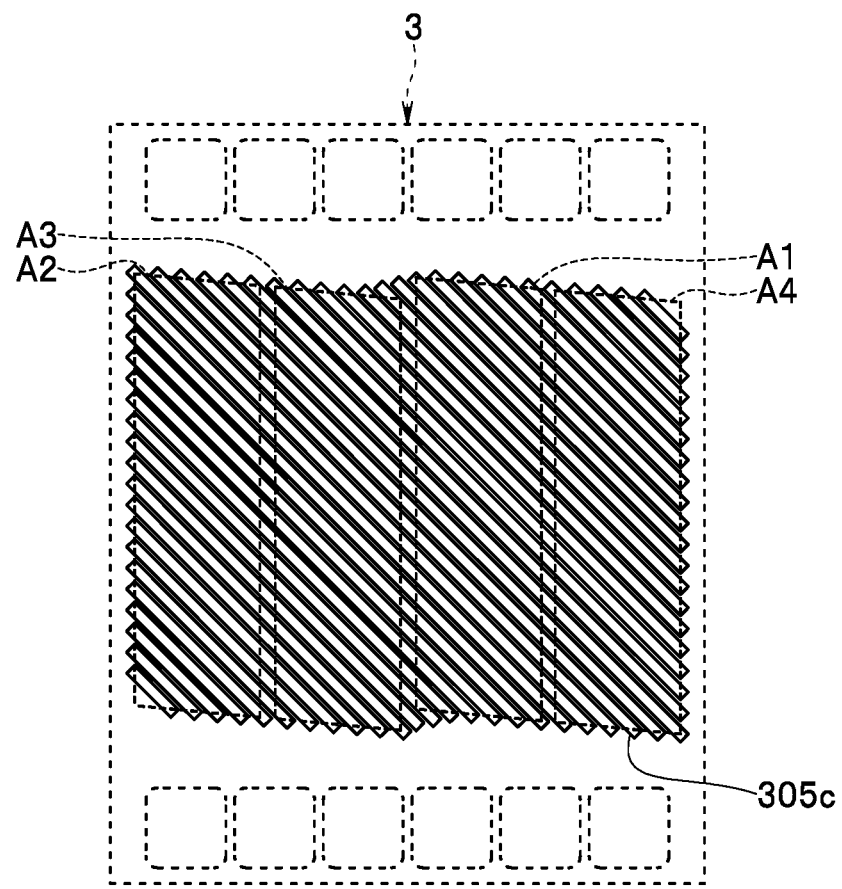
FIG. 13 is a plan view showing a plurality of protruding surfaces of the first example embodiment of the technology.
Figure 13:
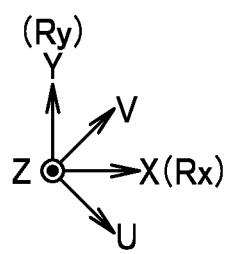

FIG. 13 is a plan view showing the plurality of protruding surfaces 305c. Note that in FIG. 13, a gap is provided between two adjoining protruding surfaces 305c for convenience sake. FIG. 13 also shows the first to fourth areas A1 to A4 of the element layout area A0 of the second chip 3. The plurality of protruding surfaces 305c are present in the first to fourth areas A1 to A4 of the element layout area A0 of the second chip 3, but are not present in the first to fourth areas of the element layout area of the first chip 2.

Each of the plurality of protruding surfaces 305c extends in a direction intersecting with the first reference direction Rx at an angle other than 90°. In particular, in the present example embodiment, each of the plurality of protruding surfaces 305c extends in the direction parallel to the U direction. The plurality of protruding surfaces 305c include protruding surfaces 305c each extending across at least two of the first to fourth areas A1 to A4. The plurality of protruding surfaces 305c further include protruding surfaces 305c each extending across only one of the first to fourth areas A1 to A4.

Hereinafter, the relationship between the plurality of protruding surfaces 305c and the first to fourth areas A1 to A4 will be described in further detail. The plurality of protruding surfaces 305c include protruding surfaces 305c each extending across only the second area A2, and protruding surfaces 305c each extending across only the fourth area A4. The plurality of protruding surfaces 305c further include protruding surfaces 305c each extending across the second and third areas A2 and A3 but not extending across the first and fourth areas A1 and A4, and protruding surfaces 305c each extending across the first and fourth areas A1 and A4 but not extending across the second and third areas A2 and A3. The plurality of protruding surfaces 305c further include protruding surfaces 305c each extending across the first to third areas A1 to A3 but not extending across the fourth area A4, and protruding surfaces 305c each extending across the first, third, and fourth areas A1, A3, and A4 but not extending across the second area A2. The plurality of protruding surfaces 305c further include protruding surfaces 305c each extending across the first to fourth areas A1 to A4.

Each protruding surface 305c includes a first end portion and a second end portion located at both ends of the protruding surface 305c in the longitudinal direction. The first end portion and the second end portion of each of the plurality of protruding surfaces 305c are not present in the inside of each of the first to fourth areas A1 to A4 or between two adjoining areas of the first to fourth areas A1 to A4.

Figure 14:
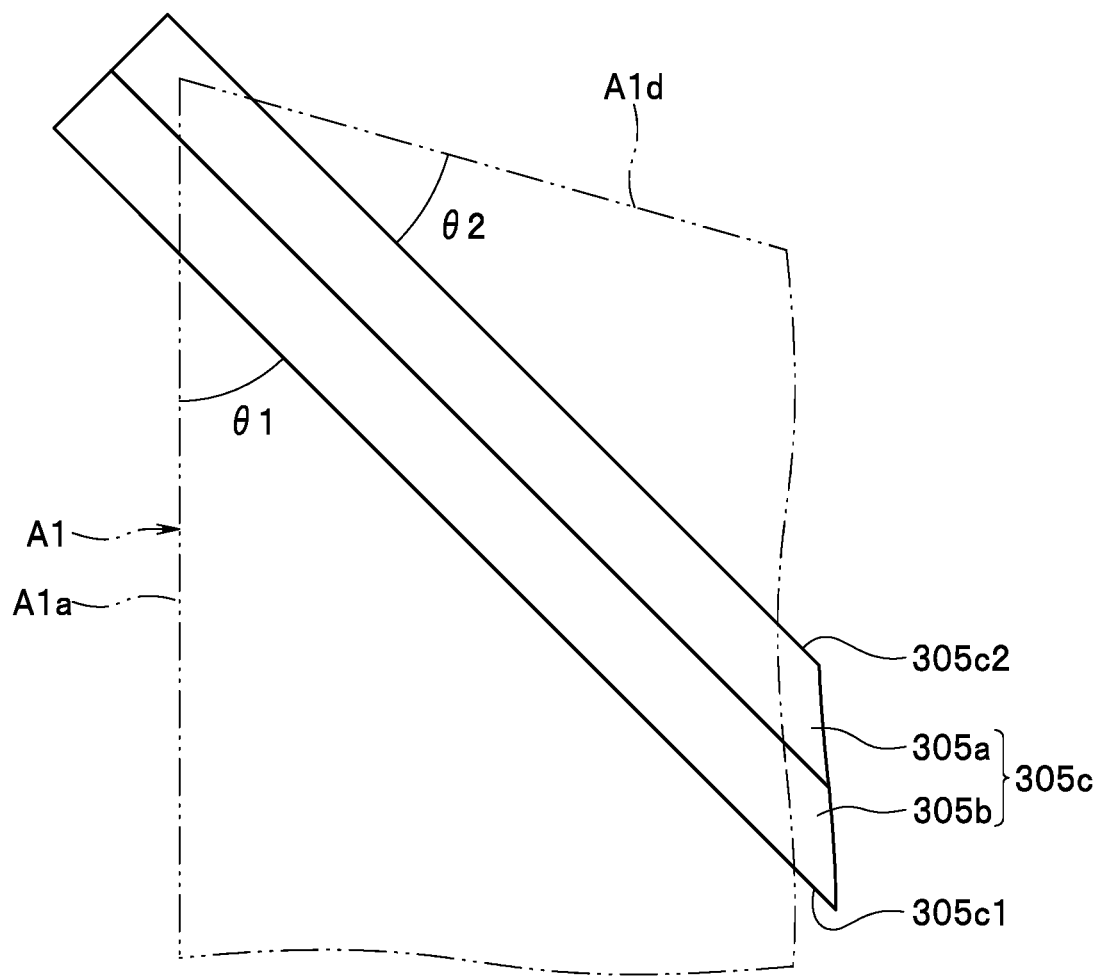
FIG. 14 is an explanatory view showing a protruding surface, a first end edge, and a fourth end edge of the first example embodiment of the technology.

FIG. 14 is an explanatory view showing one protruding surface 305c and the first and fourth end edges A1a and A1d of the first area A1. Herein, an angle $\theta 1$ that the protruding surface 305c forms with respect to the first end edge A1a and an angle $\theta 2$ that the protruding surface 305c forms with respect to the fourth end edge A1d are defined as follows. The protruding surface 305c includes a third end portion 305c1 that is an end portion of the protruding surface 305c on the side of the −V direction, and a fourth end portion 305c2 that is an end portion of the protruding surface 305c on the side of the V direction. In the present example embodiment, the angle (the acute angle) that the third end portion 305c1 forms with respect to the first end edge A1a is the angle $\theta 1$, and the angle (the acute angle) that the fourth end portion 305c2 forms with respect to the fourth end edge A1d is the angle $\theta 2$.

The angle $\theta 1$ is larger than the angle $\theta 2$. The angle $\theta 1$ may be in the range of 43° to 47°. The angle $\theta 2$ may be smaller than 45° and in the range of 38° to 42°. The sum of the angle $\theta 1$ and the angle $\theta 2$ may be in the range of 81° to 89°.

In the present example embodiment, the angle (the acute angle) that the third end portion 305c1 forms with respect to the second end edge A1b is the angle that the protruding surface 305c forms with respect to the second end edge A1b, and the angle (the acute angle) that the fourth end portion 305c2 forms with respect to the third end edge A1c is the angle that the protruding surface 305c forms with respect to the third end edge A1c. The angle that the protruding surface 305c forms with respect to the second end edge A1b may be equal to the angle $\theta 1$. The angle that the protruding surface 305c forms with respect to the third end edge A1c may be equal to the angle $\theta 2$. The angle (the angle $\theta 1$) that the protruding surface 305c forms with respect to the first end edge A1a or the second end edge A1b is larger than the angle (the angle $\theta 2$) that the protruding surface 305c forms with respect to the third end edge A1c or the fourth end edge A1d.

Note that in the present example embodiment, the angle that the first inclined surface 305a or the second inclined surface 305b forms with respect to each of the first to fourth end edges A1a to A1d is equal to the angle that the protruding surface 305c forms with respect to each of the first to fourth end edges A1a to A1d.

The description has been made heretofore focusing on one protruding surface 305c, regarding the relationship between the protruding surface 305c and the first to fourth end edges A1a to A1d of the first area A1. The foregoing description also applies to the other plurality of protruding surfaces 305c. The relationship between the plurality of protruding surfaces 305c and the first to fourth end edges A1a to A1d of the first area A1 also applies to the relationship between the plurality of protruding surfaces 305c and the first to fourth end edges A2a to A2d of the second area A2, the relationship between the plurality of protruding surfaces 305c and the first to fourth end edges A3a to A3d of the third area A3, and the relationship between the plurality of protruding surfaces 305c and the first to fourth end edges A4a to A4d of the fourth area A4.

Figure 15:
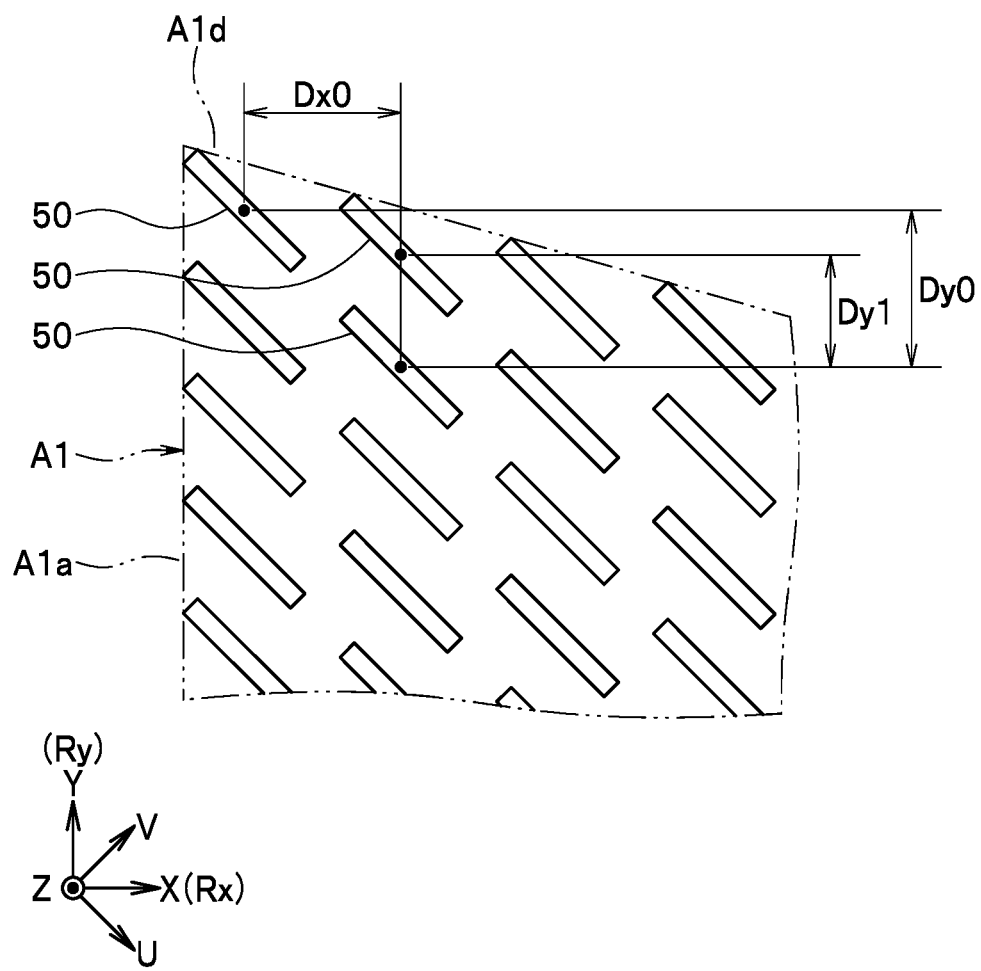
FIG. 15 is an explanatory view showing a plurality of magnetoresistive elements in a part of a first area of the first example embodiment of the technology.

Next, the arrangement of the plurality of MR elements 50 (the plurality of second MR elements 50B and the plurality of third MR elements 50C) in the first area A1 will be described with reference to FIG. 15. FIG. 15 is an explanatory view showing the plurality of MR elements in a part of the first area A1.

Each of the plurality of MR elements 50 is long in a direction different from each of the first reference direction Rx, the second reference direction Ry, and the third reference direction. In particular, in the present example embodiment, each of the plurality of MR elements 50 is long in the direction parallel to the U direction.

As shown in FIG. 15, in the first area A1, the plurality of MR elements 50 are disposed such that two or more MR elements 50 are arranged in a row along the second reference direction Ry, and also two or more MR elements 50 are arranged in a row along a direction parallel to the longitudinal direction of each of the plurality of MR elements 50 in the first area A1, that is, the direction parallel to the U direction.

In the present example embodiment, a gap between any given two MR elements 50 is represented by a gap between the center of gravity of one of the MR elements 50 when seen in the Z direction and the center of gravity of the other MR element 50 when seen in the Z direction. As shown in FIG. 15, a gap in the first reference direction Rx between two MR elements 50 adjoining in the direction parallel to the longitudinal direction of each of the MR elements 50 in the first area A1, that is, the direction parallel to the U direction is represented by the symbol Dx0. A gap in the second reference direction Ry between two MR elements 50 adjoining in the direction parallel to the U direction is represented by the symbol Dy0. The gap Dx0 may be equal to or different from the gap Dy0.

The gap between two MR elements 50 adjoining in the second reference direction Ry is represented by the symbol Dy1. In the present example embodiment, the gap Dy1 is smaller than the gap Dy0.

Next, the first to third detection signals will be described. The first detection signal will initially be described with reference to FIG. 4. As the strength of the component of the target magnetic field in the direction parallel to the U direction changes, the resistance of each of the resistor sections R11 to R14 of the first detection circuit 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first detection circuit 10 generates a signal corresponding to the electric potential of the signal output port E11 as a first detection signal S11, and generates a signal corresponding to the electric potential of the signal output port E12 as a first detection signal S12.

Next, the second detection signal will be described with reference to FIG. 5. As the strength of the component of the target magnetic field in the direction parallel to the W1 direction changes, the resistance of each of the resistor sections R21 to R24 of the second detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second detection circuit 20 generates a signal corresponding to the electric potential of the signal output port E21 as a second detection signal S21, and generates a signal corresponding to the electric potential of the signal output port E22 as a second detection signal S22.

Next, the third detection signal will be described with reference to FIG. 6. As the strength of the component of the target magnetic field in the direction parallel to the W2 direction changes, the resistance of each of the resistor sections R31 to R34 of the third detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third detection circuit 30 generates a signal corresponding to the electric potential of the signal output port E31 as a third detection signal S31, and generates a signal corresponding to the electric potential of the signal output port E32 as a third detection signal S32.

Next, an operation of the processor 40 will be described. The processor 40 is configured to generate the first detection value based on the first detection signals S11 and S12. The first detection value is a detection value corresponding to the component of the target magnetic field in the direction parallel to the U direction. The first detection value will hereinafter be represented by the symbol Su.

In the present example embodiment, the processor 40 generates the first detection value Su by an arithmetic including obtainment of a difference S11−S12 between the first detection signal S11 and the first detection signal S12. The first detection value Su may be the difference S11−S12 itself. The first detection value Su may be a result of predetermined corrections, such as gain adjustment and offset adjustment, made on the difference S11−S12.

The processor 40 is further configured to generate the second and third detection values based on the second detection signals S21 and S22 and the third detection signals S31 and S32. The second detection value is a detection value corresponding to the component of the target magnetic field in the direction parallel to the V direction. The third detection value is a detection value corresponding to the component of the target magnetic field in the direction parallel to the Z direction. Hereinafter, the second detection value is represented by a symbol Sv, and the third detection value is represented by a symbol Sz.

The processor 40 generates the second and third detection values Sv and Sz as follows, for example. First, the processor 40 generates a value S1 by an arithmetic including obtainment of the difference S21-S22 between the second detection signal S21 and the second detection signal S22, and generates a value S2 by an arithmetic including obtainment of the difference S31-S32 between the third detection signal S31 and the third detection signal S32. Next, the processor 40 calculates values S3 and S4 using the following expressions (1) and (2).

$$S3=(S2+S1)/(2 \cos \alpha) \quad (1)$$

$$S4=(S2-S1)/(2 \sin \alpha) \quad (2)$$

The second detection value Sv may be the value S3 itself, or may be a result of predetermined corrections, such as a gain adjustment and an offset adjustment, made to the value S3. In the same manner, the third detection value Sz may be the value S4 itself, or may be a result of predetermined corrections, such as a gain adjustment and an offset adjustment, made to the value S4.

Figure 16:
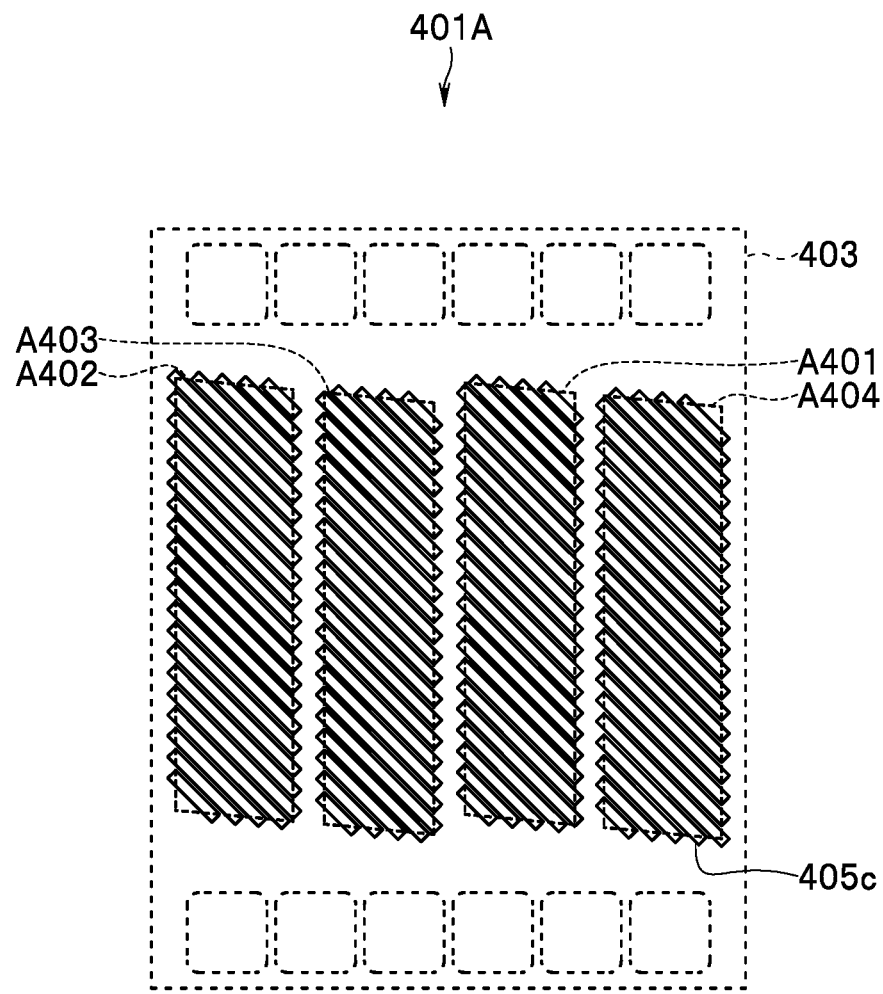
FIG. 16 is a plan view showing a plurality of protruding surfaces of a magnetic sensor of a first comparative example.
Figure 16:
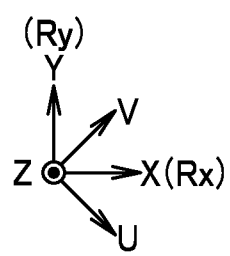

Next, effects of the magnetic sensor 1 according to the present example embodiment will be described in comparison with magnetic sensors of first to fourth comparative examples. First, a magnetic sensor 401A of the first comparative example will be described. FIG. 16 is a plan view showing a plurality of protruding surfaces of the magnetic sensor 401A of the first comparative example. The magnetic sensor 401A of the first comparative example is configured using a chip 403 of the comparative example instead of the second chip 3 of the present example embodiment. The chip 403 of the comparative example includes an insulating layer of the comparative example having a plurality of protruding surfaces 405c, instead of the insulating layer 305 of the present example embodiment. The other configurations of the chip 403 of the comparative example are similar to the configurations of the second chip 3.

The chip 403 of the comparative example includes an element layout area corresponding to the element layout area A0 of the present example embodiment. The element layout area of the chip 403 of the comparative example includes a first area A401, a second area A402, a third area A403, and a fourth area A404 respectively corresponding to the first area A1, the second area A2, the third area A3, and the fourth area A4 of the present example embodiment. The arrangement of the first to fourth areas A401 to A404 is similar to the arrangement of the first to fourth areas A1 to A4.

The shape of each of the plurality of protruding surfaces 405c is basically the same as the shape of each of the plurality of protruding surfaces 305c. However, each of the plurality of protruding surfaces 405c extends across only one of the first to fourth areas A401 to A404, and does not extend across two or more areas of the first to fourth areas A401 to A404.

Each protruding surface 405c includes a first end portion and a second end portion located at both ends of the protruding surface 405c in the longitudinal direction. A plurality of first end portions and a plurality of second end portions are present between two adjoining areas of the first to fourth areas A401 to A404.

The plurality of MR elements 50 are formed on the plurality of protruding surfaces 405c. To form the MR elements 50 with high accuracy, it is necessary to form the plurality of protruding surfaces 405c with high accuracy. The plurality of protruding surfaces 405c are formed by etching an insulating layer of the comparative example, for example.

Now, focus is placed on a space between two adjoining areas of the first to fourth areas A401 to A404. In the space, the plurality of first end portions and the plurality of second end portions face each other. If a gap between the plurality of first end portions and the plurality of second end portions is small, it would be difficult to form the plurality of protruding surfaces 405c with high accuracy. Therefore, it is necessary to increase the gap between the plurality of first end portions and the plurality of second end portions, that is, the gap between the two areas to some extent. If a comparison is made by setting the area of each of the first to fourth areas A401 to A404 equal, the element layout area of the chip 403 of the comparative example becomes larger as the gap between the two areas increases. Consequently, the area of the chip 403 of the comparative example when seen in the Z direction also becomes larger.

In contrast, in the present example embodiment, most of the plurality of protruding surfaces 305c each extend across at least two of the first to fourth areas A1 to A4. The first end portion and the second end portion of each of the plurality of protruding surfaces 305c are not present between two adjoining areas of the first to fourth areas A1 to A4. Thereby according to the present example embodiment, it is possible to reduce the gap between the two areas and thus reduce the area of the element layout area A0 as well as the area of the second chip 3 when seen in the Z direction. Consequently, according to the present example embodiment, the size of the magnetic sensor 1 can be reduced. In addition, reducing the size of the magnetic sensor 1 can also reduce the size of the magnetic sensor device 100.

Figure 17:
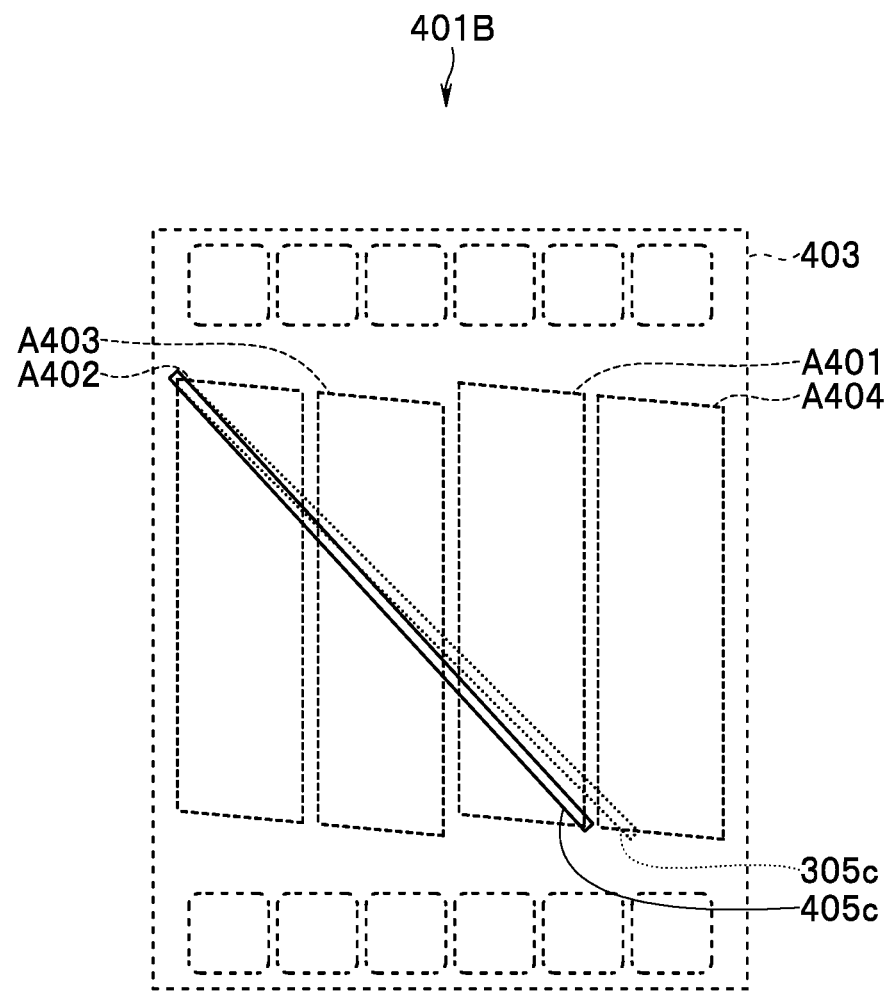
FIG. 17 is a plan view showing one protruding surface of a magnetic sensor of a second comparative example.

Next, a magnetic sensor 401B of the second comparative example will be described. FIG. 17 is a plan view showing one protruding surface of the magnetic sensor 401B of the second comparative example.

The configuration of the magnetic sensor 401B of the second comparative example differs from the configuration of the magnetic sensor 401A of the first comparative example in the following point. In the second comparative example, each of the plurality of protruding surfaces 405c extends in a direction parallel to one direction between the U direction and the −Y direction.

The first area A401 has a shape identical or similar to the shape of the first area A1 of the present example embodiment. The first area A401 includes a first end edge, a second end edge, a third end edge, and a fourth end edge respectively corresponding to the first end edge A1a, the second end edge A1b, the third end edge A1c, and the fourth end edge A1d of the present example embodiment. Herein, the angle that the protruding surface 405c forms with respect to the first end edge of the first area A401 is referred to as a first angle, and the angle that the protruding surface 405c forms with respect to the fourth end edge of the first area A401 is referred to as a second angle. The definitions of the first and second angles are respectively similar to the definitions of the angles θ1 and θ2 shown in FIG. 14. In the second comparative example, the first angle is smaller than the second angle. In particular, in the second comparative example, the first angle is smaller than 45°.

FIG. 17 shows one protruding surface 305c of the present example embodiment in addition to one protruding surface 405c of the second comparative example. The one protruding surface 305c passes through a corner portion formed by the first end edge A2a and the fourth end edge A2d of the second area A2 crossing each other (see FIG. 12), and extends across the first to fourth areas A1 to A4. The one protruding surface 405c passes through a position corresponding to the foregoing corner portion.

The protruding surface 405c shown in FIG. 17 extends across the first to third areas A401 to A403, but does not extend across the fourth area A404. In other words, in the second comparative example, the number of protruding surfaces 405c extending across a plurality of areas including the fourth area A404 is small in comparison with the present example embodiment. Instead, in the second comparative example, the number of protruding surfaces 405c extending across only the fourth area A404 is large.

To form the MR elements 50 with high accuracy, it is necessary to increase gaps between the MR elements 50 and the first end portions or the second end portions of the protruding surfaces 405c to some extent. Therefore, if a comparison is made by setting the number of the MR elements 50 equal, in order to reduce the size of the chip 403 while forming the MR elements 50 with high accuracy, it is necessary to reduce the number of the first end portions and the second end portions of the protruding surfaces 405c, that is, the number of the protruding surfaces 405c. However, in the second comparative example, since the number of the protruding surfaces 405c extending across only the fourth area A404 is large as described above, the area of the fourth area A404 is large, resulting in an increased area of the chip 403 when seen in the Z direction.

In contrast, in the present example embodiment, the number of the protruding surfaces 305c extending across only the fourth area A4 can be reduced in comparison with the second comparative example. Thereby, according to the present example embodiment, the area of the fourth area A4 as well as the area of the second chip 3 when seen in the Z direction can be reduced. Consequently, according to the present example embodiment, the size of the magnetic sensor 1 can be reduced.

Figure 18:
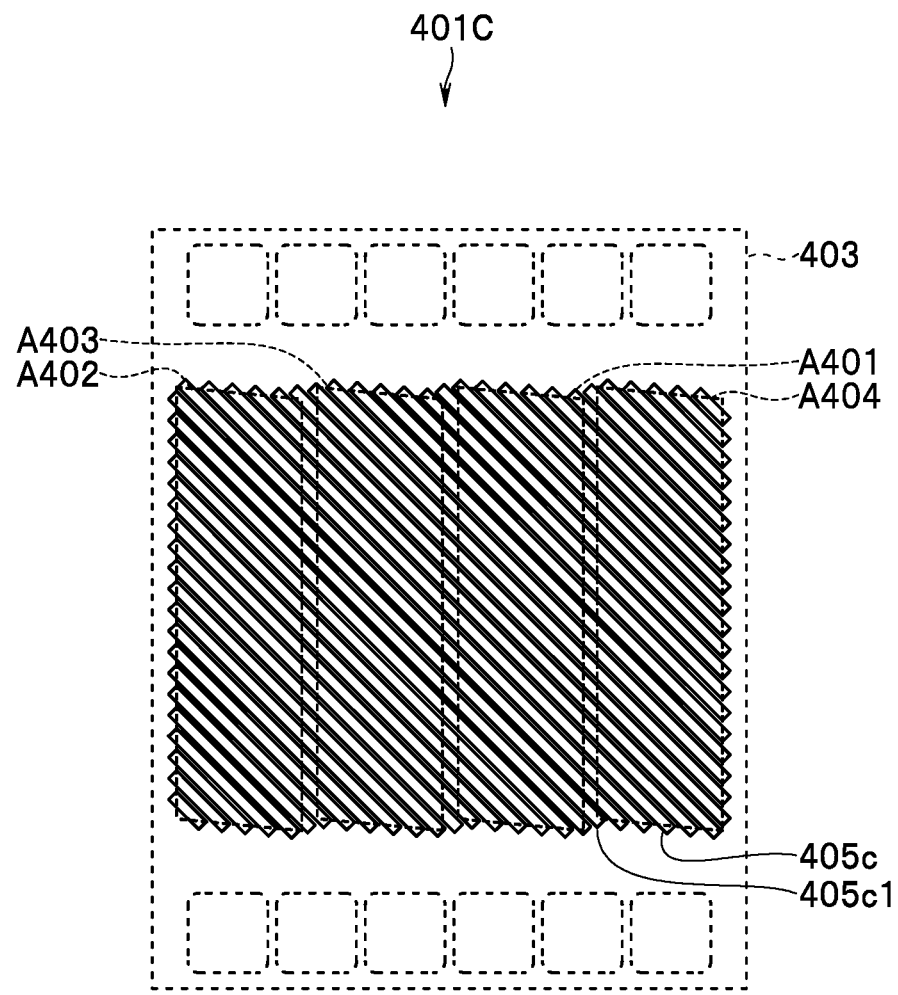
FIG. 18 is a plan view showing a plurality of protruding surfaces of a magnetic sensor of a third comparative example.

Next, a magnetic sensor 401C of the third comparative example will be described. FIG. 18 is a plan view showing the plurality of protruding surfaces 405c of the magnetic sensor 401C of the third comparative example.

The configuration of the magnetic sensor 401C of the third comparative example differs from the configuration of the magnetic sensor 401A of the first comparative example in the following point. In the third comparative example, the center of gravity of the first area A401 when seen in the Z direction, the center of gravity of the second area A402 when seen in the Z direction, the center of gravity of the third area A403 when seen in the Z direction, and the center of gravity of the fourth area A404 when seen in the Z direction are located at the same position in the second reference direction Ry.

Now, focus is placed on a specific protruding surface 405c1 denoted by the reference numeral 405c1 in FIG. 18. The specific protruding surface 405c1 includes first and second inclined surfaces corresponding to the first and second inclined surfaces 305a and 305b of the present example embodiment. The specific protruding surface 405c1 extends across the first to fourth areas A401 to A404. The first inclined surface that is an inclined surface of the specific protruding surface 405c1 on the side of the V direction is present in each of the first to fourth areas A401 to A404. Meanwhile, the second inclined surface that is an inclined surface of the specific protruding surface 405c1 on the side of the −V direction is present in each of the first to third areas A401 to A403, but is not present in the fourth area A404. In such a case, in the fourth area A404, the third MR elements 50C cannot be formed on the second inclined surface of the specific protruding surface 405c1.

As described above, in the third comparative example, there may exist a protruding surface 405c on which the MR elements 50 cannot be formed. In contrast, in the present example embodiment, the centers of gravity of two specific areas of the first to fourth areas A1 to A4 are displaced along the second reference direction Ry. For example, in a case where a specific area includes one of the first and second inclined surfaces 305a and 305b, displacing the specific area so as to include both the first and second inclined surfaces 305a and 305b can increase the number of the first inclined surfaces 305a or the second inclined surfaces 305b extending across the plurality of areas. Meanwhile, in a case where a specific area includes one of the first and second inclined surfaces 305a and 305b, displacing the specific area so as not to include either of the first and second inclined surfaces 305a and 305b can reduce the area of the protruding surface 305c that is included in the specific areas and on which the MR elements 50 cannot be formed. Thereby the plurality of MR elements 50 in the specific areas can be formed with high accuracy.

Figure 19:
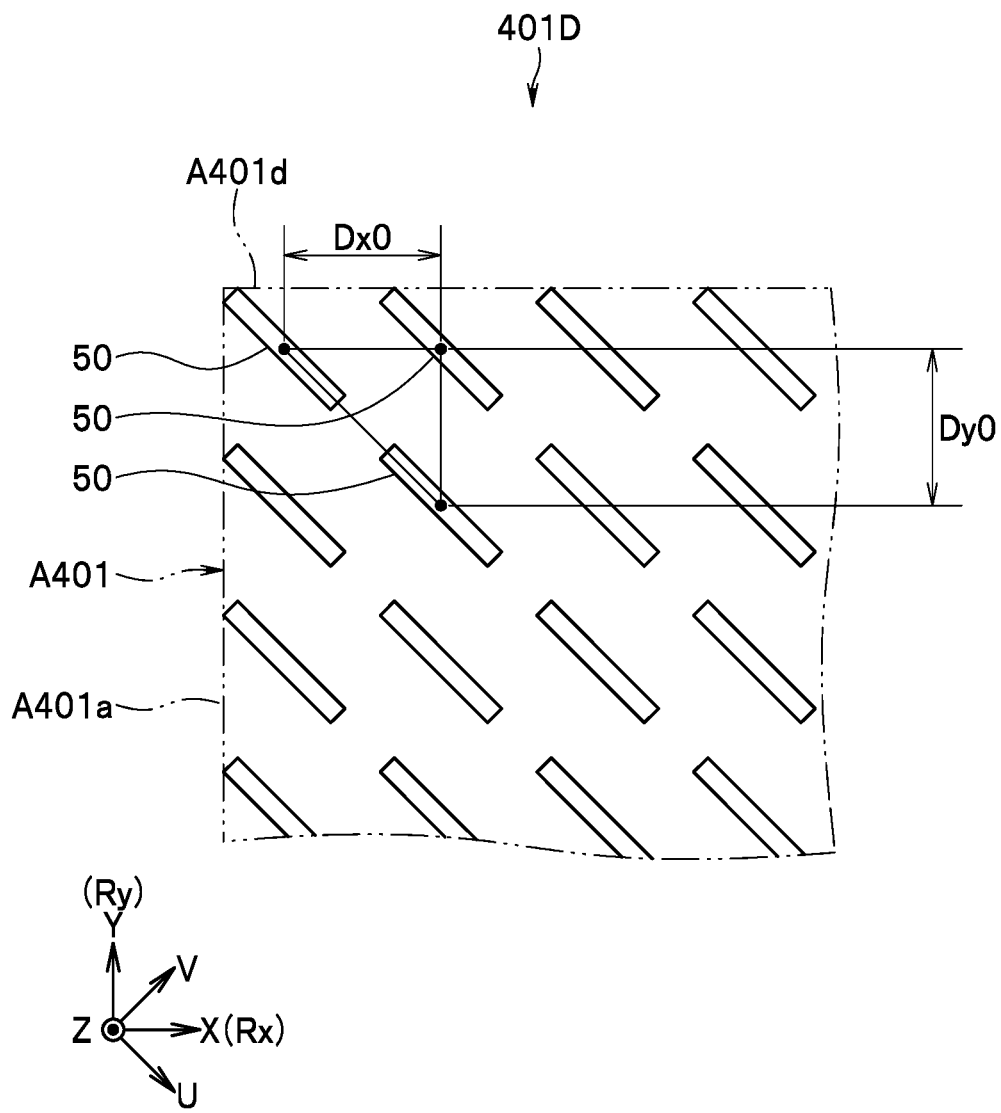
FIG. 19 is an explanatory view showing a plurality of magnetoresistive elements in a part of a first area of a magnetic sensor of a fourth comparative example.

Next, a magnetic sensor 401D of the fourth comparative example will be described. FIG. 19 is a plan view showing a part of the first area A401 of the magnetic sensor 401D of the fourth comparative example.

The configuration of the magnetic sensor 401C of the fourth comparative example differs from the configuration of the magnetic sensor 401A of the first comparative example in the following point. In the fourth comparative example, the plurality of MR elements 50 in the first area A401 are disposed such that two or more MR elements 50 are arranged in a row along the second reference direction Ry, and also two or more MR elements 50 are arranged in a row along the first reference direction Rx.

Herein, a gap in the first reference direction Rx between two MR elements 50 adjoining in the direction parallel to the longitudinal direction of each of the MR elements 50, that is, the direction parallel to the U direction is represented by the symbol Dx0 as in FIG. 15. A gap in the second reference direction Ry between two MR elements 50 adjoining in the direction parallel to the U direction is represented by the symbol Dy0. In the fourth comparative example, a gap between two MR elements 50 adjoining in the second reference direction Ry is equal to the gap Dy0.

In contrast, in the present example embodiment, as described with reference to FIG. 15, the gap Dy1 between two MR elements 50 adjoining in the second reference direction Ry is smaller than the gap Dy0. If a comparison is made by setting the number of MR elements present in the first area A1 equal, in a case where the gap Dy1 is smaller than the gap Dy0 as in the present example embodiment, the size of the first area A1 can be reduced more in comparison with a case where the gap Dy1 is equal to the gap Dy0.

The foregoing description of the first area A1 also applies to the second to fourth areas A2 to A4. Thus, according to the present example embodiment, the area of the element layout area A0 as well as the area of the second chip 3 when seen in the Z direction can be reduced. Consequently, according to the present example embodiment, the size of the magnetic sensor 1 can be reduced.

Note that in FIG. 19, a first end edge of the first area A401 is denoted by the reference numeral A401a, and a fourth end edge of the first area A401 is denoted by the reference numeral A401d. In the fourth comparative example, the fourth end edge A401d extends in a direction parallel to the first reference direction Rx. Although not shown, in the fourth comparative example, a third end edge of the first area A401 also extends in the direction parallel to the first reference direction Rx.

The foregoing description of the first area A401 also applies to the second to fourth areas A402 to A404.

Modification Examples

Figure 20:
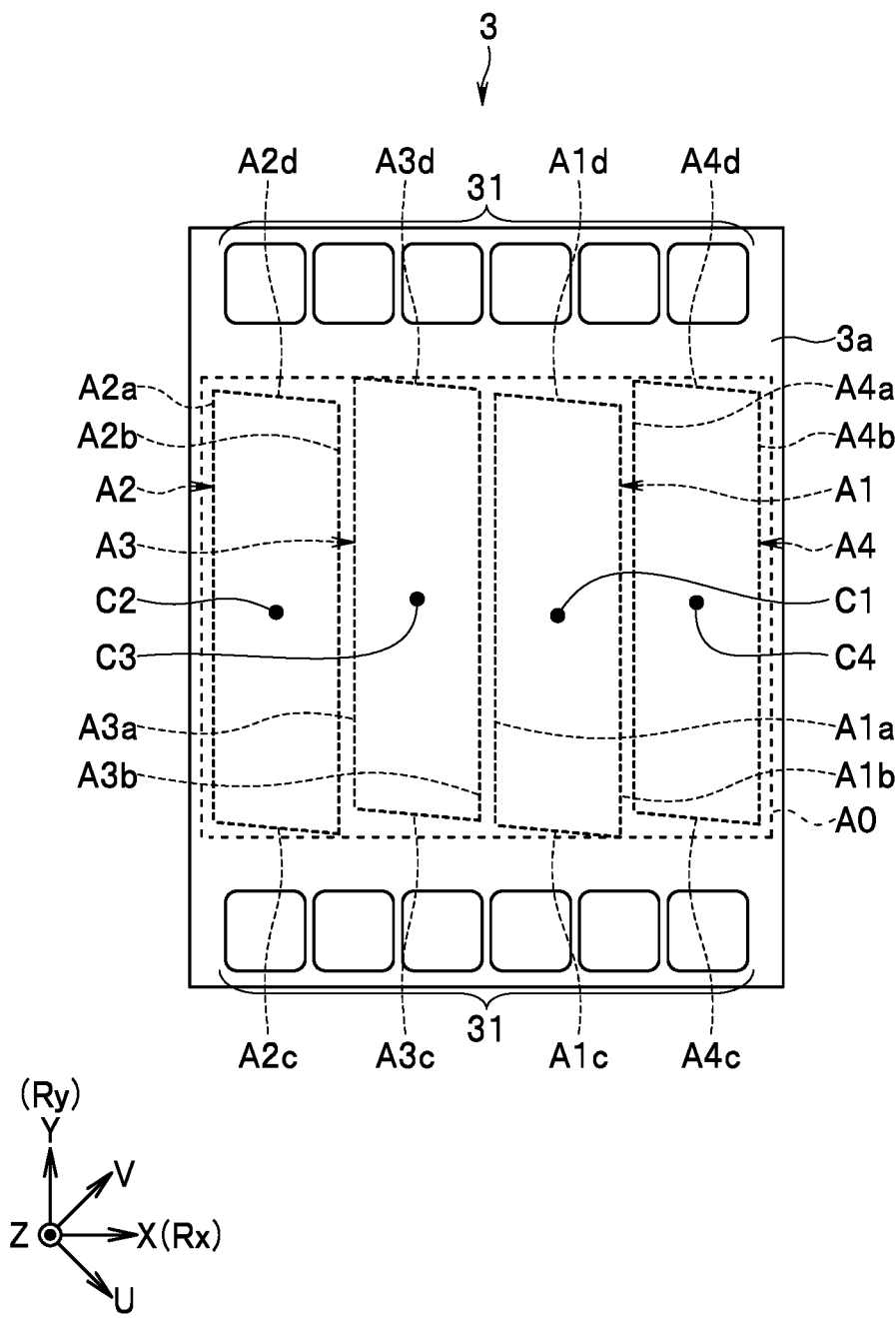
FIG. 20 is a plan view showing an element layout area of a first modification example of the magnetic sensor according to the first example embodiment of the technology.

Next, first and second modification examples of the magnetic sensor 1 according to the present example embodiment will be described. First, the first modification example will be described with reference to FIG. 20. FIG. 20 is a plan view showing the first to fourth areas A1 to A4 of the first modification example. In the first modification example, the position of the center of gravity C4 of the fourth area A4 in the second reference direction Ry is located forward in the Y direction with respect to the position of the center of gravity C1 of the first area A1 in the second reference direction Ry. The position of the center of gravity C3 of the third area A3 in the second reference direction Ry is located forward in the Y direction with respect to the position of the center of gravity C2 of the second area A2 in the second reference direction Ry.

Figure 21:
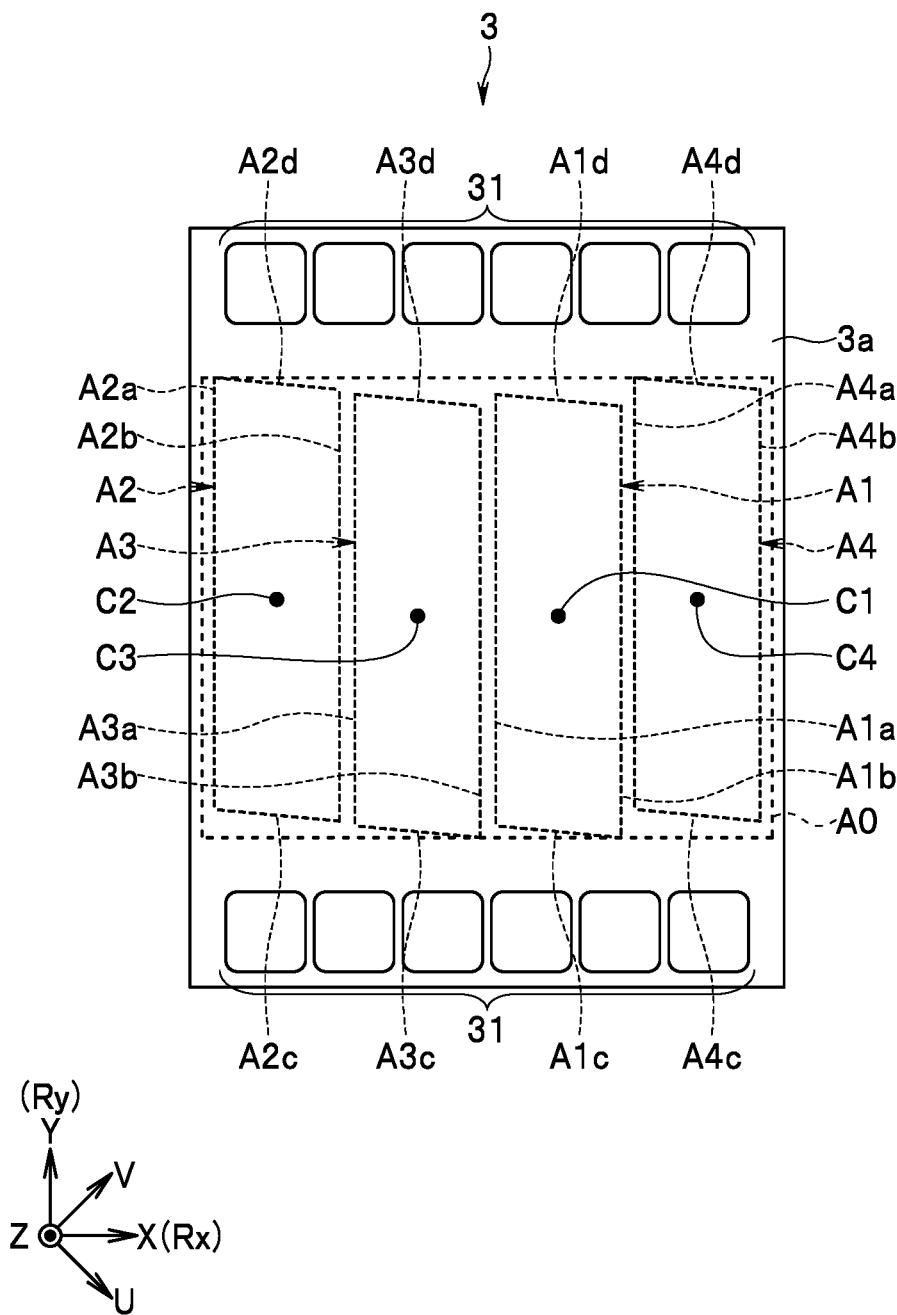
FIG. 21 is a plan view showing an element layout area of a second modification example of the magnetic sensor according to the first example embodiment of the technology.

Next, the second modification example will be described with reference to FIG. 21. FIG. 21 is a plan view showing the first to fourth areas A1 to A4 of the second modification example. In the second modification example, the position of the center of gravity C4 of the fourth area A4 in the second reference direction Ry is located forward in the Y direction with respect to the position of the center of gravity C1 of the first area A1 in the second reference direction Ry. The position of the center of gravity C3 of the third area A3 in the second reference direction Ry is located forward in the −Y direction with respect to the position of the center of gravity C2 of the second area A2 in the second reference direction Ry. In the second modification example, the direction in which the third area A3 is displaced from the second area A2 is opposite to the direction in which the fourth area A4 is displaced from the first area A1.

In the second modification example, the position of the center of gravity C2 of the second area A2 in the second reference direction Ry may be, but need not be, the same as the position of the center of gravity C4 of the fourth area A4 in the second reference direction Ry. The position of the center of gravity C3 of the third area A3 in the second reference direction Ry may be, but need not be, the same as the position of the center of gravity C1 of the first area A1 in the second reference direction Ry.

Second Example Embodiment

Figure 22:
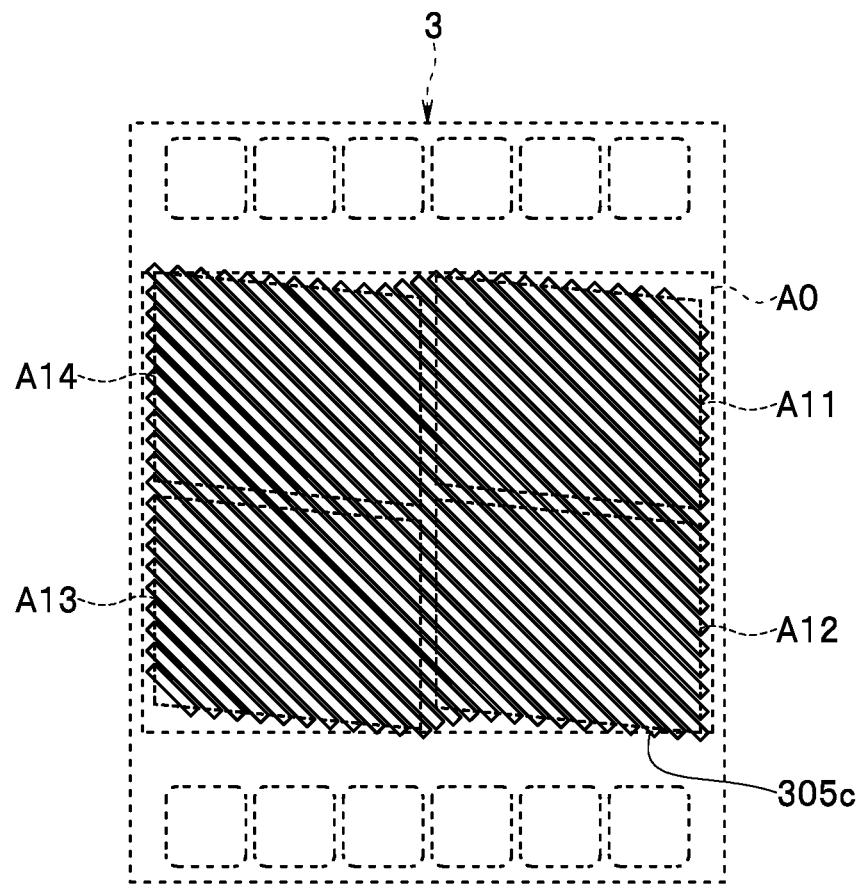
FIG. 22 is a plan view showing a plurality of protruding surfaces of a second example embodiment of the technology.
Figure 22:
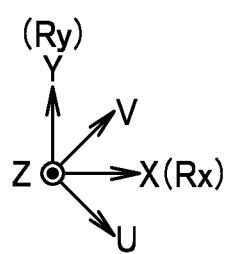

A second example embodiment of the technology will now be described with reference to FIG. 22. FIG. 22 is a plan view showing the plurality of protruding surfaces 305c of the present example embodiment. In the present example embodiment, the element layout area A0 of the second chip 3 includes a first area A11, a second area A12, a third area A13, and a fourth area A14 instead of the first to fourth areas A1 to A4 of the first example embodiment.

The first area A11 is an area corresponding to the first resistor section R21 of the second detection circuit 20 (see FIG. 5) and the first resistor section R31 of the third detection circuit 30 (see FIG. 6). The second area A12 is an area corresponding to the second resistor section R22 of the second detection circuit 20 (see FIG. 5) and the second resistor section R32 of the third detection circuit 30 (see FIG. 6). The third area A13 is an area corresponding to the third resistor section R23 of the second detection circuit 20 (see FIG. 5) and the third resistor section R33 of the third detection circuit 30 (see FIG. 6). The fourth area A14 is an area corresponding to the fourth resistor section R24 of the second detection circuit 20 (see FIG. 5) and the fourth resistor section R34 of the third detection circuit 30 (see FIG. 6).

In the present example embodiment, the plurality of second MR elements 50B of the second detection circuit 20 are disposed dividedly in the first to fourth areas A11 to A14. The plurality of third MR elements 50C of the third detection circuit 30 are disposed dividedly in the first to fourth areas A11 to A14.

The first and fourth areas A11 and A14 are disposed so as to be arranged along the first reference direction Rx. The first area A11 is located near an end edge of the element layout area A0 on the side of the X direction. The fourth area A14 is located near an end edge of the element layout area A0 on the side of the −X direction. The second and third areas A12 and A13 are respectively disposed forward in the −Y direction with respect to the first and fourth areas A11 and A14.

Each of the first to fourth areas A11 to A14 includes a first end edge and a second end edge located at both ends in the first reference direction Rx, and a third end edge and a fourth end edge located at both ends in the second reference direction Ry. The first to fourth end edges of each of the first to fourth areas A11 to A14 may have features similar to the features of the first to fourth end edges A1a to A1d of the first area A1 of the first example embodiment except the length of each of the first to fourth end edges.

The plurality of protruding surfaces 305c include protruding surfaces 305c each extending across only the first area A11, and protruding surfaces 305c each extending across only the third area A13. The plurality of protruding surfaces 305c further include protruding surfaces 305c each extending across the first and second areas A11 and A12 but not extending across the third and fourth areas A13 and A14, protruding surfaces 305c each extending across the second and fourth areas A12 and A14 but not extending across the first and third areas A11 and A13, and protruding surfaces 305c each extending across the third and fourth areas A13 and A14 but not extending across the first and second areas A11 and A12. The plurality of protruding surfaces 305c further include protruding surfaces 305c each extending across the first, second, and fourth areas A11, A12, and A14 but not extending across the third area A13, and protruding surfaces 305c each extending across the second to fourth areas A12 to A14 but not extending across the first area A11.

The first end portion and the second end portion of each of the plurality of protruding surfaces 305c are not present in the inside of each of the first to fourth areas A11 to A14 or between two adjoining areas of the first to fourth areas A11 to A14.

The configuration, operation, and effects of the present example embodiment are otherwise the same as those of the first example embodiment.

Third Example Embodiment

Figure 23:
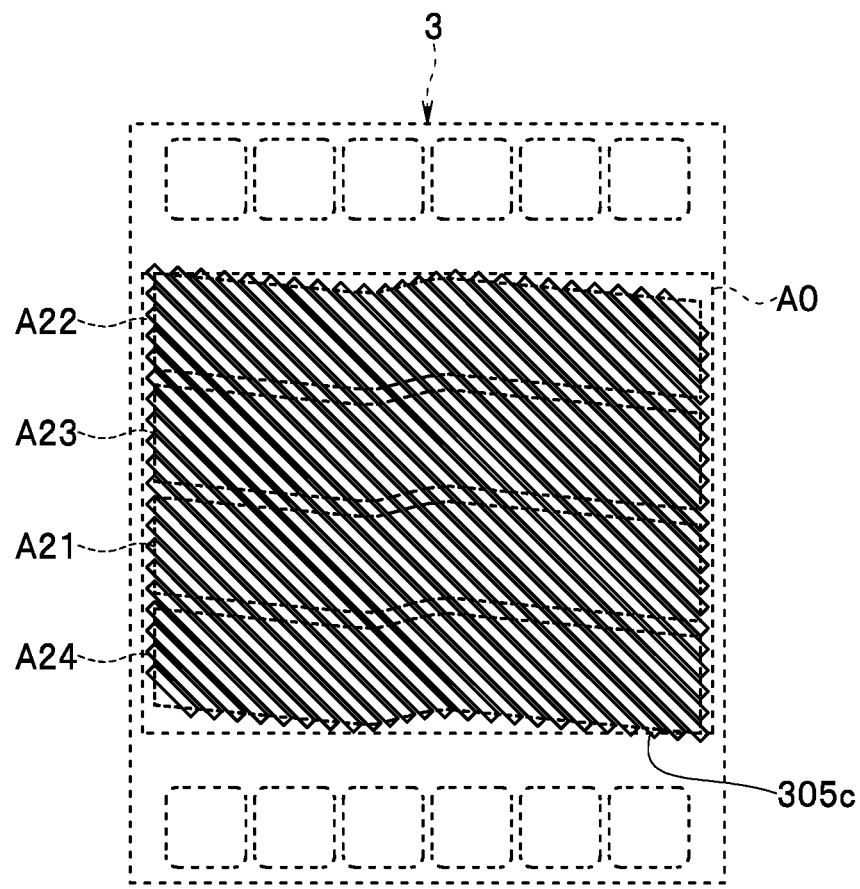
FIG. 23 is a plan view showing a plurality of protruding surfaces of a third example embodiment of the technology.
Figure 23:
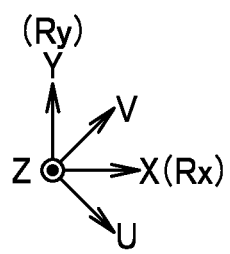

A third example embodiment of the technology will now be described with reference to FIG. 23. FIG. 23 is a plan view showing the plurality of protruding surfaces 305c of the present example embodiment. In the present example embodiment, the element layout area A0 of the second chip 3 includes a first area A21, a second area A22, a third area A23, and a fourth area A24 instead of the first to fourth areas A1 to A4 of the first example embodiment.

The first area A21 is an area corresponding to the first resistor section R21 of the second detection circuit 20 (see FIG. 5) and the first resistor section R31 of the third detection circuit 30 (see FIG. 6). The second area A22 is an area corresponding to the second resistor section R22 of the second detection circuit 20 (see FIG. 5) and the second resistor section R32 of the third detection circuit 30 (see FIG. 6). The third area A23 is an area corresponding to the third resistor section R23 of the second detection circuit 20 (see FIG. 5) and the third resistor section R33 of the third detection circuit 30 (see FIG. 6). The fourth area A24 is an area corresponding to the fourth resistor section R24 of the second detection circuit 20 (see FIG. 5) and the fourth resistor section R34 of the third detection circuit 30 (see FIG. 6).

In the present example embodiment, the plurality of second MR elements 50B of the second detection circuit 20 are disposed dividedly in the first to fourth areas A21 to A24.

The plurality of third MR elements 50C of the third detection circuit 30 are disposed dividedly in the first to fourth areas A21 to A24.

The first to fourth areas A21 to A24 are disposed so as to be arranged along the second reference direction Ry. In the example shown in FIG. 23, the first to fourth areas A21 to A24 are arranged such that the areas A22, A23, A21, and A24 are arranged in this order in a direction from an end edge of the element layout area A0 on the side of the Y direction to an end edge of the element layout area A0 on the side of the −Y direction. However, in the technology, the arrangement order of the first to fourth areas A21 to A24 is not limited to this example.

Each of the first to fourth areas A21 to A24 includes a first end edge and a second end edge located at both ends in the first reference direction Rx, and a third end edge and a fourth end edge located at both ends in the second reference direction Ry. The first and second end edges of each of the first to fourth areas A21 to A24 may have features similar to the features of the first and second end edges A1a and A1b of the first area A1 of the first example embodiment except the length of each of the first and second end edges.

As shown in FIG. 23, a part of the third end edge and a part of the fourth end edge of each of the first to fourth areas A21 to A24 may have features similar to the features of the third and fourth end edges A3a and A4b of the first area A1 of the first example embodiment except the length of each of the third and fourth end edges. Alternatively, although not shown, the entire third end edge and the entire fourth end edge of each of the first to fourth areas A21 to A24 may have features similar to the features of the third and fourth end edges A3a and A4b of the first area A1 of the first example embodiment except the length of each of the third and fourth end edges.

The center of gravity of the first area A21 when seen in the Z direction, the center of gravity of the second area A22 when seen in the Z direction, the center of gravity of the third area A23 when seen in the Z direction, and the center of gravity of the fourth area A24 when seen in the Z direction may be located at the same position in the first reference direction Rx.

The plurality of protruding surfaces 305c include protruding surfaces 305c each extending across only the second area A22, and protruding surfaces 305c each extending across only the fourth area A24. The plurality of protruding surfaces 305c further include protruding surfaces 305c each extending across the second and third areas A22 and A23 but not extending across the first and fourth areas A21 and A24, and protruding surfaces 305c each extending across the first and fourth areas A21 and A24 but not extending across the second and third areas A22 and A23. The plurality of protruding surfaces 305c further include protruding surfaces 305c each extending across the first to third areas A21 to A23 but not extending across the fourth area A24, and protruding surfaces 305c each extending across the first, third, and fourth areas A21, A22, and A23 but not extending across the second area A22. The plurality of protruding surfaces 305c further include protruding surfaces 305c each extending across the first to fourth areas A21 to A24.

The first end portion and the second end portion of each of the plurality of protruding surfaces 305c are not present in the inside of each of the first to fourth areas A21 to A24 or between two adjoining areas of the first to fourth areas A21 to A24.

The configuration, operation and effects of the present example embodiment are otherwise the same as those of the first example embodiment.

Fourth Example Embodiment

A fourth example embodiment of the technology will now be described. The magnetic sensor device 100 of the present example embodiment includes a magnetic sensor 101 according to the present example embodiment and the processor 40 described in the first example embodiment. The magnetic sensor 101 may have an external shape similar to the external shape of the first chip 2 or the second chip 3 of the first example embodiment.

Figure 24:
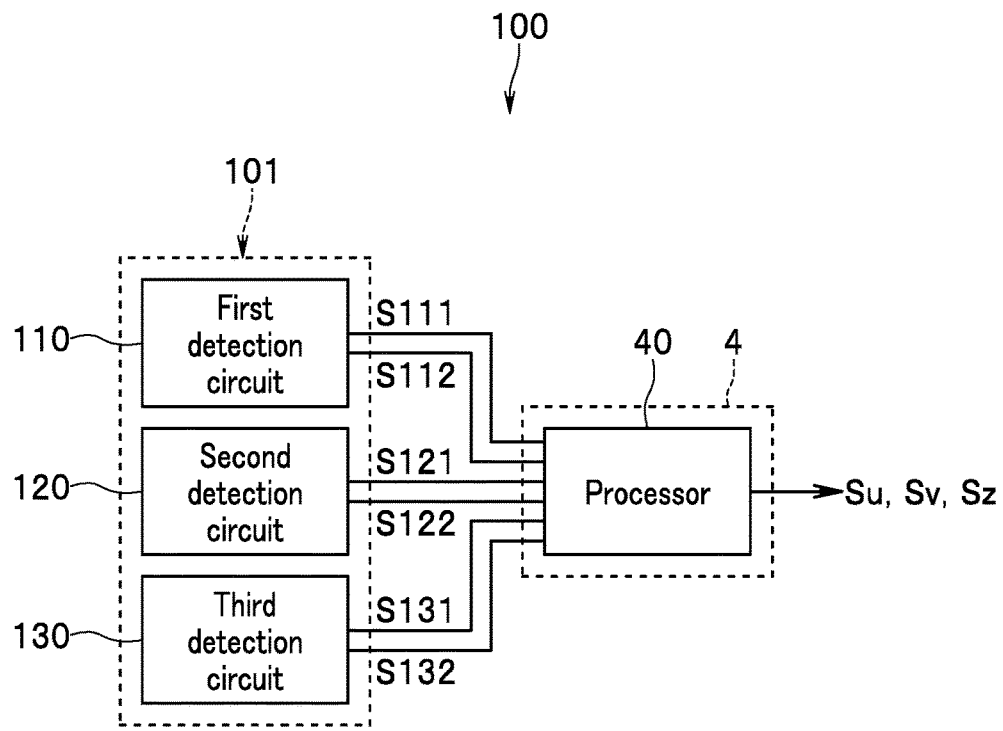
FIG. 24 is a functional block diagram showing a configuration of a magnetic sensor device including a magnetic sensor according to a fourth example embodiment of the technology.
Figure 25:
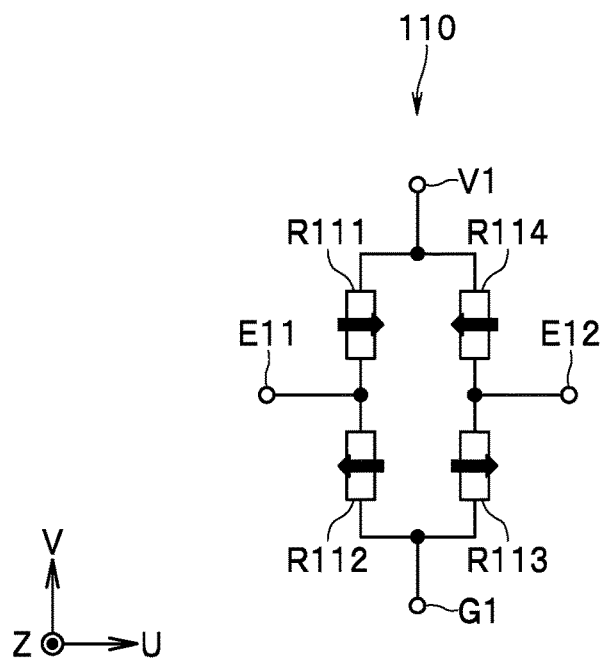
FIG. 25 is a circuit diagram showing a circuit configuration of a first detection circuit of the fourth example embodiment of the technology.
Figure 26:
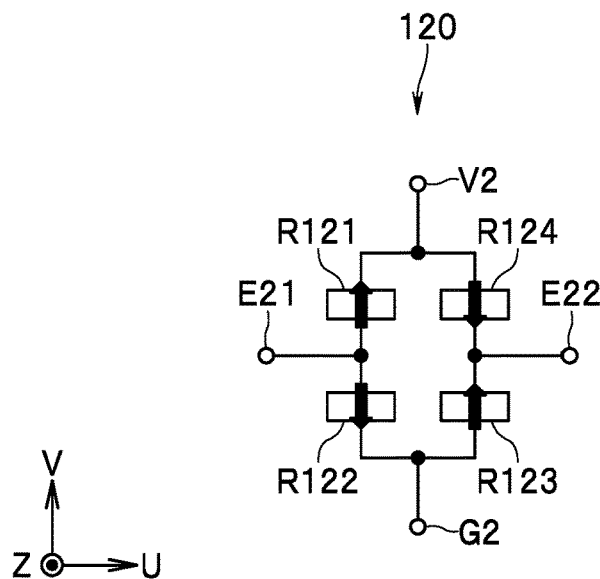
FIG. 26 is a circuit diagram showing a circuit configuration of a second detection circuit of the fourth example embodiment of the technology.
Figure 27:
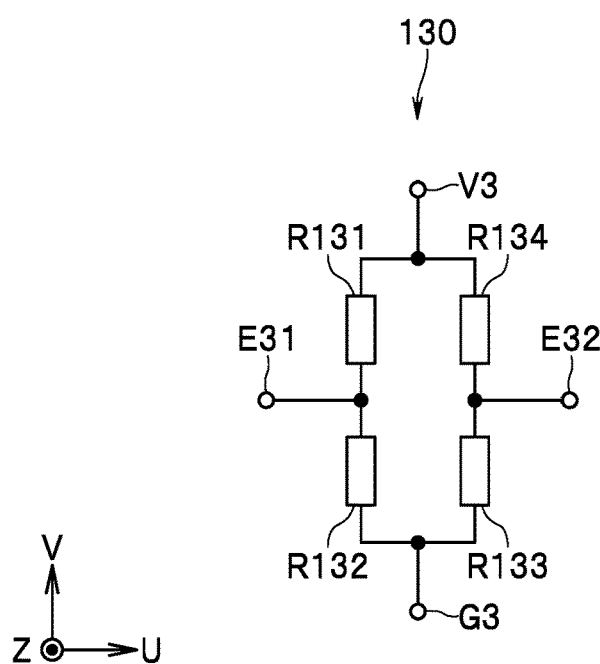
FIG. 27 is a circuit diagram showing a circuit configuration of a third detection circuit of the fourth example embodiment of the technology.

Hereinafter, a configuration of the magnetic sensor 101 according to the present example embodiment will be described with reference to FIGS. 24 to 27. FIG. 24 is a functional block diagram showing a configuration of the magnetic sensor device 100 of the present example embodiment. FIG. 25 is a circuit diagram showing a circuit configuration of a first detection circuit of the present example embodiment. FIG. 26 is a circuit diagram showing a circuit configuration of a second detection circuit of the present example embodiment. FIG. 27 is a circuit diagram showing a circuit configuration of a third detection circuit of the present example embodiment.

The magnetic sensor 101 includes a first detection circuit 110, a second detection circuit 120, and a third detection circuit 130. Each of the first to third detection circuits 110, 120, and 130 includes a plurality of MR elements.

The first detection circuit 110 is configured to detect a component of a target magnetic field in a direction parallel to the U direction and generate first detection signals S111 and S112 each having a correspondence with the component. The second detection circuit 120 is configured to detect a component of the target magnetic field in a direction parallel to the V direction and generate second detection signals S121 and S122 each having a correspondence with the component. The third detection circuit 130 is configured to detect a component of the target magnetic field in a direction parallel to the Z direction and generate third detection signals S131 and S132 each having a correspondence with the component.

The circuit configuration of the first detection circuit 110 is basically the same as the circuit configuration of the first detection circuit 10 of the first example embodiment. In FIG. 25, first to fourth resistor sections of the first detection circuit 110 corresponding to the first to fourth resistor sections R11, R12, R13, and R14 of the first detection circuit 10, respectively, are denoted by the reference numerals R111, R112, R113, and R114.

The circuit configuration of the second detection circuit 120 is basically the same as the circuit configuration of the second detection circuit 20 of the first example embodiment. In FIG. 26, first to fourth resistor sections of the second detection circuit 120 corresponding to the first to fourth resistor sections R21, R22, R23, and R24 of the second detection circuit 20, respectively, are denoted by the reference numerals R121, R122, R123, and R124.

The circuit configuration of the third detection circuit 130 is basically the same as the circuit configuration of the third detection circuit 30 of the first example embodiment. In FIG. 27, first to fourth resistor sections of the third detection circuit 130 corresponding to the first to fourth resistor sections R31, R32, R33, and R34 of the third detection circuit 30, respectively, are denoted by the reference numerals R131, R132, R133, and R134.

The resistor sections R111 to R114, R121 to R124, and R131 to R134 include a plurality of MR elements. The plurality of MR elements of the magnetic sensor 101 will hereinafter be represented by the reference numeral 150. The configurations of the MR elements 150 may be the same as the configurations of the MR elements 50 described in the first example embodiment. In other words, the MR elements 150 each include at least the magnetization pinned layer 52, the free layer 54 and the gap layer 53 (see FIG. 11).

In FIGS. 25 and 26, solid arrows represent the magnetization directions of the magnetization pinned layers 52 of the MR elements 150. In the example shown in FIG. 25, the magnetization directions of the magnetization pinned layers 52 in each of the first and third resistor sections R111 and R113 are the U direction. The magnetization directions of the magnetization pinned layers 52 in each of the second and fourth resistor sections R112 and R114 are the −U direction. The free layer 54 in each of the plurality of MR elements 150 of the first detection circuit 110 has a shape anisotropy that sets the direction of the magnetization easy axis to a direction parallel to the V direction.

In the example shown in FIG. 26, the magnetization directions of the magnetization pinned layers 52 in each of the first and third resistor sections R121 and R123 are the V direction. The magnetization directions of the magnetization pinned layers 52 in each of the second and fourth resistor sections R122 and R124 are the −V direction. The free layer 54 in each of the plurality of MR elements 150 of the second detection circuit 120 has a shape anisotropy that sets the direction of the magnetization easy axis to a direction parallel to the U direction.

The free layer 54 in each of the plurality of MR elements 150 of the third detection circuit 130 has a shape anisotropy that sets the direction of the magnetization easy axis to a direction parallel to the V direction. The magnetization direction of the magnetization pinned layer 52 in the third detection circuit 130 will be described later.

Next, a specific structure of the magnetic sensor 101 will be described. The magnetic sensor 101 includes a substrate 140 having a top surface 140a, a first portion including the first detection circuit 110, a second portion including the second detection circuit 120, and a third portion including the third detection circuit 130. The top surface 140a of the substrate 140 is parallel to the XY plane. The first to third portions are formed on the substrate 140. The structure of the first portion and the structure of the second portion are similar to the structure of the first chip 2 (excluding the substrate 201) described in the first example embodiment. Each of the plurality of MR elements 150 included in the first portion is long in the V direction. Each of the plurality of MR elements 150 included in the second portion is long in the U direction. Note that the first and second portions may, but need not, include the first coil 70 described in the first example embodiment.

Figure 28:
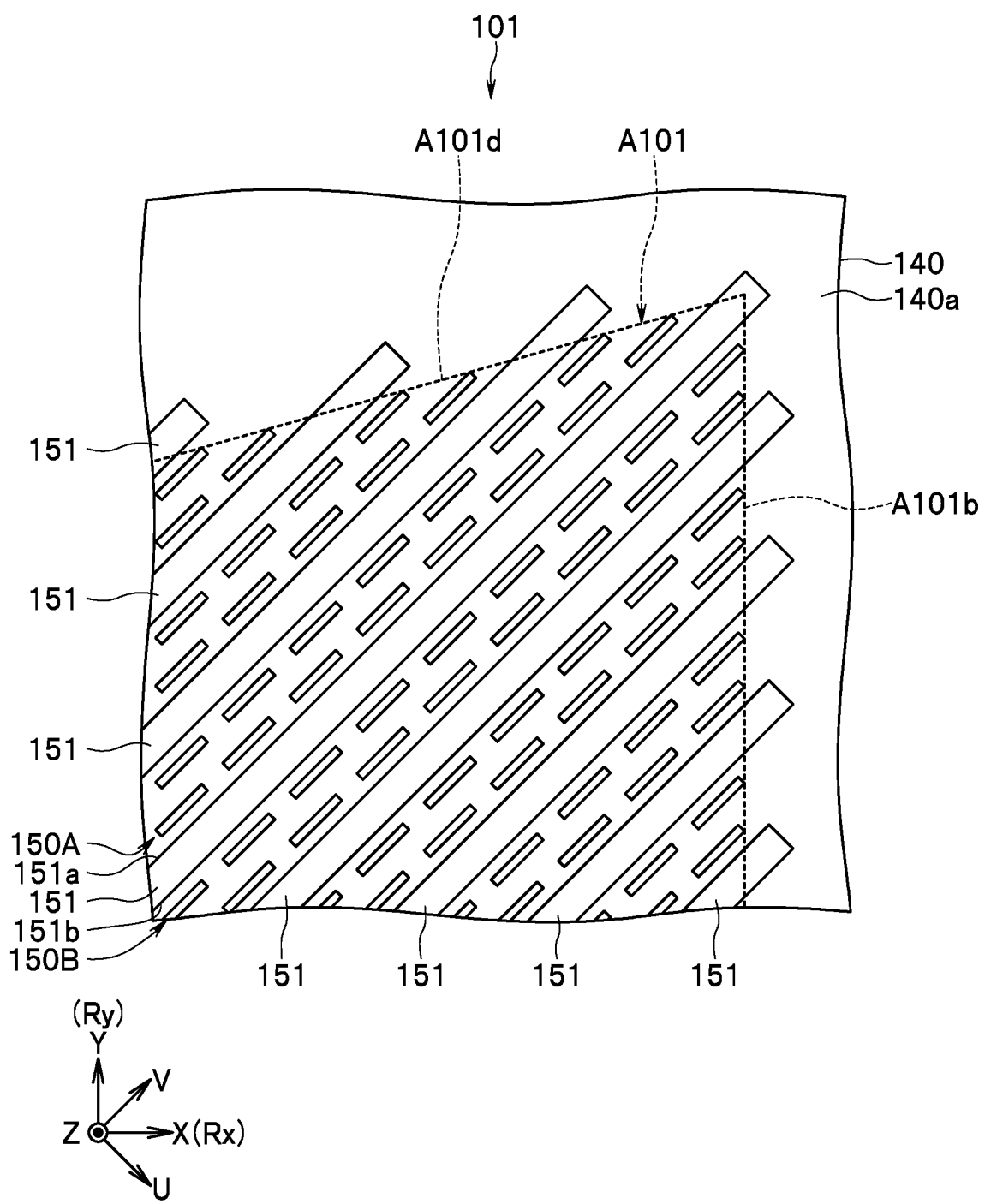
FIG. 28 is a plan view showing a part of the magnetic sensor according to the fourth example embodiment of the technology.
Figure 29:
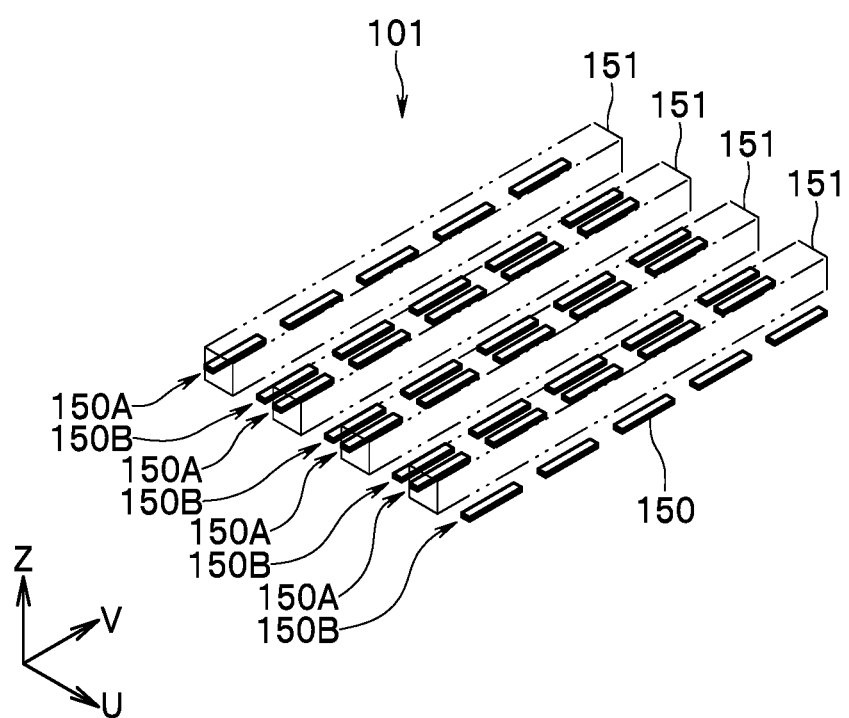
FIG. 29 is a perspective view showing a plurality of magnetoresistive elements and a plurality of yokes of the fourth example embodiment of the technology.
Figure 30:
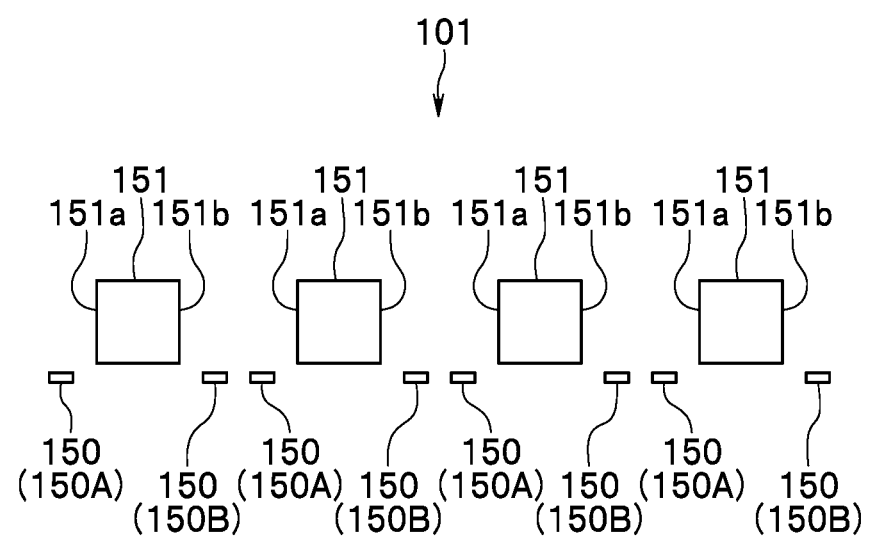
FIG. 30 is a side view showing the plurality of magnetoresistive elements and the plurality of yokes of the fourth example embodiment of the technology.
Figure 30:
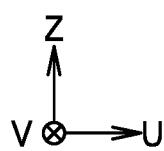

Next, the structure of the third portion of the magnetic sensor 101 will be described with reference to FIGS. 28 to 30. FIG. 28 is a plan view showing a part of the magnetic sensor 101. FIG. 29 is a perspective view showing a plurality of MR elements 150 and a plurality of yokes. FIG. 30 is a side view showing the plurality of MR elements 150 and the plurality of yokes.

The structure of the third portion is basically similar to the structure of the first portion. The third portion further includes a plurality of yokes 151 each made of a soft magnetic body. Note that FIG. 28 shows the substrate 140, the plurality of MR elements 150, and the plurality of yokes 151 among the components of the magnetic sensor 101.

Each of the yokes 151 may have a rectangular solid shape long in the V direction, for example. Each of the yokes 151 is configured to generate an output magnetic field when an input magnetic field including an input magnetic field component in the direction parallel to the Z direction is applied thereto. The output magnetic field includes an output magnetic field component that is in the direction parallel to the U direction and varies depending on the input magnetic field component.

Each of the yokes 151 has a first end face 151a and a second end face 151b located at both ends in the direction parallel to the U direction. The first end face 151a of each of the yokes 151 is located at the end of the yoke 151 in the −U direction, and the second end face 151b is located at the end of the yoke 151 in the U direction. The plurality of yokes 151 are arranged in the direction parallel to the U direction.

As shown in FIGS. 28 to 30, in the third portion, a plurality of MR elements 150 are arranged in a row along the first end face 151a, and a plurality of MR elements 150 are arranged in a row along the second end face 151b. Hereinafter, the plurality of MR elements 150 arranged along the first end face 151a are represented by the reference numeral 150A, and the plurality of MR elements 150 arranged along the second end face 151b are represented by the reference numeral 150B. In the third portion, the plurality of MR elements 150A and the plurality of MR elements 150B are arranged such that the rows of the MR elements 150A and the rows of the MR elements 150B are alternately arranged in the direction parallel to the U direction. The plurality of MR elements 150A and the plurality of MR elements 150B need not overlap the plurality of yokes 151 when seen from above.

Although not shown, the third portion further includes a plurality of first lower electrodes, a plurality of second lower electrodes, a plurality of first upper electrodes, and a plurality of second upper electrodes. The plurality of MR elements 150A are connected in series by the plurality of first lower electrodes and the plurality of first upper electrodes. The plurality of MR elements 150B are connected in series by the plurality of second lower electrodes and the plurality of second upper electrodes.

Figure 31:
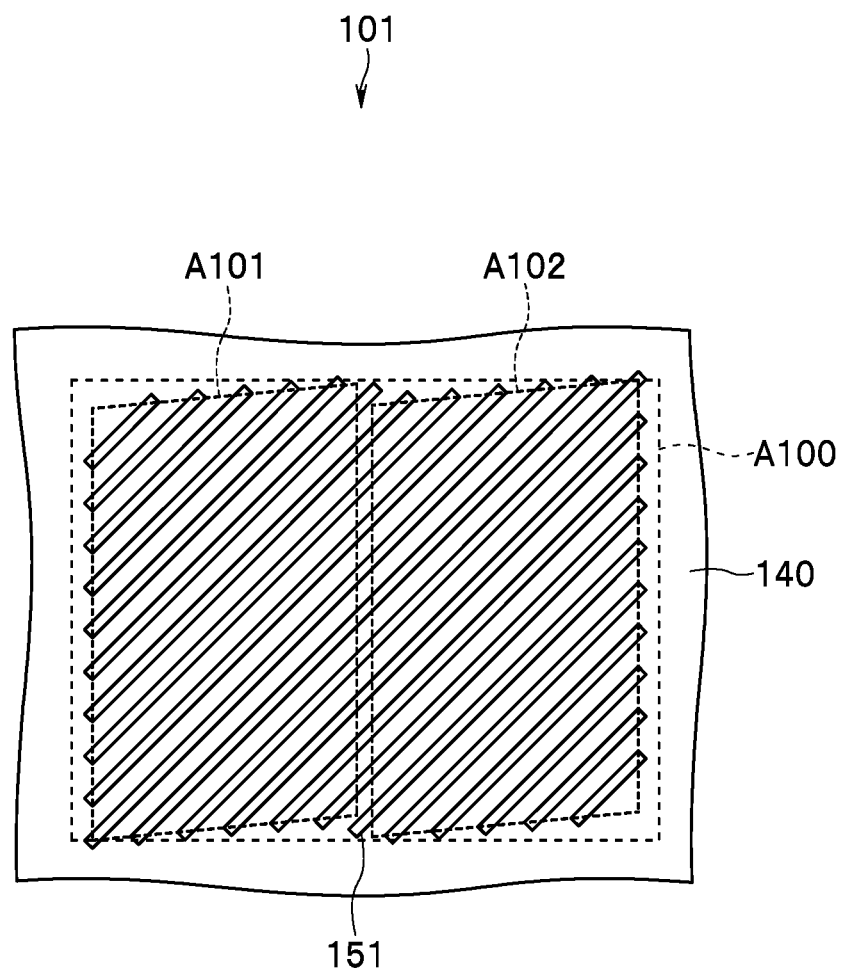
FIG. 31 is a plan view showing the plurality of yokes of the fourth example embodiment of the technology.
Figure 31:
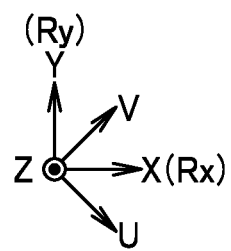

Next, the arrangement of the plurality of MR elements 150 of the third detection circuit 130 will be described with reference to FIG. 31. FIG. 31 is a plan view showing an element layout area and a plurality of yokes. FIG. 31 shows the third portion of the magnetic sensor 101. The magnetic sensor 101 includes an element layout area A100 for arranging the plurality of MR elements 150 of the third detection circuit 130. The element layout area A100 includes a first area A101 and a second area A102. The first area A101 is an area corresponding to the first and fourth resistor sections R131 and R134. The second area A102 is an area corresponding to the second and third resistor sections R132 and R133. The plurality of MR elements 150 of the third detection circuit 130 are disposed dividedly in the first and second areas A101 and A102.

Each of the first and second areas A101 and A102 includes a first end edge and a second end edge located at both ends in the first reference direction Rx, and a third end edge and a fourth end edge located at both ends in the second reference direction Ry. FIG. 28 shows a part of the first area A101. In FIG. 28, the reference numeral A101b denotes the second end edge of the first area A101, and the reference numeral A101d denotes the fourth end edge of the first area A101.

The first to fourth end edges of each of the first and second areas A101 and A102 may have features similar to the features of the first to fourth end edges A1a to A1d of the first area A1 of the first example embodiment except the length of each of the first to fourth end edges. However, in the first and second areas A101 and A102, the third reference direction in which each of the third and fourth end edges extends is a direction parallel to one direction between the X direction and the V direction.

Next, the plurality of yokes 151 will be described in detail. When the direction of the input magnetic field component is in the Z direction, the output magnetic field components received by the plurality of MR elements 150A are in the U direction, and the output magnetic field components received by the plurality of MR elements 150B are in the −U direction. When the direction of the input magnetic field component is in the −Z direction, the output magnetic field components received by the plurality of MR elements 150A are in the −U direction, and the output magnetic field components received by the plurality of MR elements 150B are in the U direction. As described above, each of the plurality of yokes 151 is structured to cause the plurality of MR elements 150 to detect a component of the target magnetic field in the direction parallel to the U direction. Thus, the plurality of yokes 151 correspond to the "plurality of structural bodies" of the technology.

The plurality of yokes 151 include yokes 151 each extending across the first and second areas A101 and A102, yokes 151 each extending across only the first area A101, and yokes 151 each extending across only the second area A102. Each yoke 151 includes a first end portion and a second end portion located at both ends of the yoke 151 in the longitudinal direction. The first end portion and the second end portion of each of the plurality of yokes 151 are not present in the inside of each of the first and second areas A101 and A102 or between the first area A101 and the second area A102.

The relationship between the yokes 151 and the first to fourth end edges of each of the first and second areas A101 and A102 may be similar to the relationship between the protruding surfaces 305c and the first to fourth end edges A1a to A1d of the first area A1 described in the first example embodiment.

Next, the first to third detection signals of the present example embodiment will be described. First, the first detection signals will be briefly described. A pattern of a change in the resistance of each of the resistor sections R111 to R114 of the first detection circuit 110 is the same as a pattern of a change in the resistance of each of the resistor sections R11 to R14 of the first detection circuit 10 described in the first example embodiment. The first detection circuit 110 generates a signal corresponding to the electric potential of the signal output port E11 as a first detection signal S111, and generates a signal corresponding to the electric potential of the signal output port E12 as a first detection signal S112.

Next, the second detection signal will be described with reference to FIG. 26. As the strength of the component of the target magnetic field in the direction parallel to the V direction changes, the resistance of each of the resistor sections R121 to R124 of the second detection circuit 120 changes either so that the resistances of the resistor sections R121 and R123 increase and the resistances of the resistor sections R122 and R124 decrease, or so that the resistances of the resistor sections R121 and R123 decrease and the resistances of the resistor sections R122 and R124 increase. Thereby the electric potential of each of the signal output ports E21 and E22 changes. The second detection circuit 120 generates a signal corresponding to the electric potential of the signal output port E21 as a second detection signal S121, and generates a signal corresponding to the electric potential of the signal output port E22 as a second detection signal S122.

Next, the third detection signal will be described with reference to FIGS. 27 to 31. The first resistor section R131 includes the plurality of MR elements 150A disposed in the first area A101. The second resistor section R132 includes the plurality of MR elements 150A disposed in the second area A102. The third resistor section R133 includes the plurality of MR elements 150B disposed in the second area A102. The fourth resistor section R134 includes the plurality of MR elements 150B disposed in the first area A101.

The magnetization directions of the magnetization pinned layers 52 in each of the first and fourth resistor sections R131 and R134 are the U direction. The magnetization directions of the magnetization pinned layers 52 in each of the second and third resistor sections R132 and R133 are the −U direction.

When the direction of the input magnetic field component is in the Z direction, the output magnetic field components received by the plurality of MR elements 150A in the first and second resistor sections R131 and R132 are in the U direction, and the output magnetic field components received by the plurality of MR elements 150B in the third and fourth resistor sections R133 and R134 are in the −U direction. In such a case, the resistance of each of the plurality of MR elements 150A in the first resistor section R131 and the resistance of each of the plurality of MR elements 150B in the third resistor section R133 decrease, and the resistance of each of the first and third resistor sections R131 and R133 also decreases in comparison with a state in which there exists no output magnetic field component. Meanwhile, the resistance of each of the MR elements 150B in the second resistor section R132 and the resistance of each of the plurality of MR elements 150B in the fourth resistor section R134 increase, and the resistances of the second and fourth resistor sections R132 and R134 also increase in comparison with a state in which there exists no output magnetic field component.

When the direction of the input magnetic field component is in the −Z direction, the direction of the output magnetic field component and the changes in the resistances of the first to fourth resistor sections R131 to R134 become opposite from those in the above-described case where the direction of the input magnetic field component is in the Z direction.

As described above, changes in the direction and strength of the input magnetic field component cause the resistances of the resistor sections R131 to R134 of the third detection circuit 130 to change either so that the resistances of the resistor sections R131 and R133 increase and the resistances of the resistor sections R132 and R134 decrease, or so that the resistances of the resistor sections R131 and R133 decrease and the resistances of the resistor sections R132 and R134 increase. Thereby the electric potential of each of the signal output ports E31 and E32 changes. The third detection circuit 130 generates a signal corresponding to the electric potential of the signal output port E31 as a third detection signal S131, and generates a signal corresponding to the electric potential of the signal output port E32 as a third detection signal S132.

Next, the operation of the processor 40 of the present example embodiment will be described. In the present example embodiment, the processor 40 is configured to generate a first detection value Su based on the first detection signals S111 and S112, generate a second detection value Sv based on the second detection signals S121 and S122, and generate a third detection value Sz based on the third detection signals S131 and S132.

Hereinafter, a method for generating the first to third detection values Su, Sv, and Sz will be described. The processor 40 generates the first detection value Su by an arithmetic including obtainment of a difference S111-S112 between the first detection signal S111 and the first detection signal S112. The first detection value Su may be the difference S111-S112 itself. The first detection value Su may be a result of predetermined corrections, such as gain adjustment and offset adjustment, made on the difference S111-S112.

The processor 40 generates the second detection value Sv by an arithmetic including obtainment of a difference S121-S122 between the second detection signal S121 and the second detection signal S122. The second detection value Sv may be the difference S121-S122 itself. The second detection value Sv may be a result of predetermined corrections, such as gain adjustment and offset adjustment, made on the difference S121-S122.

The processor 40 generates the third detection value Sz by an arithmetic including obtainment of a difference S131-S132 between the third detection signal S131 and the third detection signal S132. The third detection value Sz may be the difference S131-S132 itself. The third detection value Sz may be a result of predetermined corrections, such as gain adjustment and offset adjustment, made on the difference S131-S132.

Note that among the features of the first example embodiment described with reference to FIGS. 12 to 14 and 16 to 19, the features related to the plurality of protruding surfaces 305c also apply to the plurality of yokes 151. The configuration, operation and effects of the present example embodiment are otherwise the same as those of the first example embodiment.

Fifth Example Embodiment

A fifth example embodiment of the technology will now be described. The magnetic sensor device 100 of the present example embodiment includes a first chip 8 instead of the first chip 2 of the first example embodiment. The magnetic sensor 1 according to the present example embodiment includes the first chip 8 and the second chip 3. Although not shown, the first chip 8 has an external shape similar to the external shape of the second chip 3. The first chip 8 is mounted on the reference plane 4a of the support 4 in a posture such that the bottom surface of the first chip 8 faces the reference plane 4a of the support 4 as with the second chip 3 (see FIGS. 1 and 2).

The configuration of the second chip 3 of the present example embodiment is the same as the configuration of the second chip 3 of the first example embodiment. In the present example embodiment, two detection circuits included in the second chip 3 are referred to as a third detection circuit 20 and a fourth detection circuit 30 for convenience sake. The configurations of the third and fourth detection circuits 20 and 30 of the present example embodiment are respectively the same as the configurations of the second and third detection circuits 20 and 30 of the first example embodiment.

In the present example embodiment, two detection signals generated by the third detection circuit 20 are referred to as third detection signals S21 and S22, and two detection signals generated by the fourth detection circuit 30 are referred to as fourth detection signals S31 and S32 for convenience sake. The third detection signals S21 and S22 and the fourth detection signals S31 and S32 of the present example embodiment are respectively the same as the second detection signals S21 and S22 and the third detection signals S31 and S32 of the first example embodiment.

In the present example embodiment, the plurality of MR elements 50 constituting the third detection circuit 20 are referred to as a plurality of third MR elements 50B, and the plurality of MR elements 50 constituting the fourth detection circuit 30 are referred to as a plurality of fourth MR elements 50C for convenience sake. The plurality of third MR elements 50B and the plurality of fourth MR elements 50C of the present example embodiment are respectively the same as the plurality of second MR elements 50B and the plurality of third MR elements 50C of the first example embodiment.

The magnetic sensor 1 according to the present example embodiment includes the third and fourth detection circuits 20 and 30. In addition, the magnetic sensor 1 according to the present example embodiment includes a first detection circuit 240, a second detection circuit 250, and a first coil 280 instead of the first detection circuit 10 and the first coil 70 of the first example embodiment.

Figure 32:
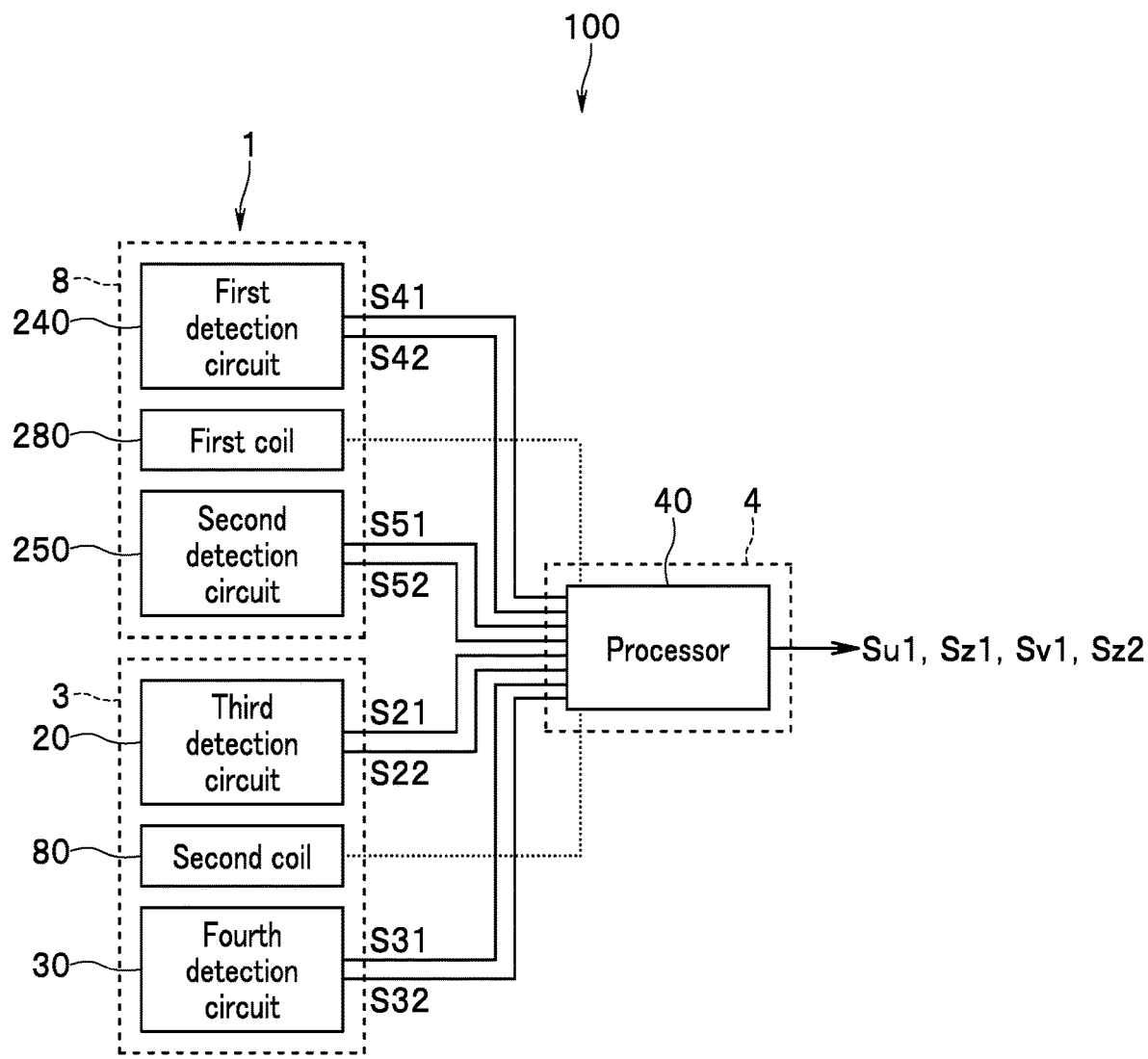
FIG. 32 is a functional block diagram showing a configuration of a magnetic sensor device including a magnetic sensor according to a fifth example embodiment of the technology.
Figure 33:
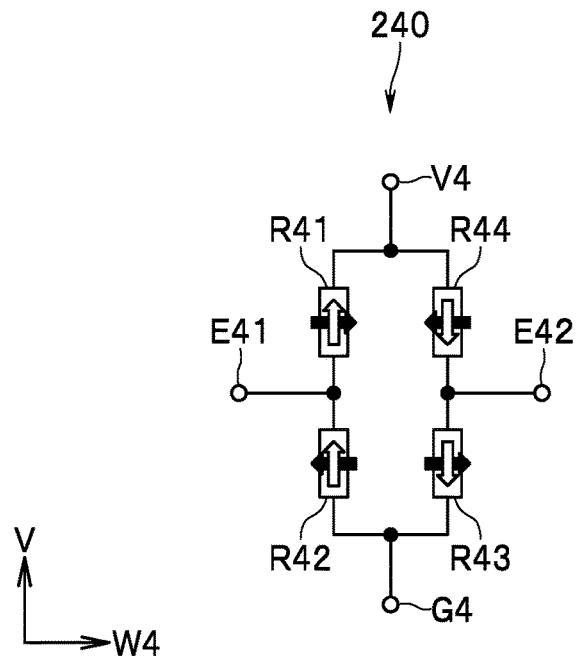
FIG. 33 is a circuit diagram showing a circuit configuration of a first detection circuit of the fifth example embodiment of the technology.
Figure 34:
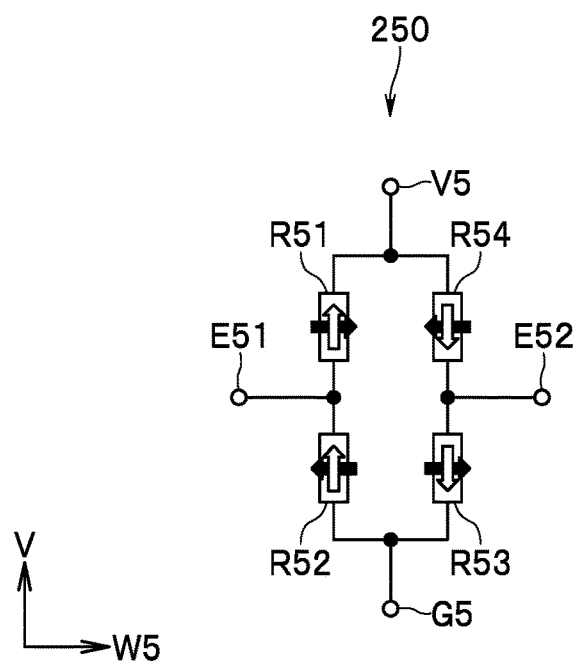
FIG. 34 is a circuit diagram showing a circuit configuration of a second detection circuit of the fifth example embodiment of the technology.
Figure 35:
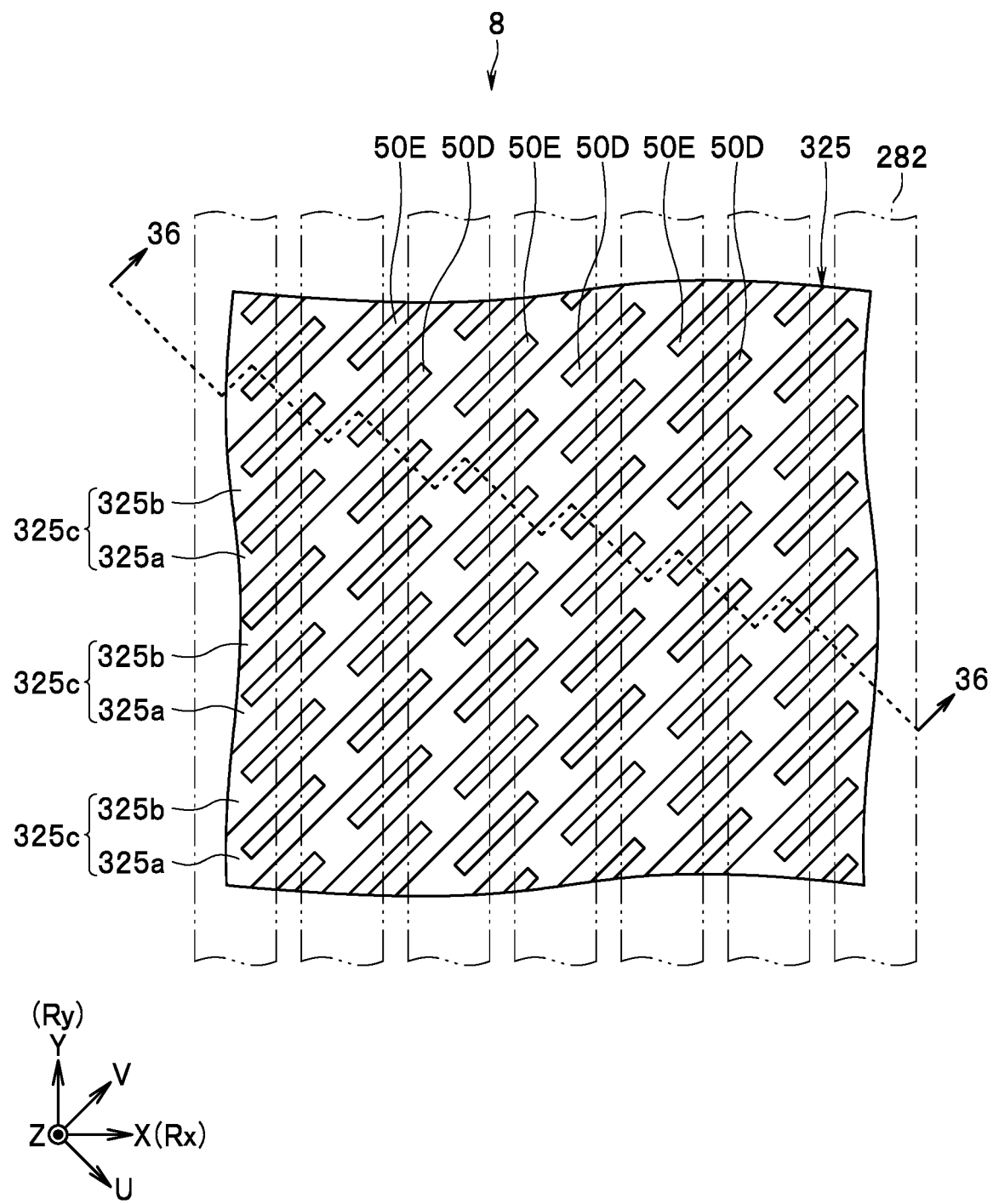
FIG. 35 is a plan view showing a part of a first chip of the fifth example embodiment of the technology.
Figure 36:
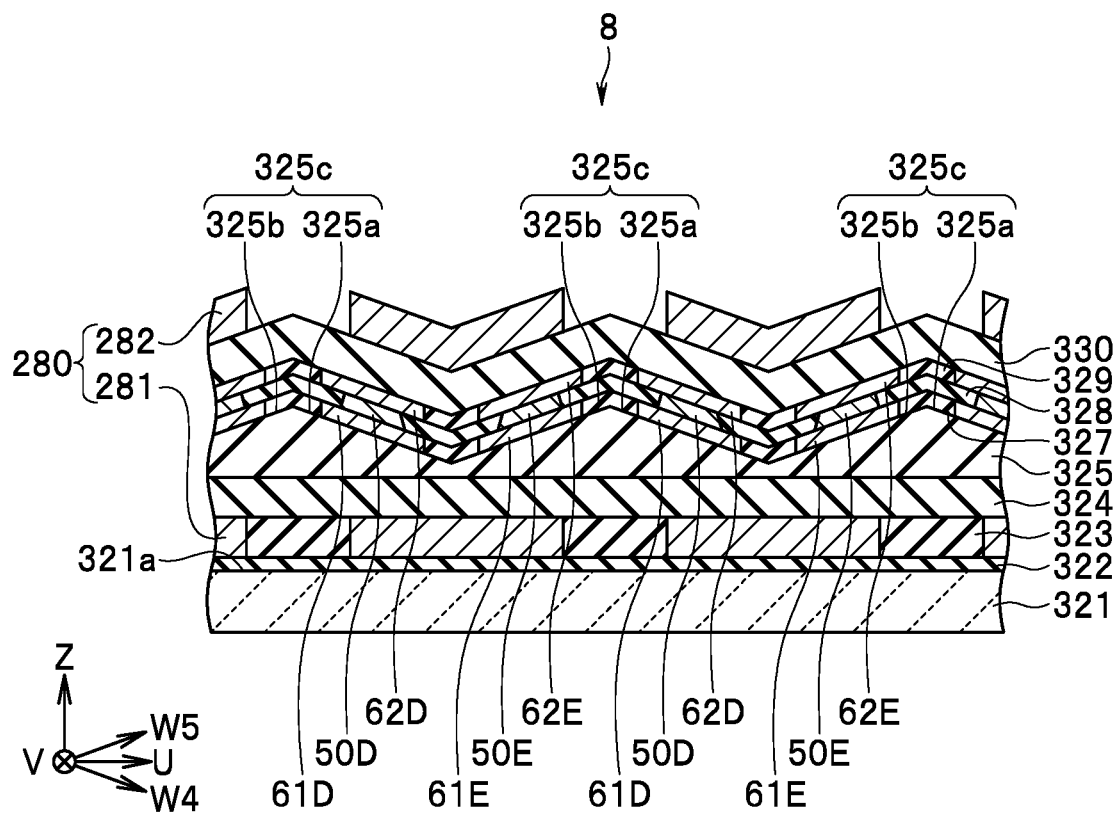
FIG. 36 is a sectional view showing a part of the first chip of the fifth example embodiment of the technology.

Hereinafter, the first and second detection circuits 240 and 250 will be described with reference to FIGS. 32 to 36. FIG. 32 is a functional block diagram showing a configuration of the magnetic sensor device 100. FIG. 33 is a circuit diagram showing a circuit configuration of the first detection circuit 240. FIG. 34 is a circuit diagram showing a circuit configuration of the second detection circuit 250. FIG. 35 is a plan view showing a part of the first chip 8. FIG. 36 is a sectional view showing a part of the first chip 8.

Here, as shown in FIG. 36, a W4 direction and a W5 direction are defined as follows. The W4 direction is a direction rotated from the U direction to the −Z direction. The W5 direction is a direction rotated from the U direction to the Z direction. More specifically, in the present example embodiment, the W4 direction is set to a direction rotated from the U direction to the −Z direction by γ, and the W5 direction is set to a direction rotated from the U direction to the Z direction by γ. Note that γ is an angle greater than 0° and smaller than 90°. γ may be equal to β described in the first example embodiment. −W4 direction refers to a direction opposite to the W4 direction, and −W5 direction refers to a direction opposite to the W5 direction. The W4 direction and W5 direction are both orthogonal to the V direction.

The first detection circuit 240 is configured to detect a component of a target magnetic field in a direction parallel to the W4 direction and generate first detection signals S41 and S42 each having a correspondence with the component. The second detection circuit 250 is configured to detect a component of the target magnetic field in a direction parallel to the W5 direction and generate second detection signals S51 and S52 each having a correspondence with the component.

As shown in FIG. 33, the first detection circuit 240 includes a power supply port V4, a ground port G4, signal output ports E41 and E42, a first resistor section R41, a second resistor section R42, a third resistor section R43, and a fourth resistor section R44. The plurality of MR elements of the first detection circuit 240 constitute the first to fourth resistor sections R41, R42, R43, and R44.

The first resistor section R41 is provided between the power supply port V4 and the signal output port E41. The second resistor section R42 is provided between the signal output port E41 and the ground port G4. The third resistor section R43 is provided between the signal output port E42 and the ground port G4. The fourth resistor section R44 is provided between the power supply port V4 and the signal output port E42.

As shown in FIG. 34, the second detection circuit 250 includes a power supply port V5, a ground port G5, signal output ports E51 and E52, a first resistor section R51, a second resistor section R52, a third resistor section R53, and a fourth resistor section R54. The plurality of MR elements of the second detection circuit 250 constitute the first to fourth resistor sections R51, R52, R53, and R54.

The first resistor section R51 is provided between the power supply port V5 and the signal output port E51. The second resistor section R52 is provided between the signal output port E51 and the ground port G5. The third resistor section R53 is provided between the signal output port E52 and the ground port G5. The fourth resistor section R54 is provided between the power supply port V5 and the signal output port E52.

A voltage or current of predetermined magnitude is applied to each of the power supply ports V4 and V5. Each of the ground ports G4 and G5 is connected to the ground.

The plurality of MR elements of the first detection circuit 240 will hereinafter be referred to as a plurality of first MR elements 50D. The plurality of MR elements of the second detection circuit 250 will be referred to as a plurality of second MR elements 50E. Since the first and second detection circuits 240 and 250 are components of the magnetic sensor 1, it can be said that the magnetic sensor 1 includes the plurality of first MR elements 50D and the plurality of second MR elements 50E. The configuration of each of the plurality of first MR elements 50D and the plurality of second MR elements 50E is the same as the configuration of each of the MR elements 50 described in the first example embodiment.

In FIGS. 33 and 34, solid arrows represent the magnetization directions of the magnetization pinned layers 52 of the MR elements 50 (see FIG. 11). Hollow arrows represent the magnetization directions of the free layers 54 of the MR elements 50 in a case where no target magnetic field is applied to the MR elements 50 (see FIG. 11).

In the example shown in FIG. 33, the magnetization directions of the magnetization pinned layers 52 in each of the first and third resistor sections R41 and R43 are the W4 direction. The magnetization directions of the magnetization pinned layers 52 in each of the second and fourth resistor sections R42 and R44 are the −W4 direction. The free layer 54 in each of the plurality of first MR elements 50D has a shape anisotropy that sets the direction of the magnetization easy axis to a direction parallel to the V direction. The magnetization directions of the free layers 54 in each of the first and second resistor sections R41 and R42 in a case where no target magnetic field is applied to the first MR elements 50D are the V direction. The magnetization directions of the free layers 54 in each of the third and fourth resistor sections R43 and R44 in the foregoing case are the −V direction.

In the example shown in FIG. 34, the magnetization directions of the magnetization pinned layers 52 in each of the first and third resistor sections R51 and R53 are the W5 direction. The magnetization directions of the magnetization pinned layers 52 in each of the second and fourth resistor sections R52 and R54 are the −W5 direction. The free layer 54 in each of the plurality of second MR elements 50E has a shape anisotropy that sets the direction of the magnetization easy axis to a direction parallel to the V direction. The magnetization directions of the free layers 54 in each of the first and second resistor sections R51 and R52 in a case where no target magnetic field is applied to the second MR elements 50E are the V direction. The magnetization directions of the free layers 54 in each of the third and fourth resistor sections R53 and R54 in the foregoing case are the −V direction.

In the present example embodiment, a magnetic field generator includes the first coil 280 instead of the first coil 70 of the first example embodiment. The first coil 280 applies a magnetic field in a predetermined direction to the free layer 54 of each of the plurality of first MR elements 50D and the plurality of second MR elements 50E. The first chip 8 includes the first coil 280.

Hereinafter, a specific structure of the first chip 8 will be described in detail. FIG. 36 shows a part of the cross section at the position indicated by the line 36-36 in FIG. 35. The first chip 8 includes a substrate 321 having a top surface 321a, insulating layers 322, 323, 324, 325, 327, 328, 329, and 330, a plurality of lower electrodes 61D, a plurality of lower electrodes 61E, a plurality of upper electrodes 62D, a plurality of upper electrodes 62E, a plurality of lower coil elements 281, and a plurality of upper coil elements 282. Note that FIG. 36 shows the insulating layer 325, the plurality of first MR elements 50D, the plurality of second MR elements 50E, and the plurality of upper coil elements 282, among the components of the first chip 8.

The insulating layer 325 includes a plurality of protruding surfaces 325c. Each of the plurality of protruding surfaces 325c includes a first inclined surface 325a and a second inclined surface 325b.

The structure of the first chip 8 may be symmetrical to the structure of the second chip 3, with the YZ plane as the center. In such a case, replacing the components of the second chip 3 with the components of the first chip 8 can provide a description of the structure of the first chip 8. Specifically, the components of the second chip 3 are replaced with the components of the first chip 8 as follows. The plurality of third MR elements 50B and the plurality of fourth MR elements 50C of the second chip 3 (the plurality of second MR elements 50B and the plurality of third MR elements 50C of the first example embodiment) are respectively replaced with the plurality of first MR elements 50D and the plurality of second MR elements 50E. The plurality of lower electrodes 61B and the plurality of lower electrodes 61C of the second chip 3 are respectively replaced with the plurality of lower electrodes 61D and the plurality of lower electrodes 61E. The plurality of upper electrodes 62B and the plurality of upper electrodes 62C of the second chip 3 are respectively replaced with the plurality of upper electrodes 62D and the plurality of upper electrodes 62E. The plurality of lower coil elements 81 and the plurality of upper coil elements 82 of the second chip 3 are respectively replaced with the plurality of lower coil elements 281 and the plurality of upper coil elements 282. The insulating layers 302 to 305 and 307 to 310 of the second chip 3 are respectively replaced with the insulating layers 322 to 325 and 327 to 330.

The plurality of protruding surfaces 305c, the plurality of first inclined surfaces 305a, and the plurality of second inclined surfaces 305b of the second chip 3 are respectively replaced with the plurality of protruding surfaces 325c, the plurality of first inclined surfaces 325a, and the plurality of second inclined surfaces 325b. Note that in the first example embodiment, the features of the plurality of protruding surfaces 305c, the plurality of first inclined surfaces 305a, and the plurality of second inclined surfaces 305b have been described using the U direction, the V direction, the −V direction, the W1 direction, the W2 direction, and the VZ cross section. When the components of the second chip 3 are replaced with the components of the first chip 8 as described above, the U direction, the V direction, the −V direction, the W1 direction, the W2 direction, and the VZ cross section are respectively replaced with the V direction, the U direction, the −U direction, the W4 direction, the W5 direction, and the UZ cross section.

Next, the arrangement of the plurality of first MR elements 50D and the plurality of second MR elements 50E will be described. The first chip 8 includes an element layout area for disposing the plurality of first MR elements 50D and the plurality of second MR elements 50E. The element layout area of the first chip 8 includes a first area corresponding to the first resistor sections R41 and R51, a second area corresponding to the second resistor sections R42 and R52, a third area corresponding to the third resistor sections R43 and R53, and a fourth area corresponding to the fourth resistor sections R44 and R54.

The arrangement of the first to fourth areas of the element layout area of the first chip 8 may be the same as the arrangement of the first to fourth areas A1 to A4 of the element layout area A0 of the second chip 3 shown in FIG. 12 of the first example embodiment. Alternatively, the arrangement of the first to fourth areas of the element layout area of the first chip 8 may be symmetrical to the arrangement of the first to fourth areas A1 to A4 of the element layout area A0 of the second chip 3, with the YZ plane as the center.

The shape of each of the first to fourth areas of the element layout area of the first chip 8 may be symmetrical to the shape of each of the first to fourth areas A1 to A4 of the element layout area A0 of the second chip 3, with the YZ plane as the center.

The arrangement of the plurality of first MR elements 50D and the plurality of second MR elements 50E in each of the first to fourth areas of the element layout area of the first chip 8 may be symmetrical to the arrangement of the plurality of third MR elements 50B and the plurality of fourth MR elements 50C (the plurality of second MR elements 50B and the plurality of third MR elements 50C of the first example embodiment) in each of the first to fourth areas A1 to A4 of the element layout area A0 of the second chip 3, with the YZ plane as the center.

Next, the first detection signals S41 and S42 will be described with reference to FIG. 33. As the strength of the component of the target magnetic field in the direction parallel to the W4 direction changes, the resistance of each of the resistor sections R41 to R44 of the first detection circuit 240 changes either so that the resistances of the resistor sections R41 and R43 increase and the resistances of the resistor sections R42 and R44 decrease, or so that the resistances of the resistor sections R41 and R43 decrease and the resistances of the resistor sections R42 and R44 increase. Thereby the electric potential of each of the signal output ports E41 and E42 changes. The first detection circuit 240 generates a signal corresponding to the electric potential of the signal output port E41 as the first detection signal S41, and generates a signal corresponding to the electric potential of the signal output port E12 as the first detection signal S42.

Next, the second detection signals S51 and S52 will be described with reference to FIG. 34. As the strength of the component of the target magnetic field in the direction parallel to the W5 direction changes, the resistance of each of the resistor sections R51 to R54 of the second detection circuit 250 changes either so that the resistances of the resistor sections R51 and R53 increase and the resistances of the resistor sections R52 and R54 decrease, or so that the resistances of the resistor sections R51 and R53 decrease and the resistances of the resistor sections R52 and R54 increase. Thereby the electric potential of each of the signal output ports E51 and E52 changes. The second detection circuit 250 generates a signal corresponding to the electric potential of the signal output port E51 as the second detection signal S51, and generates a signal corresponding to the electric potential of the signal output port E52 as the second detection signal S52.

Next, the operation of the processor 40 of the present example embodiment will be described. In the present example embodiment, the processor 40 is configured to generate the first detection value and the second detection value based on the first detection signals S41 and S42 and the second detection signals S51 and S52. The first detection value is a detection value corresponding to the component of the target magnetic field in the direction parallel to the U direction. The second detection value is a detection value corresponding to the component of the target magnetic field in the direction parallel to the Z direction. The first detection value will hereinafter be represented by the symbol Su1, and the second detection value will hereinafter be represented by the symbol Sz1.

The processor 40 is further configured to generate the third and fourth detection values based on the third detection signals S21 and S22 and the fourth detection signals S31 and S32. The third detection value is a detection value corresponding to the component of the target magnetic field in the direction parallel to the V direction. The fourth detection value is a detection value corresponding to the component of the target magnetic field in the direction parallel to the Z direction. The third detection value will hereinafter be represented by the symbol Sv1, and the fourth detection value will hereinafter be represented by the symbol Sz2.

A method for generating the first and second detection values Su1 and Sz1 is similar to the method for generating the second and third detection values Sv and Sz described in the first example embodiment. Replacing Sv and Sz in the description of the method for generating the second and third detection values Sv and Sz with Su1 and Sz1, respectively, can provide a description of the method for generating the first and second detection values Su1 and Sz1.

The method for generating the third and fourth detection values Sv1 and Sz2 is also similar to the method for generating the second and third detection values Sv and Sz described in the first example embodiment. Replacing Sv and Sz in the description of the method for generating the second and third detection values Sv and Sz with Sv1 and Sz2, respectively, can provide a description of the method for generating the third and fourth detection values Sv1 and Sz2.

In the present example embodiment, the processor 40 may execute an arithmetic for obtaining the mean of the second and fourth detection values Sz1 and Sz2. In such a case, the processor 40 may generate a value obtained through the arithmetic as a detection value corresponding to the component of the target magnetic field in the direction parallel to the Z direction.

The configuration, operation and effects of the present example embodiment are otherwise the same as those of the first example embodiment.

The technology is not limited to the foregoing example embodiments, and various modifications may be made thereto. For example, the magnetic sensor of the technology may include a plurality of chips that are integrated.

As described above, a magnetic sensor according to one embodiment of the technology includes a plurality of resistor sections each including a plurality of magnetoresistive elements, and a plurality of structural bodies each structured to cause the plurality of magnetoresistive elements to detect a specific component of a target magnetic field. The plurality of magnetoresistive elements are disposed dividedly in a plurality of areas corresponding to the respective resistor sections. The plurality of structural bodies include a structural body extending across at least two of the plurality of areas.

In the magnetic sensor according to one embodiment of the technology, the plurality of structural bodies may further include a structural body extending across only one of the plurality of areas.

In the magnetic sensor according to one embodiment of the technology, the plurality of areas may include a first specific area, a second specific area, and a third specific area. The plurality of structural bodies may include a first structural body extending across only the first specific area, a second structural body extending across the first specific area and the second specific area but not extending across the third specific area, and a third structural body extending across the first specific area, the second specific area, and the third specific area. The plurality of areas may further include a fourth specific area. The plurality of structural bodies may further include a fourth structural body extending across the first specific area, the second specific area, the third specific area, and the fourth specific area. The second structural body and the third structural body need not extend across the fourth specific area.

In the magnetic sensor according to one embodiment of the technology, the plurality of areas may be disposed so as to be arranged along the first reference direction. Each of the plurality of structural bodies may extend in a direction intersecting with the first reference direction at an angle other than 90°. The dimension of an element layout area that is an area including the plurality of areas in the first reference direction may be greater than the dimension of the element layout area in the second reference direction orthogonal to the first reference direction. The dimension of each of the plurality of areas in the first reference direction may be smaller than the dimension of each of the plurality of areas in the second reference direction orthogonal to the first reference direction.

In the magnetic sensor according to one embodiment of the technology, the plurality of areas may include a first specific area and a second specific area disposed so as to be arranged along the first reference direction, and a third specific area and a fourth specific area respectively disposed forward of one direction orthogonal to the first reference direction with respect to the first specific area and the second specific area.

In the magnetic sensor according to one embodiment of the technology, the plurality of structural bodies may include a plurality of yokes each made of a soft magnetic body. The plurality of magnetoresistive elements may be disposed such that two or more magnetoresistive elements are arranged along each of the plurality of yokes.

In the magnetic sensor according to one embodiment of the technology, the plurality of structural bodies may include a plurality of inclined surfaces each inclined relative to the reference plane. The plurality of magnetoresistive elements may be disposed such that two or more magnetoresistive elements are arranged on each of the plurality of inclined surfaces.

The magnetic sensor according to one embodiment of the technology may further include a power supply port, a ground port, a first output port, and a second output port. The plurality of resistor sections may include a first resistor section provided between the power supply port and the first output port, a second resistor section provided between the ground port and the first output port, a third resistor section provided between the ground port and the second output port, and a fourth resistor section provided between the power supply port and the second output port. The plurality of areas may include a first area, a second area, a third area, and a fourth area. The plurality of magnetoresistive elements may include a plurality of first magnetoresistive elements disposed in the first area, a plurality of second magnetoresistive elements disposed in the second area, a plurality of third magnetoresistive elements disposed in the third area, and a plurality of fourth magnetoresistive elements disposed in the fourth area. The plurality of first magnetoresistive elements, the plurality of second magnetoresistive elements, the plurality of third magnetoresistive elements, and the plurality of fourth magnetoresistive elements may respectively constitute the first resistor section, the second resistor section, the third resistor section, and the fourth resistor section.

In the magnetic sensor according to one embodiment of the technology, the plurality of areas may include four first areas and four second areas. The plurality of magnetoresistive elements may include a plurality of first magnetoresistive elements disposed dividedly in the four first areas, a plurality of second magnetoresistive elements disposed dividedly in the four second areas, and a plurality of third magnetoresistive elements disposed dividedly in the four second areas. The plurality of structural bodies are present in the four second areas, but need not be present in the four first areas. The plurality of structural bodies may include a plurality of first inclined surfaces each inclined relative to the reference plane, and a plurality of second inclined surfaces each inclined in a direction different from each of the plurality of first inclined surfaces. The plurality of first magnetoresistive elements may be disposed on a plane parallel to the reference plane. The plurality of second magnetoresistive elements may be disposed such that two or more second magnetoresistive elements are arranged on each of the plurality of first inclined surfaces. The plurality of third magnetoresistive elements may be disposed such that two or more third magnetoresistive elements are arranged on each of the plurality of second inclined surfaces. The plurality of first magnetoresistive elements may constitute a first detection circuit configured to detect a component of the target magnetic field in a first direction parallel to the reference plane and generate a first detection signal. The plurality of second magnetoresistive elements may constitute a second detection circuit configured to detect a component of the target magnetic field in a second direction inclined relative to each of the reference plane and a direction perpendicular to the reference plane and generate a second detection signal. The plurality of third magnetoresistive elements may constitute a third detection circuit configured to detect a component of the target magnetic field in a third direction inclined relative to each of the reference plane and the direction perpendicular to the reference plane and generate a third detection signal. In such a case, the magnetic sensor according to one embodiment of the technology may further include a processor. The processor may generate, based on the first detection signal, a first detection value corresponding to the component of the target magnetic field in the first direction, and may also generate, based on the second detection signal and the third detection signal, a second detection value corresponding to the component of the target magnetic field in the direction parallel to the reference plane and orthogonal to the first direction, and a third detection value corresponding to the component of the target magnetic field in the direction perpendicular to the reference plane.

In the magnetic sensor according to one embodiment of the technology, the plurality of areas may include four first areas and four second areas. The plurality of magnetoresistive elements may include a plurality of first magnetoresistive elements disposed dividedly in the four first areas, a plurality of second magnetoresistive elements disposed dividedly in the four first areas, a plurality of third magnetoresistive elements disposed dividedly in the four second areas, and a plurality of fourth magnetoresistive elements disposed dividedly in the four second areas. The plurality of structural bodies may include a plurality of first structural bodies present in the four first areas, and a plurality of second structural bodies present in the four second areas. The plurality of first structural bodies may include a plurality of first inclined surfaces each inclined relative to the reference plane, and a plurality of second inclined surfaces each inclined in a direction different from each of the plurality of first inclined surfaces. The plurality of second structural bodies may include a plurality of third inclined surfaces each inclined relative to the reference plane, and a plurality of fourth inclined surfaces each inclined in a direction different from each of the plurality of third inclined surfaces. The plurality of first magnetoresistive elements may be disposed such that two or more first magnetoresistive elements are arranged on each of the plurality of first inclined surfaces. The plurality of second magnetoresistive elements may be disposed such that two or more second magnetoresistive elements are arranged on each of the plurality of second inclined surfaces. The plurality of third magnetoresistive elements may be disposed such that two or more third magnetoresistive elements are arranged on each of the plurality of third inclined surfaces. The plurality of fourth magnetoresistive elements may be disposed such that two or more fourth magnetoresistive elements are arranged on each of the plurality of fourth inclined surfaces. The plurality of first magnetoresistive elements may constitute a first detection circuit configured to detect a component of the target magnetic field in a first direction inclined relative to each of the reference plane and a direction perpendicular to the reference plane and generate a first detection signal. The plurality of second magnetoresistive elements may constitute a second detection circuit configured to detect a component of the target magnetic field in a second direction inclined relative to each of the reference plane and the direction perpendicular to the reference plane and generate a second detection signal. The plurality of third magnetoresistive elements may constitute a third detection circuit configured to detect a component of the target magnetic field in a third direction inclined relative to each of the reference plane and the direction perpendicular to the reference plane and generate a third detection signal. The plurality of fourth magnetoresistive elements may constitute a fourth detection circuit configured to detect a component of the target magnetic field in a fourth direction inclined relative to each of the reference plane and the direction perpendicular to the reference plane and generate a fourth detection signal. In such a case, the magnetic sensor according to one embodiment of the technology may further include a processor. The processor may generate, based on the first detection signal and the second detection signal, a first detection value corresponding to a component of the target magnetic field in a fifth direction parallel to the reference plane, and a second detection value corresponding to a component of the target magnetic field in the direction perpendicular to the reference plane, and may also generate, based on the third detection signal and the fourth detection signal, a third detection value corresponding to a component of the target magnetic field in a sixth direction parallel to the reference plane and orthogonal to the fifth direction, and a fourth detection value corresponding to a component of the target magnetic field in the direction perpendicular to the reference plane.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:
   a plurality of resistor sections, each including a plurality of magnetoresistive elements; and
   a plurality of structural bodies, each structured to cause the plurality of magnetoresistive elements to detect a specific component of a target magnetic field;
   a power supply port;
   a ground port; and
   a first output port, wherein:
   the plurality of resistor sections include a first resistor section provided between the power supply port and the first output port, and a second resistor section provided between the ground port and the first output port;
   the plurality of magnetoresistive elements include a plurality of first magnetoresistive elements disposed in a first area, and a plurality of second magnetoresistive elements disposed in a second area;
   the plurality of first magnetoresistive elements and the plurality of second magnetoresistive elements respectively constitute the first resistor section and the second resistor section; and
   the plurality of structural bodies include a structural body extending across the first area and the second area.

2. The magnetic sensor according to claim 1, wherein the plurality of structural bodies further include a structural body extending across the first area or the second area.

3. The magnetic sensor according to claim 1, further comprising:
   a second output port, wherein:
   the plurality of resistor sections further include a third resistor section provided between the ground port and the second output port, and a fourth resistor section provided between the power supply port and the second output port;
   the plurality of magnetoresistive elements further include a plurality of third magnetoresistive elements disposed in a third area, and a plurality of fourth magnetoresistive elements disposed in a fourth area;
   the plurality of third magnetoresistive elements and the plurality of fourth magnetoresistive elements respectively constitute the third resistor section and the fourth resistor section; and
   the plurality of structural bodies include a first structural body extending across only one of the first to fourth areas, a second structural body extending across two of the first to fourth areas, but not extending across other two areas of the first to fourth areas, and a third structural body extending across three of the first to fourth areas.

4. The magnetic sensor according to claim 3, wherein:
   the plurality of structural bodies further include a fourth structural body extending across the first to fourth areas.

5. The magnetic sensor according to claim 1, wherein:
the first and second areas are disposed so as to be arranged along a first reference direction; and
each of the plurality of structural bodies extends in a direction intersecting with the first reference direction at an angle other than 90°.

6. The magnetic sensor according to claim 5, wherein each of the first and second areas in the first reference direction is smaller than a dimension of each of the first and second areas in a second reference direction orthogonal to the first reference direction.

7. The magnetic sensor according to claim 1, wherein the plurality of structural bodies include a plurality of yokes, each made of a soft magnetic body.

8. The magnetic sensor according to claim 7, wherein the plurality of magnetoresistive elements are disposed such that two or more magnetoresistive elements are arranged along each of the plurality of yokes.

9. The magnetic sensor according to claim 1, wherein the plurality of structural bodies include a plurality of inclined surfaces, each inclined relative to a reference plane.

10. The magnetic sensor according to claim 9, wherein the plurality of magnetoresistive elements are disposed such that two or more magnetoresistive elements are arranged on each of the plurality of inclined surfaces.

11. A magnetic sensor comprising:
a plurality of resistor sections, each including a plurality of magnetoresistive elements; and
a plurality of structural bodies, each structured to cause the plurality of magnetoresistive elements to detect a specific component of a target magnetic field, wherein:
the plurality of magnetoresistive elements are disposed dividedly in a plurality of areas corresponding respectively to the plurality of resistor sections;
the plurality of structural bodies include a structural body extending across at least two of the plurality of areas;
the plurality of areas include four first areas and four second areas;
the plurality of magnetoresistive elements include a plurality of first magnetoresistive elements disposed dividedly in the four first areas, a plurality of second magnetoresistive elements disposed dividedly in the four second areas, and a plurality of third magnetoresistive elements disposed dividedly in the four second areas;
the plurality of structural bodies are present in the four second areas but are not present in the four first areas;
the plurality of structural bodies include a plurality of first inclined surfaces, each inclined relative to a reference plane, and a plurality of second inclined surfaces, each inclined in a direction different from each of the plurality of first inclined surfaces;
the plurality of first magnetoresistive elements are disposed on a plane parallel to the reference plane;
the plurality of second magnetoresistive elements are disposed such that two or more second magnetoresistive elements are arranged on each of the plurality of first inclined surfaces;
the plurality of third magnetoresistive elements are disposed such that two or more third magnetoresistive elements are arranged on each of the plurality of second inclined surfaces;
the plurality of first magnetoresistive elements constitute a first detection circuit configured to detect a component of the target magnetic field in a first direction parallel to the reference plane and generate a first detection signal;
the plurality of second magnetoresistive elements constitute a second detection circuit configured to detect a component of the target magnetic field in a second direction inclined relative to each of the reference plane and a direction perpendicular to the reference plane and generate a second detection signal; and
the plurality of third magnetoresistive elements constitute a third detection circuit configured to detect a component of the target magnetic field in a third direction inclined relative to each of the reference plane and the direction perpendicular to the reference plane and generate a third detection signal.

12. The magnetic sensor according to claim 11, further comprising:
a processor configured to:
generate, based on the first detection signal, a first detection value corresponding to a component of the target magnetic field in the first direction; and
generate, based on the second detection signal and the third detection signal, a second detection value corresponding to a component of the target magnetic field in a direction parallel to the reference plane and orthogonal to the first direction, and a third detection value corresponding to a component of the target magnetic field in the direction perpendicular to the reference plane.

13. A magnetic sensor comprising:
a plurality of resistor sections, each including a plurality of magnetoresistive elements; and
a plurality of structural bodies, each structured to cause the plurality of magnetoresistive elements to detect a specific component of a target magnetic field, wherein:
the plurality of magnetoresistive elements are disposed dividedly in a plurality of areas corresponding respectively to the plurality of resistor sections;
the plurality of structural bodies include a structural body extending across at least two of the plurality of areas;
the plurality of areas include four first areas and four second areas;
the plurality of magnetoresistive elements include a plurality of first magnetoresistive elements disposed dividedly in the four first areas, a plurality of second magnetoresistive elements disposed dividedly in the four first areas, a plurality of third magnetoresistive elements disposed dividedly in the four second areas, and a plurality of fourth magnetoresistive elements disposed dividedly in the four second areas;
the plurality of structural bodies include a plurality of first structural bodies present in the four first areas, and a plurality of second structural bodies present in the four second areas;
the plurality of first structural bodies include a plurality of first inclined surfaces, each inclined relative to a reference plane, and a plurality of second inclined surfaces, each inclined in a direction different from each of the plurality of first inclined surfaces;
the plurality of second structural bodies include a plurality of third inclined surfaces, each inclined relative to the reference plane, and a plurality of fourth inclined surfaces, each inclined in a direction different from each of the plurality of third inclined surfaces;
the plurality of first magnetoresistive elements are disposed such that two or more first magnetoresistive elements are arranged on each of the plurality of first inclined surfaces;

the plurality of second magnetoresistive elements are disposed such that two or more second magnetoresistive elements are arranged on each of the plurality of second inclined surfaces;

the plurality of third magnetoresistive elements are disposed such that two or more third magnetoresistive elements are arranged on each of the plurality of third inclined surfaces;

the plurality of fourth magnetoresistive elements are disposed such that two or more fourth magnetoresistive elements are arranged on each of the plurality of fourth inclined surfaces;

the plurality of first magnetoresistive elements constitute a first detection circuit configured to detect a component of the target magnetic field in a first direction inclined relative to each of the reference plane and a direction perpendicular to the reference plane and generate a first detection signal;

the plurality of second magnetoresistive elements constitute a second detection circuit configured to detect a component of the target magnetic field in a second direction inclined relative to each of the reference plane and the direction perpendicular to the reference plane and generate a second detection signal;

the plurality of third magnetoresistive elements constitute a third detection circuit configured to detect a component of the target magnetic field in a third direction inclined relative to each of the reference plane and the direction perpendicular to the reference plane and generate a third detection signal; and the plurality of fourth magnetoresistive elements constitute a fourth detection circuit configured to detect a component of the target magnetic field in a fourth direction inclined relative to each of the reference plane and the direction perpendicular to the reference plane and generate a fourth detection signal.

14. The magnetic sensor according to claim 13, further comprising:

a processor configured to:
    generate, based on the first detection signal and the second detection signal, a first detection value corresponding to a component of the target magnetic field in a fifth direction parallel to the reference plane, and a second detection value corresponding to a component of the target magnetic field in the direction perpendicular to the reference plane; and
    generate, based on the third detection signal and the fourth detection signal, a third detection value corresponding to a component of the target magnetic field in a sixth direction parallel to the reference plane and orthogonal to the fifth direction, and a fourth detection value corresponding to a component of the target magnetic field in the direction perpendicular to the reference plane.

* * * * *